United States Patent [19]

Bacrania et al.

[11] Patent Number: 5,659,261

[45] Date of Patent: Aug. 19, 1997

[54] ANALOG-TO-DIGITAL CONVERTER AND OUTPUT DRIVER

[75] Inventors: Kantilal Bacrania, Palm Bay, Fla.; Chong In Chi, Santa Clara, Calif.; Gregory James Fisher, Indialantic, Fla.

[73] Assignee: Harris Corporation, Melbourne, Fla.

[21] Appl. No.: 645,139

[22] Filed: May 13, 1996

Related U.S. Application Data

[60] Continuation of Ser. No. 288,956, Aug. 11, 1994, abandoned, which is a division of Ser. No. 785,325, Oct. 30, 1991, Pat. No. 5,369,309.

[51] Int. Cl.$^6$ .................................................. H03K 17/60
[52] U.S. Cl. .......................... 327/112; 327/375; 327/432; 327/437
[58] Field of Search ...................... 307/253, 254, 307/270, 570, 261, 433, 100, 108, 112, 375; 327/427, 432, 436, 437, 478, 482; 326/83, 91

[56] References Cited

U.S. PATENT DOCUMENTS

| | | | |
|---|---|---|---|
| 3,414,783 | 12/1968 | Moore | 307/254 |
| 3,466,467 | 9/1969 | Houcke et al. | 307/253 |
| 4,246,501 | 1/1981 | Baker | 327/375 |
| 4,719,373 | 1/1988 | Masuda et al. | 307/270 |
| 4,749,876 | 6/1988 | Gale et al. | 327/375 |
| 4,926,069 | 5/1990 | Yamazaki | 307/270 |
| 4,999,523 | 3/1991 | Cham et al. | 327/437 |
| 5,055,722 | 10/1991 | Latos et al. | 307/270 |
| 5,111,061 | 5/1992 | Masuda | 307/253 |
| 5,124,582 | 6/1992 | Nakamura et al. | 327/111 |
| 5,546,029 | 8/1996 | Koke | 327/112 |

FOREIGN PATENT DOCUMENTS 2258058  8/1975  France.

*Primary Examiner*—Timothy P. Callahan
*Assistant Examiner*—My Trang Nu Ton
*Attorney, Agent, or Firm*—Nixon, Hargrave, Devans & Doyle

[57] ABSTRACT

The A-to-D converter 300 has an output buffer 320 with fourteen drivers each the same as driver 4100. Driver 4100 includes bipolar pull up pull down transistors 4102, 4103. Those transistors are both coupled to an output. Pull up transistor 4102 is coupled to a first reference voltage VDD; pull down transistor 4103 is coupled to a second or ground reference potential. A base drive circuit comprising a series connection between a resistor and a transistor 4121 to provide additional current to saturate the pull down transistor 4103 and thereby lower the collector-to-emitter voltage drop of transistor 4103 when transistor 4103 is turned on.

9 Claims, 45 Drawing Sheets

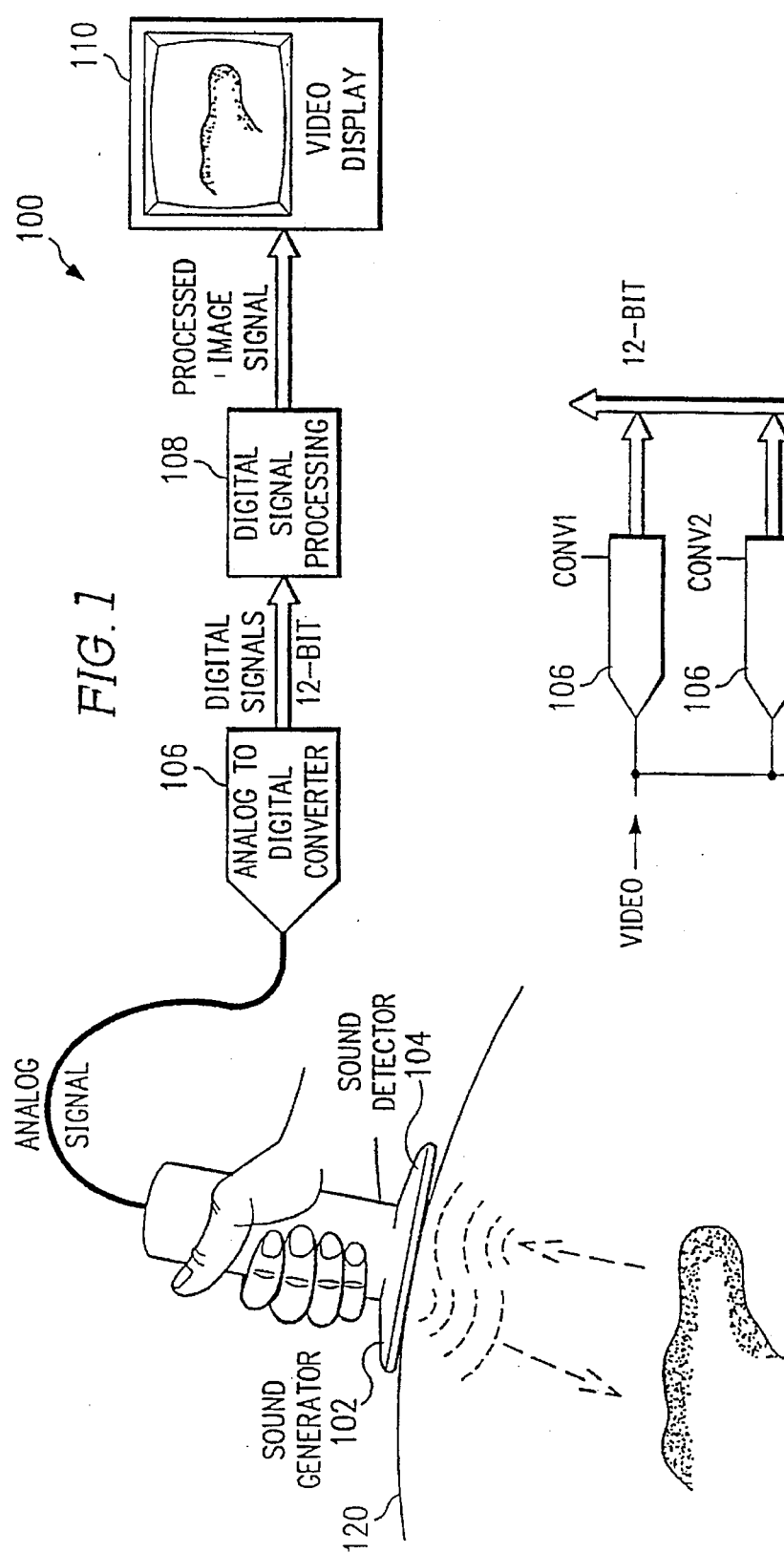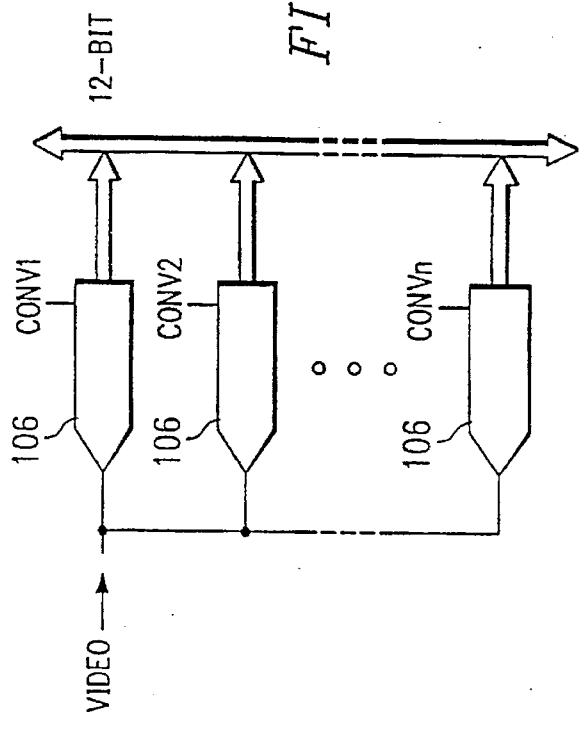

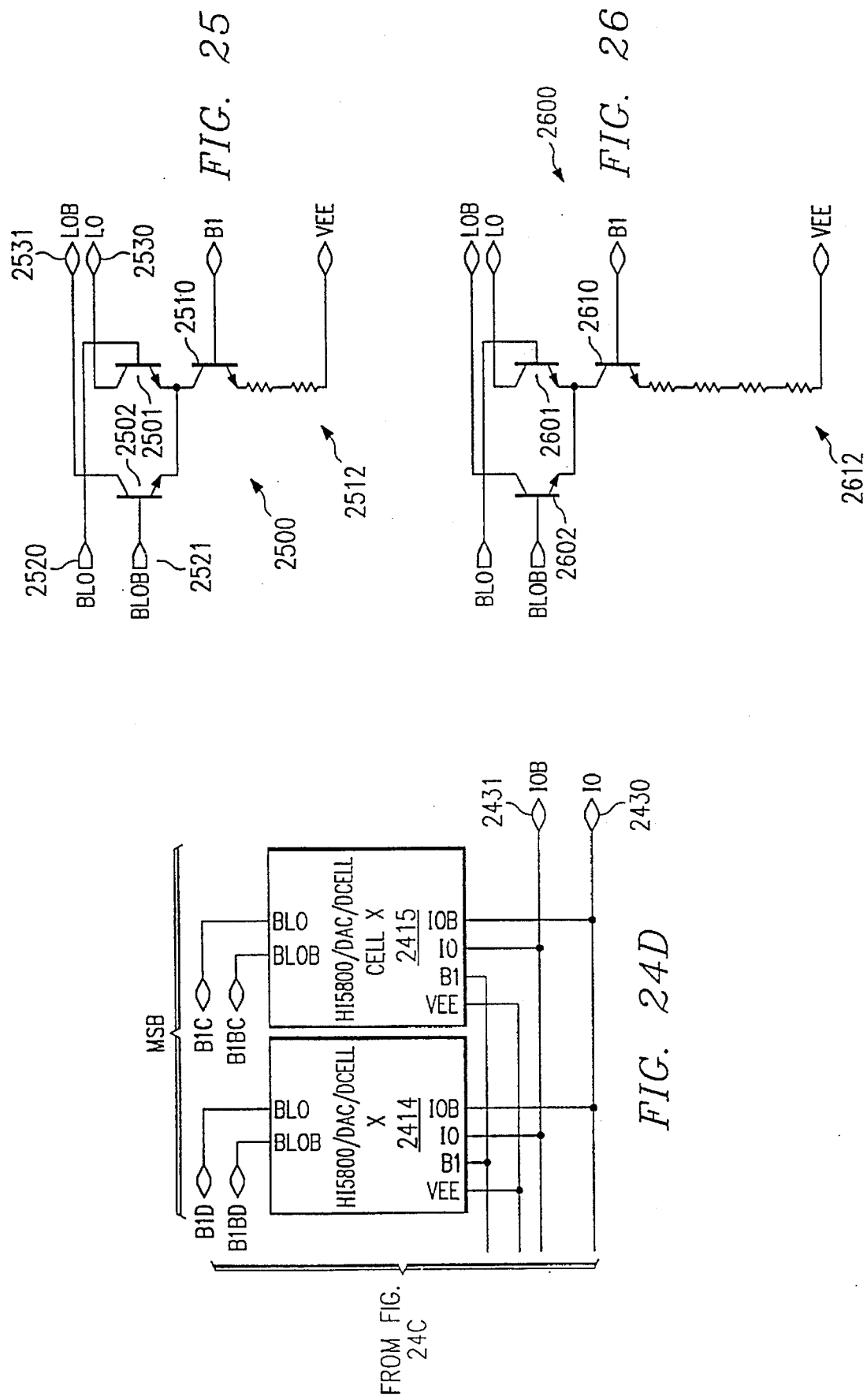

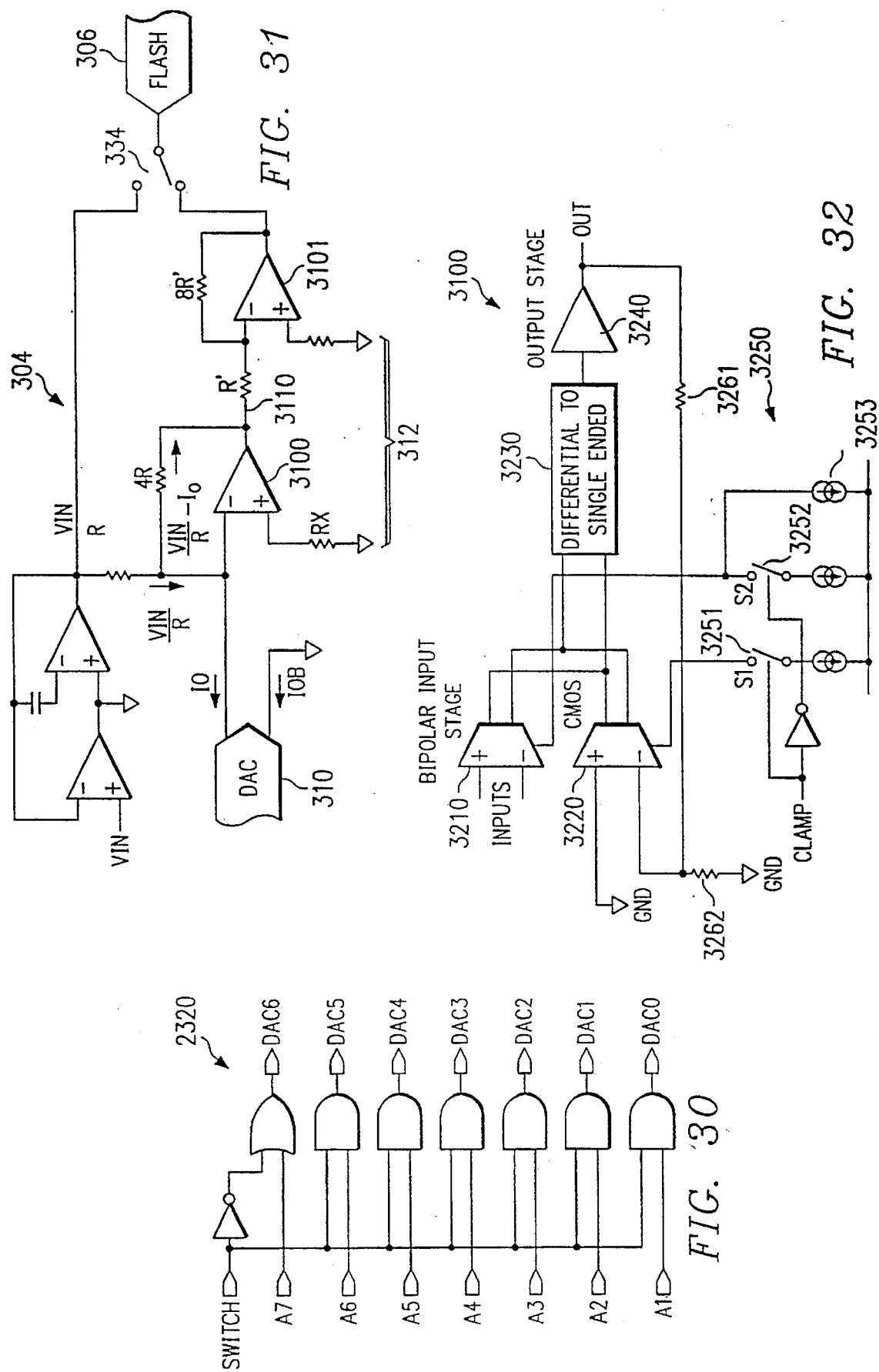

ANALOG-TO-DIGITAL CONVERTER AND OUTPUT DRIVER

This is a continuation of prior application Ser. No. 08/288,956, filed on Aug. 11, 1994, now abandoned, which is a divisional of Ser. No. 07/785,325, filed Oct. 30, 1991, now U.S. Pat. No. 5,369,309.

FIELD OF THE INVENTION

The present invention relates to electronic semiconductor devices and methods of fabrication, and, more particularly, to semiconductor devices useful for conversion between analog and digital signals and fabrication methods integrating both bipolar and field effect devices.

BACKGROUND AND SUMMARY OF THE INVENTION

Digital processing and transmission of electrical signals has become commonplace even for basically analog information. Examples range from handheld digital voltmeters to the transition beginning in the 1960s of the public long distance telephone network from analog transmission to pulse code modulation (PCM) digital transmission. Application of digital methods to analog information requires an analog-to-digital (A/D) conversion, and the linearity, resolution, and speed of such conversion depends upon the application. For example, digital voltmeters usually call for A/D conversion with good linearity and resolution (18-bits) but which may be slow (1 Hz); whereas, video applications demand high speed (30 million samples and conversions per second) but tolerate low resolution (8-bits) and poor linearity. Intermediate requirements of 12-bit resolution, good linearity, and 3 Msps (million samples per second) speed appear in applications such as medical imaging with ultrasound, robotic control, high speed data acquisition, process control, radar signal analysis, disk drive head control, vibration analysis, waveform spectral analysis, and so forth. Multichannel information acquisition with arrays of A/D converters leads to another requirement: small aperture jitter so that synchronism of the channels can be maintained.

Well known types of A/D converters include the successive approximations converter which produces a digital output by a succession of trial-and-error steps using a digital-to-analog converter (DAC) and the flash converter which compares an input signal to multiple reference levels simultaneously and outputs a digital version of the closest reference level in a single step. The successive approximations converter provides high resolution and linearity but with low conversion speed, and the flash supplies high speed at the cost of resolution and linearity. Note that a flash converter with n-bit resolution typically has a voltage divider with $2^n$ taps and $2^n$ comparators, and this becomes unwieldy for high resolution. See, however, copending U.S. patent application Ser. No. 696,241, filed May 6, 1991 and assigned to the assignee of the present application. A compromise between these two types is the two-step flash A/D converter which uses a first coarse flash conversion to find the most significant bits and then reconstructs an analog signal from first flash output and subtracts this from the input signal to create an error signal from which a second flash conversion finds the least significant bits. Generally see Grebene, *Bipolar and MOS Analog Integrated Circuit Design* (Wiley-Interscience 1984), page 871. It is desirable that A/D converters combine still higher speed and resolution with lower noise.

Methods of fabrication used for various semiconductor devices include the combination of bipolar transistors with CMOS transistors (BiCMOS), with analog portions of the integrated circuit using mainly bipolar transistors for their low noise and digital portions using mainly CMOS transistors for their high packing density. See for example R. Haken et al, "BiCMOS Processes for Digital and Analog Devices," Semiconductor International 96 (June 1989). However, improved BiCMOS fabrication methods are needed to achieve higher speed and resolution with lower noise on a monolithic circuit.

The present invention provides a monolithic two-step flash A/D converter with high speed and resolution and a BiCMOS method of fabrication applicable to such converters and other integrated circuits.

BRIEF DESCRIPTION OF THE DRAWINGS

The present invention will be described with reference to the accompanying drawings which are schematic for clarity, FIGS. 1–2 illustrate applications of a preferred embodiment analog-to-digital converter;

FIGS. 23a–30 show aspects of the digital-to-analog converter of the preferred embodiment;

FIGS. 31–37 show aspects of the error amplifier of the preferred embodiment;

FIGS. 40–44 show aspects of the output buffer of the preferred embodiment.

DESCRIPTION OF THE PREFERRED EMBODIMENTS

Figure 3:
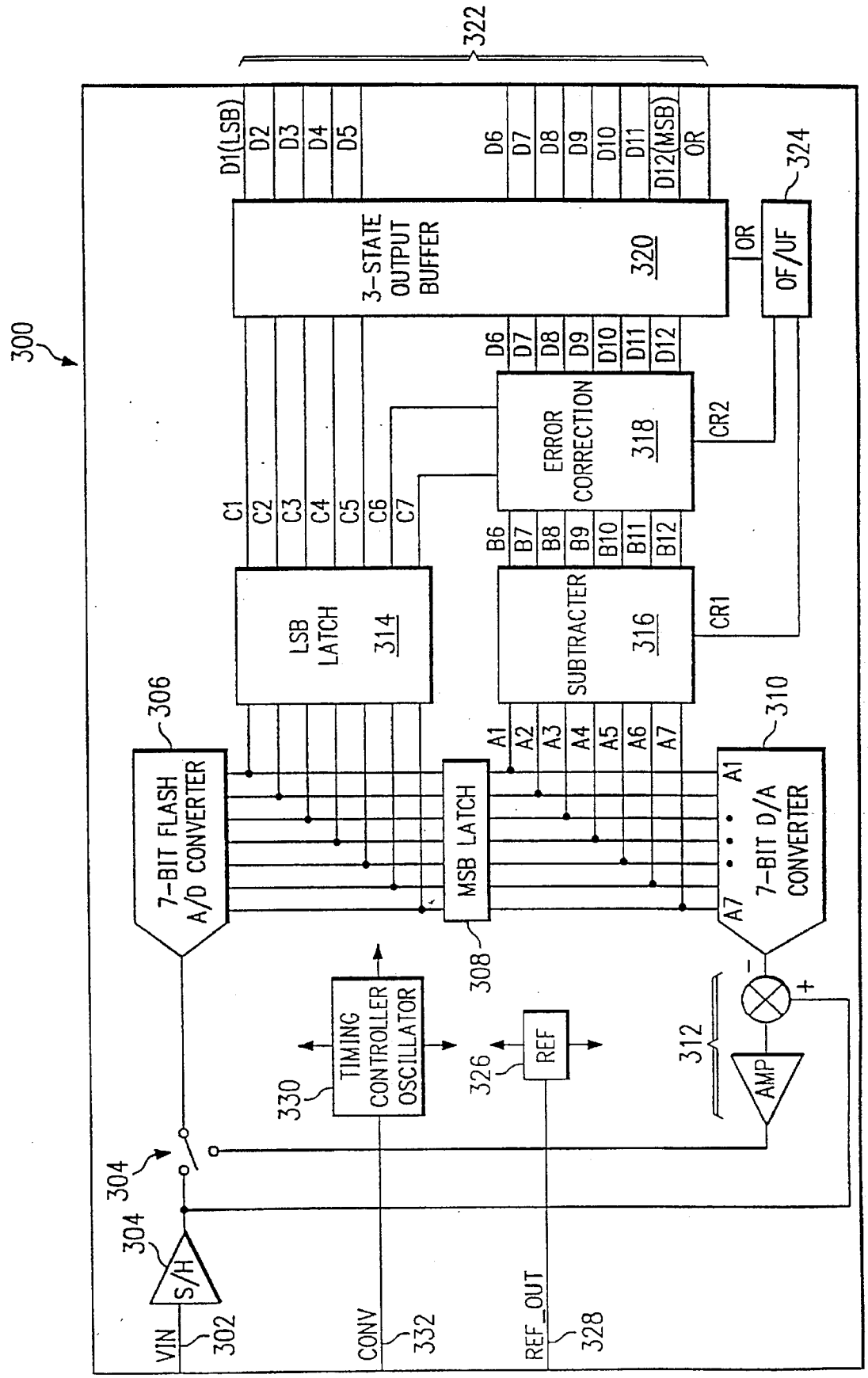
FIG. 3 is a functional block circuit diagram of the preferred embodiment.

FIG. 1 schematically illustrates an ultrasound analysis system 100 which includes a sound generator 102, sound detector 104, first preferred embodiment analog-to-digital converter 106, digital signal processor 108, and video display 110. System 100 generates high frequency (100 KHz) sound waves that penetrate object 120, and these waves reflect from interior structures of object 120 to be detected by detector 104. Converter 106 converts the detected analog signal to a digital form for signal processing by DSP 108, and video display 110 presents the results on a CRT. Mechanically the scanning sound generator 102 and detector 104 over the surface of object 120 provide reflection information to reconstruct an image of the interior structure. Use of system 100 for human medical diagnosis or analysis demands relatively high speed operation for patient convenience and relatively high resolution for image reconstruction.

Converter 106 is a 12-bit, subranging (half-flash or two-step) converter with digital error correction which samples an analog input in the range of −2.5 volts to +2.5 volts at a sampling rate of 3 Msps (million samples per second) and with an input bandwidth of 30 MHz. 12-bit resolution implies that the least significant bit of output corresponds to a 1.22 mV input interval. An input bandwidth of 30 MHz means that converter 106 can track video signals and that an array of converters 106 with sequential clocking can provide video digitization; see FIG. 2 which shows n converters 106 clocked by sequential commands CONV1, CONV2, . . . CONVn. This array gives an effective sampling rate of 3n MHz.

Converter 106 operates over a temperature range of –55 C to +125 C with integral and differential linearity error and full scale error all about or less than 1 bit. Converter 106 uses a combination of bipolar and CMOS (BiCMOS) devices together with polysilicon-polysilicon capacitors and nickel-chromium thin film resistors plus laser trimming. Most CMOS gate lengths are about 1 μm and NPN emitters typically are about 2 μm by 3 μm with devices scaled to provide larger emitter areas. Also, matched devices may be split and laid out in symmetrical arrangements to help thermal balance and insensitivity.

Converter Overview

FIG. 3 is a functional block diagram of the first preferred embodiment converter, indicated generally by reference numeral 300, which includes analog signal input terminal 302, sample and hold block 304, 7-bit flash analog-to-digital converter block 306, most-significant-bits (MSB) latch 308, 7-bit digital-to-analog converter (DAC) block 310 (the DAC is trimmed to more than 14-bit accuracy), error amplifier 312, least-significant-bits (LSB) latch 314, subtractor 316, error correction block 318, output buffer 320, output port 322, overflow/undertow block OF/UF 324, voltage reference block 326 with output terminal 328, timing controller and oscillator block 330, conversion command input terminal 332, and analog switch 334. Converter 300 is a two-step subranging analog-to-digital converter which uses the same 7-bit flash converter for both the MSB and the LSB conversions. Correction of system errors makes use of MSB and LSB overlap. The 12-bit output uses a two's complement representation of negative numbers, so an input of 0 volts leads to an output of 1000 0000 0000, an input of –1.22 mV gives an output of 0111 1111 1111, and an input of –2.5 volts yields 0000 0000 0000. An input of +1.22 mV gives an output of 1000 0000 0001, and an input of +2.5 volts yields 1111 1111 1111.

Operation Summary

Figure 4:
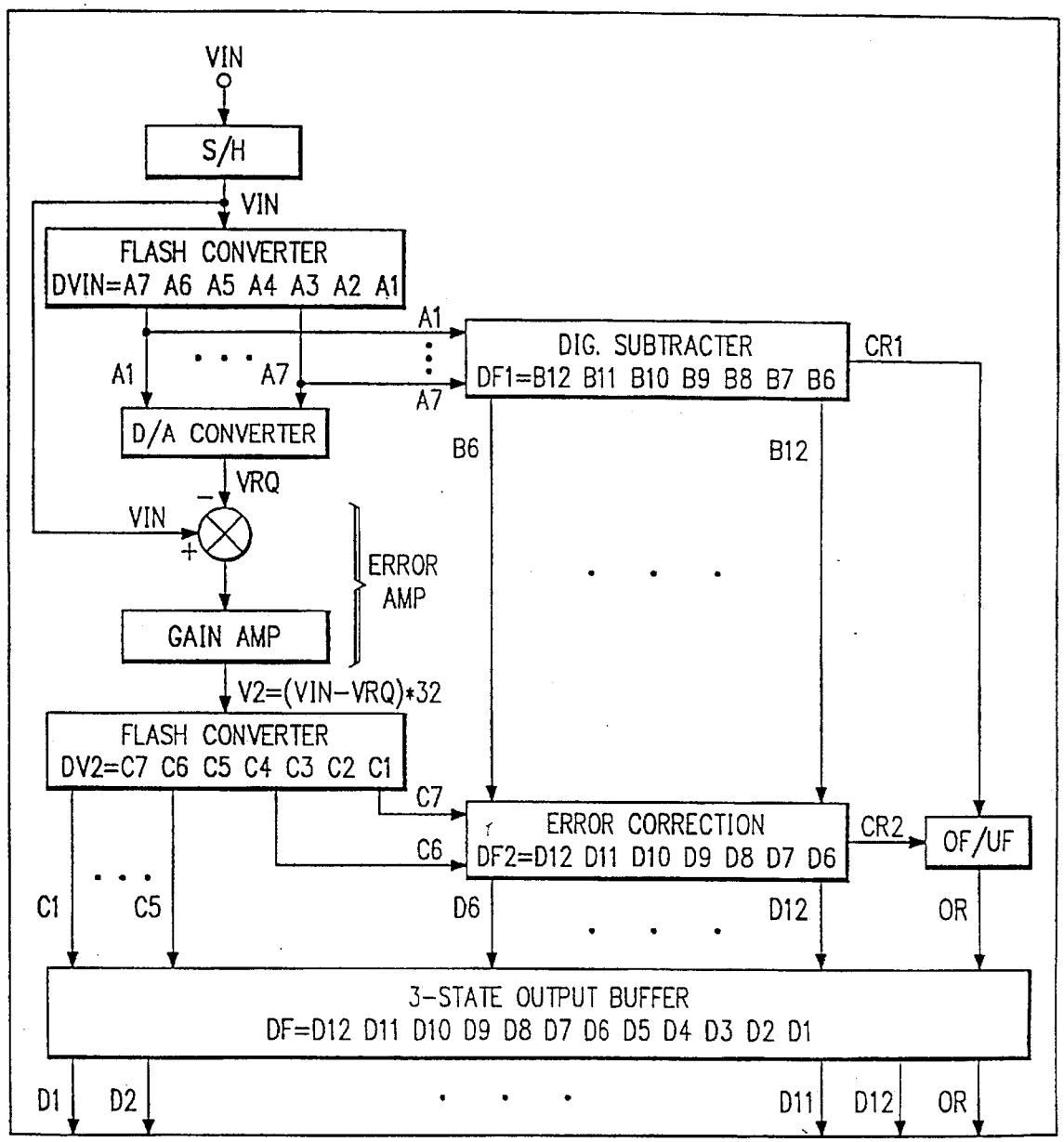
FIGS. 4–5 are flow and timing diagrams for the operation of the preferred embodiment.
Figure 5:
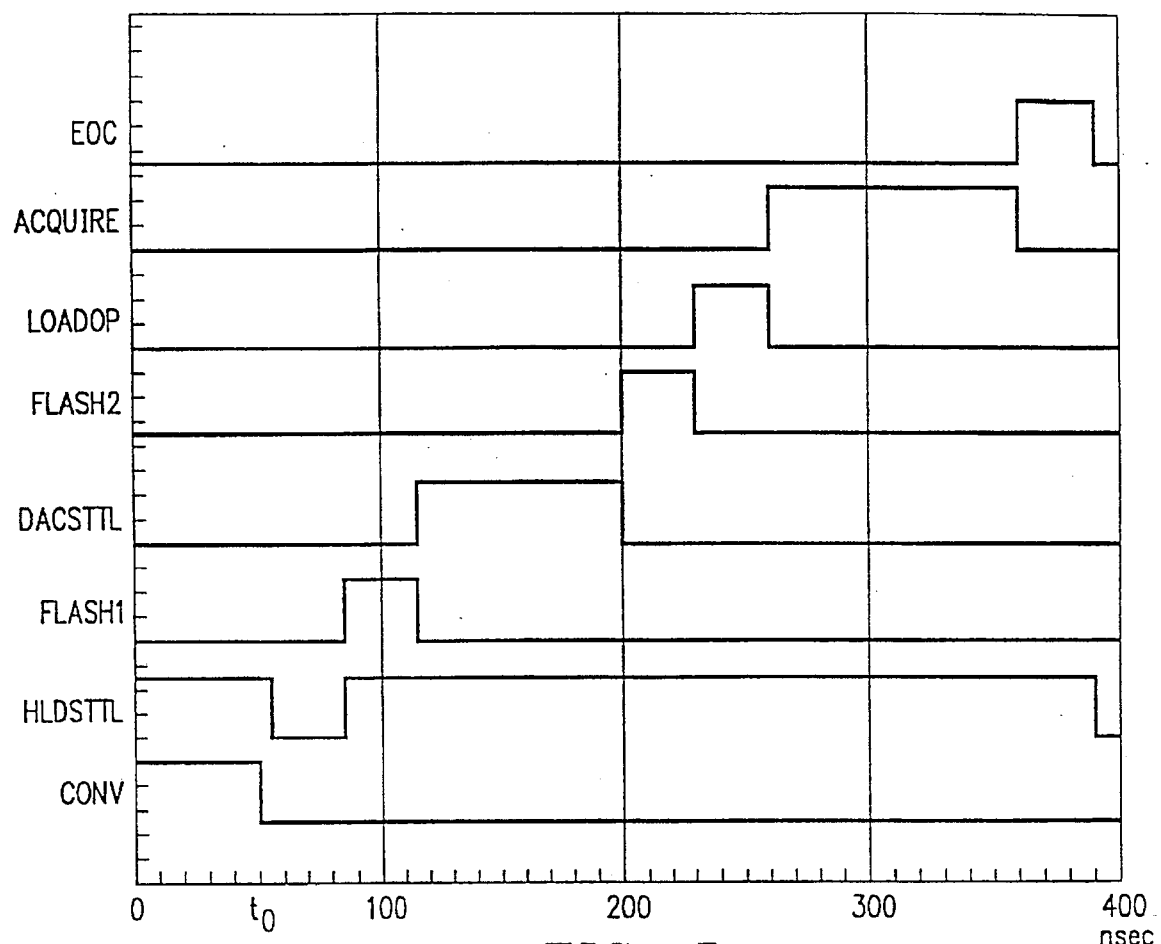

FIG. 4 is a flow diagram for a conversion by converter 300 and FIG. 5 is a timing diagram (in nanoseconds) for the conversion flow which basically proceeds as follows. A falling edge or the convert command (CONV) input at terminal 332 begins the conversion process; see the bottom panel of FIG. 5. Just prior to the CONV command, sample and hold 304 was tracking (following) the input $V_{in}(t)$ at terminal 302, analog switch 334 was connecting the output of sample and hold 304 to flash converter 306, the comparators and encoder of flash converter 306 were following the sample and hold 304 output (which ideally is $V_{in}(t)$) but without latching, DAC 310 was holding at a 0 volt output due to a fixed input, and error amplifier 312 was clamped to a 0 volt output. The CONV command at time $t_0$ switches sample and hold 304 into the hold mode and with a fixed output equal to $V_{in}(t_0)$. This switching requires a settling time of about 30 nanoseconds (nsec) due to charge injection by the switch; see the HLDSTTL pulse in the second panel from the bottom of FIG. 5. For simplicity, $V_{in}(t_0)$ will be called $V_{in}$. At the end of the HLDSTTL pulse, the first flash convert clock FLASH1 rises to latch the comparators of flash converter 306 which have been following the essentially constant output $V_{in}$ of sample and hold 304. The comparators ideally are outputting a quantization of $V_{in}$ to the encoder which has been encoding this quantization as a 7-bit number; see the FLASH1 pulse in the third from bottom panel of FIG. 5. After about 28 nsec to allow settling by the latching circuitry of flash converter 306, the FLASH1 pulse falls low to store the 7-bit output in MSB latch 308 (not shown in FIG. 4 but incorporated in Digital Subtractor and Error Correction). This 7-bit output is the binary encoding of the quantized version of the input signal $V_{in}$ with quantization levels separated by about 39 mV. Because the final 12-bit output of converter 300 will be a binary encoding of the quantized version of $V_{in}$ with quantization levels separated by 1.22 mV (39 mV divided by 32), this 7-bit output contributes only to the seven most significant bits of the final 12-bit output. Note that an output of 0000000 from flash converter 306 corresponds to an input signal of about –2.5 volts, whereas an input signal of about 0 volts will lead to an output of 1000000 and an input of about +2.5 volts will yield an output of 1111111.

Next, the rising edge of the 80 nsec DAC settling pulse (DACSTTL pulse in the fourth from bottom panel of FIG. 5) performs three tasks: (1) it puts the 7-bit output of flash converter 306 stored in MSB latch 308 into DAC 310, which reconstructs the quantization of $V_{in}$ from the 7 bits, this reconstruction is denoted $V_{rq}$ below, (2) it puts the output of flash converter 306 into subtractor 316 which adds a fixed 7-bit code to compensate for the bipolar mode of operation and error correction, and (3) it switches analog switch 334 to connect the output of error amplifier 312 to the input of flash converter 306. Then the DAC 310 output begins slewing towards its final value, $V_{rq}$, and feeds an input of error amplifier 312 which, however, remains clamped for about 10 nsec to avoid noise and saturation problems. During the remaining 70 nsec of the DACSTTL pulse, DAC 310 settles to its final output $V_{rq}$ and error amplifier 312 amplifies the difference between $V_{in}$ and $V_{rq}$ by a factor of 32. That is, error amplifier 312 amplifies the quantization error by 32; see the left middle portion of FIG. 4.

The second step conversion begins at the end of the DACSTTL pulse: flash converter 306 has been following the output of error amplifier 312 which has been settling to the amplified quantization error, and the rising edge of the second flash convert pulse (FLASH2 in the fifth from bottom panel of FIG. 5) latches the comparators of flash converter 306. The falling edge of FLASH2 28 nsec later stores the encoded quantized version of the amplified quantization error in LSB latch 314, which feeds the most significant two bits to error correction block 318. Due to the amplification factor being only 32, rather than 128 as 7-bit conversion would suggest, the second conversion's most significant bits overlap the first conversion's least significant bits.

If the components of converter 300 were errorless, then the overall conversion would amount to the following. The first flash conversion effectively decomposes $V_{in}$ as $$V_{in} = V_q + (V_{in} - V_q)$$

where $V_q$ is the quantized version of $V_{in}$ with quantization levels separated by about 39 mV and $(V_{in} - V_q)$ is the fast quantization error. The 7-bit output in MSB Latch encodes $V_q$. DAC 310 errorlessly reconstructs $V_q$ from the 7 bits in MSB Latch 308; that is, $V_{rq}$ equals $V_q$. Next, the second flash conversion effectively decomposes the amplified first quantization error $32(V_{in} - V_q)$ as $$32(V_{in} - V_q) = W_q + [32(V_{in} - V_q) - W_q]$$

where $W_q$ is the quantized version of $32(V_{in} - V_q)$. Again the quantization levels are separated by about 39 mV and $[32(V_{in}-V_q)-W_q]$ is the second quantization error. The 7-bit output in LSB Latch encodes $W_q$. So the final quantized output is $V_q+W_q/32$ with roughly $V_q$ generating the most significant bits and $W_q/32$ the least significant bits. Thus the combined effect of both flash conversions is to decompose $V_{in}$ as $$V_{in}=V_q+W_q/32+[32(V_{in}-V_q)-W_q]/32$$

That is, the overall quantization error equals the second quantization error divided by 32; so the overall quantization error is at most 39 mV/32 which equals 1.22 mV.

Error correction block 318 corrects any dynamic error (within tolerance) caused by the limited linearity accuracy of flash converter 306 during the first conversion step; the two most significant bits of the second conversion overlap the two least significant bits of the first conversion and provide the basis for the correction. Error correction block 318 provides the seven most significant bits and LSB latch 314 the five least significant bits to 12-bit output buffer 320 which makes the bits available at output port 322. Error correction and output buffer 320 loading consume about 20 nsec; see the LOADOP pulse in the sixth from bottom panel of FIG. 5. This completes the overall conversion; and if CONV remains low, another sampling and conversion begins. The seventh from bottom panel of FIG. 5 shows the ACQUIRE pulse which activates sample and hold 304 to acquire another sample, and the eighth from bottom panel (the top panel) of FIG. 5 shows the End of Conversion pulse EOC. The settling time for sample and hold 304 after switching from hold mode to sample mode is about 100 nsec and uses both the 80 nsec ACQUIRE pulse and the 20 nsec EOC pulse. The righthand portion of the second from bottom panel of FIG. 5 indicates the HLDSTTL pulse of the next conversion.

The analog signal input range is 5 volts (-2.5 volts to +2.5 volts), so the quantization, 7-bit encoding, and subsequent analog reconstruction of input signal $V_{in}$ will ideally yield a quantized approximation $V_{rq}$ with level spacings of 39.0625 mV and such that the approximation only differs from the input signal by at most one-half of a level spacing (19.53125 mV). Hence the difference, $V_{in}-V_{rq}$, after amplification by a factor of 32 in error amplifier 312, will ideally fall in the range of -625 mV to +625 mV and thus not exceed one quarter of the input range of flash converter 306. Therefore, the output of the second pass through flash converter 306 should be seven bits with the three most significant bits being either 011 or 100 for negative or positive inputs, respectively. Consequently, the two most significant bits of the second pass overlap the two least significant bits of the first pass through flash converter 306, and this implies a 12-bit overall output rather than a 14-bit output as would have been guessed from the two 7-bit conversions. Discussion of error correction block 318 below details this overlapping of bits and also leads to overflow/underflow block 324 which indicates an original input out of the -2.5 to +2.5 volts range.

Converter 300 has the following features: the timing pulses driving the operation do not overlap; only one function runs at a time, which lessens noise coupling; the sample and hold control provides aperture delay of less than 20 nanoseconds and aperture jitter of less than 25 picoseconds; clock signals driving flash converter 306 are translated to bipolar levels with a swing of 0.7 volts ($V_{bc}$) and lessen switching noise; subtractor 316 completes its operation prior to the activation of error amplifier 312 to lessen noise problems and avoid overdrive; the switching delay in activation of error amplifier 312 permits a settling of the DAC 310 output; and the output buffer 320 turns on its drivers sequentially to lessen ground bounce. The small aperture jitter permits the parallel configuration of converters, as illustrated in FIG. 2.

Converter 300 uses separate digital and analog power supplies and digital and analog grounds. The power supplies Vcc and Vdd are at +5 volts and Vee and Vss are at -5 volts with analog bipolar and CMOS devices operating between +5 and -5 volts but with the digital CMOS devices operating between +5 volts and ground.

FIGS. 6-44 illustrate the elements of converter 300 in greater detail, including elements only implicitly shown in FIG. 3; and the accompanying description follows the same order as the preceding overview.

Sample and Hold

Figure 6:
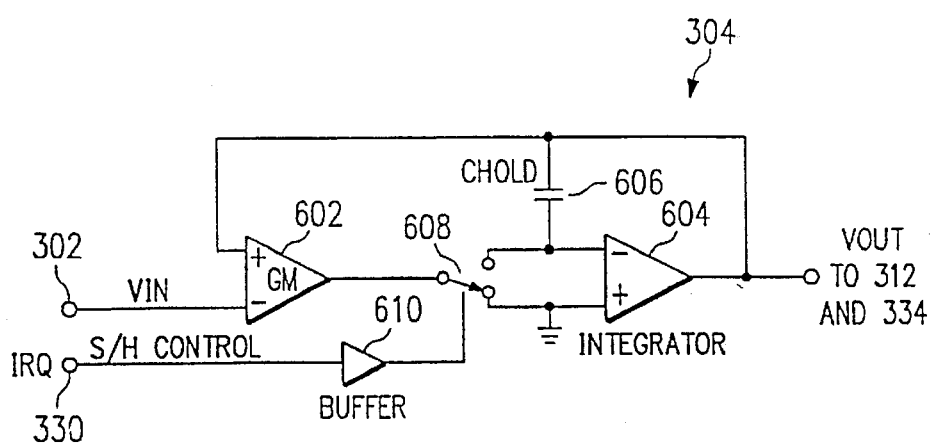
FIGS. 6–8 show aspects of the sample and hold of the preferred embodiment.
Figure 7A:
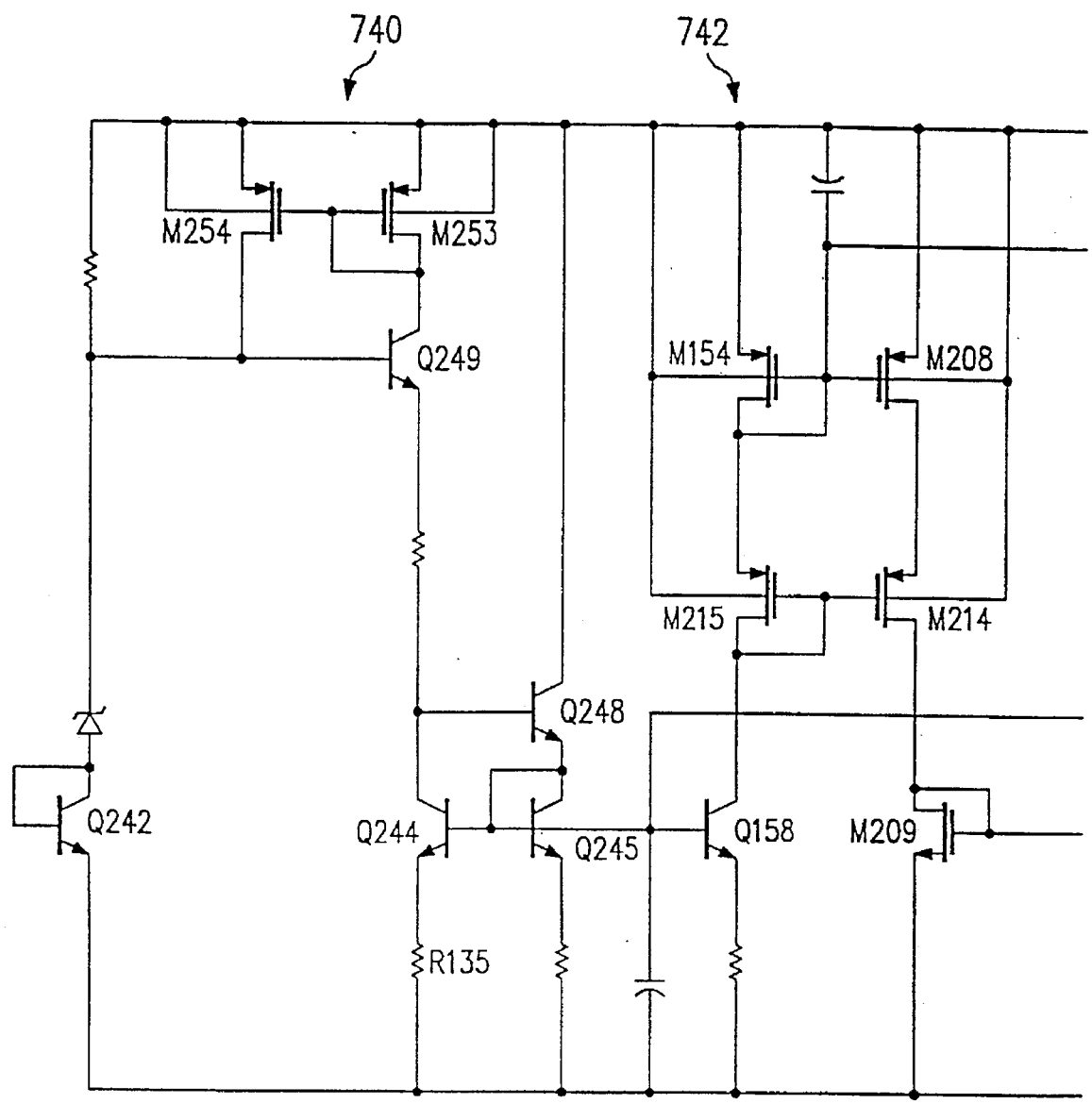
Figure 7B:
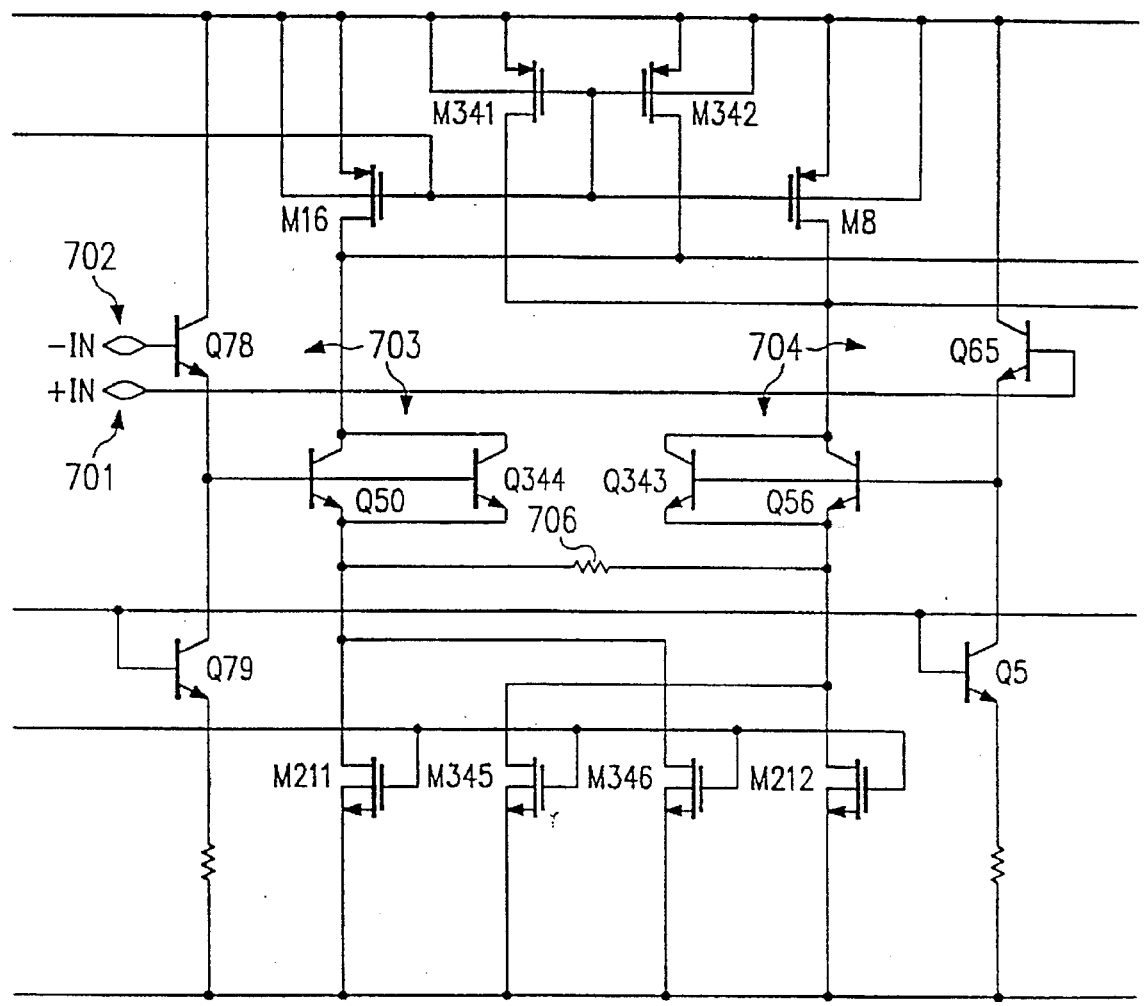
Figure 7C:
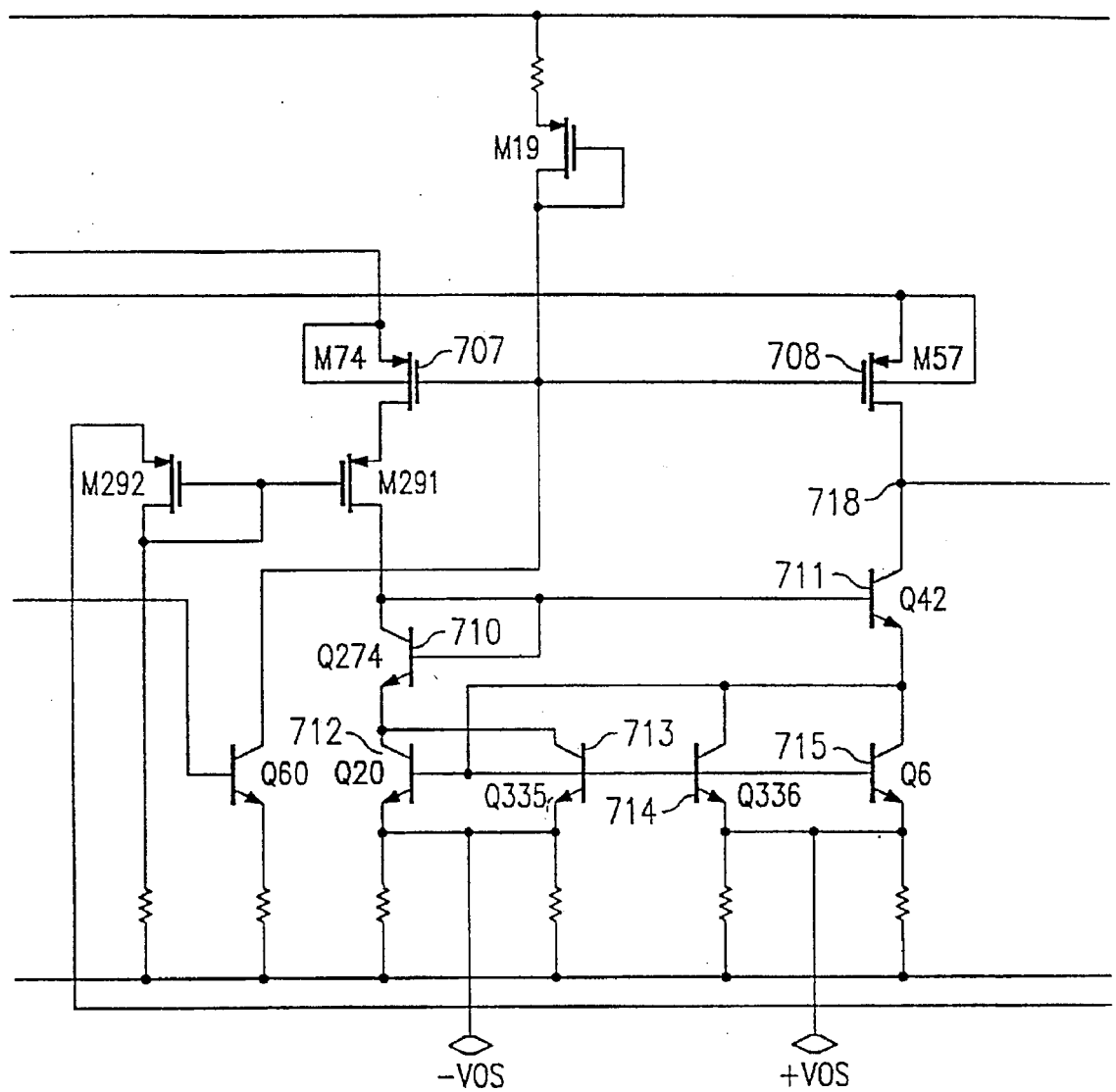
Figure 7D:
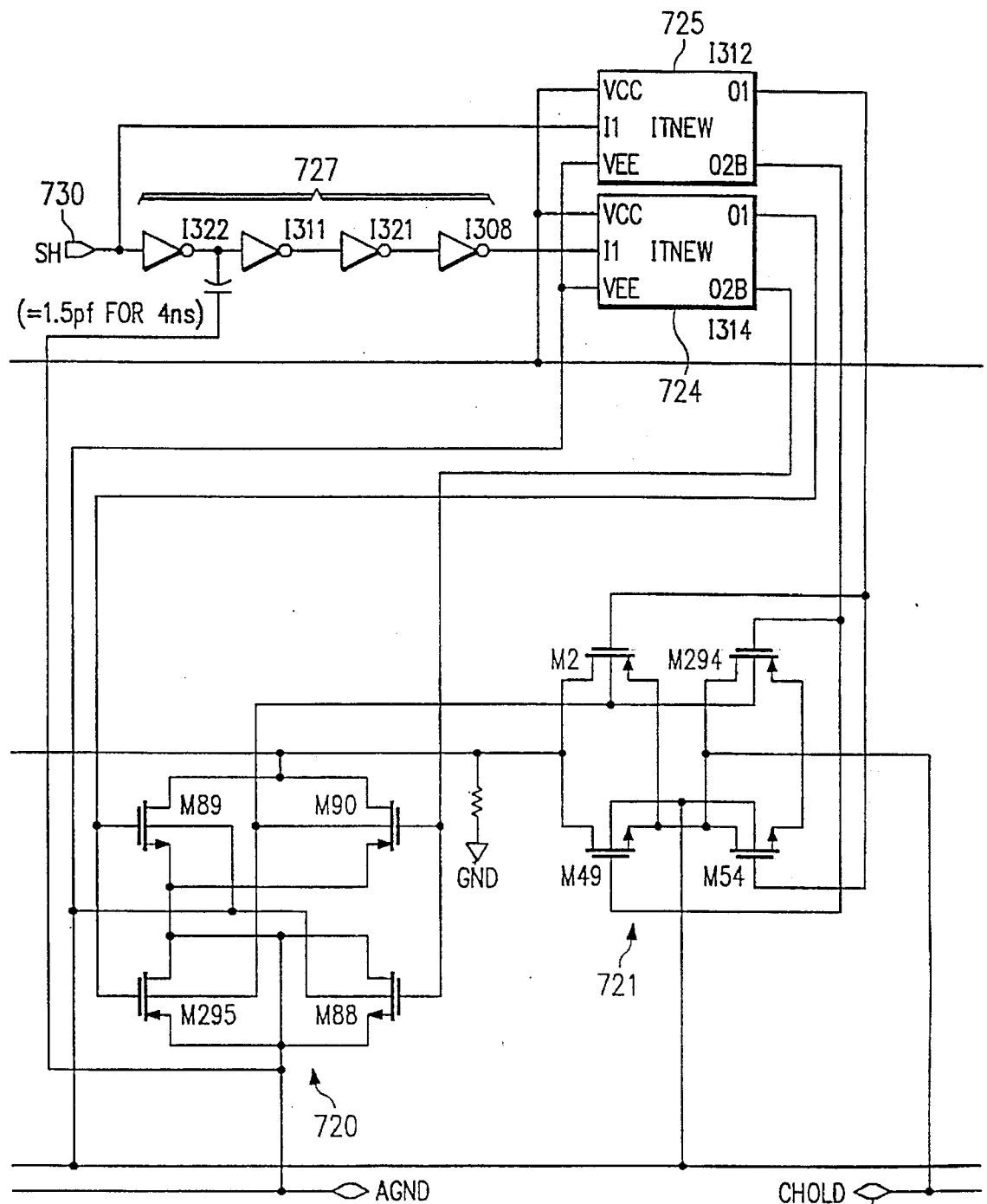
Figure 7E:
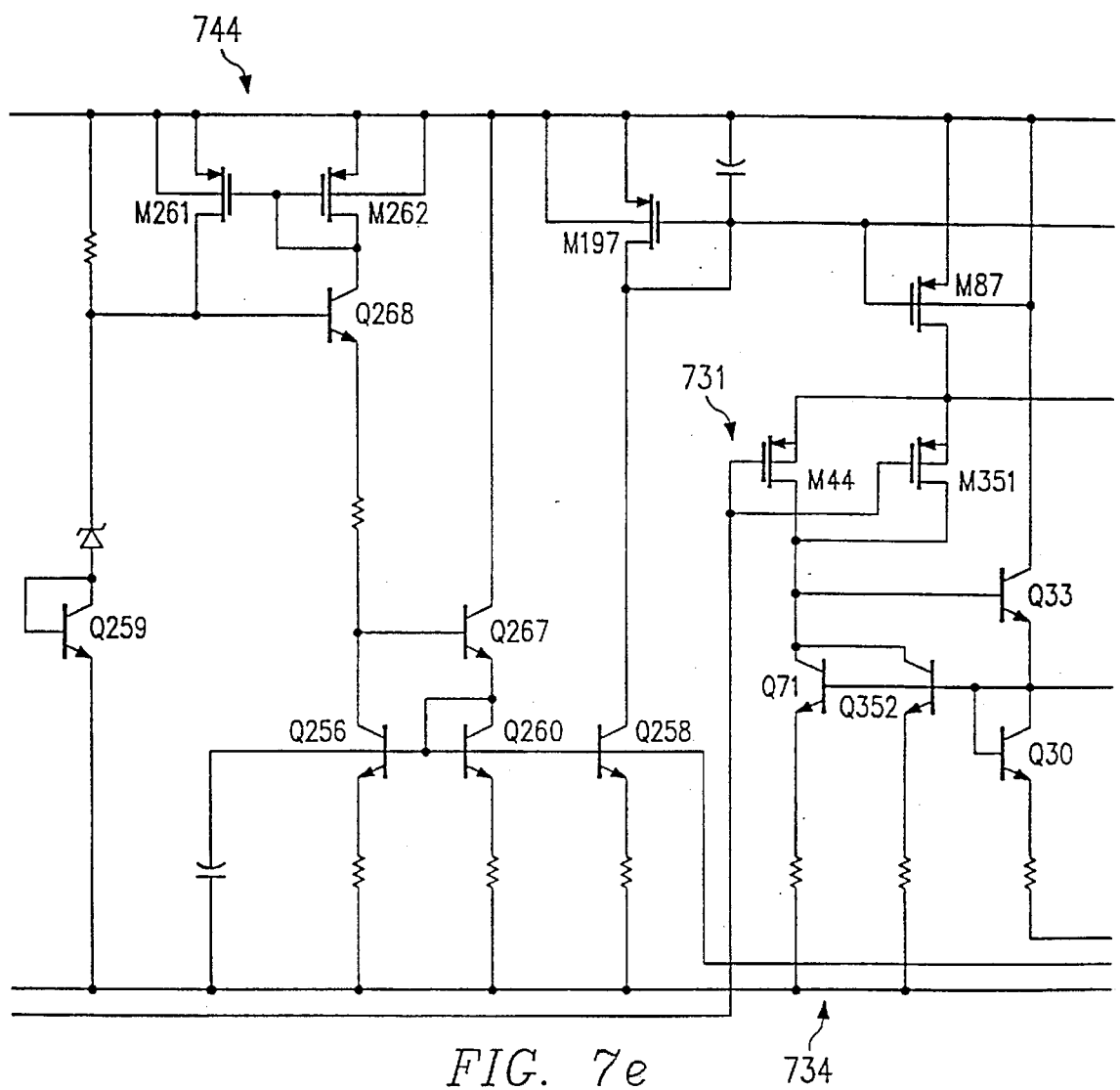
Figure 7F:
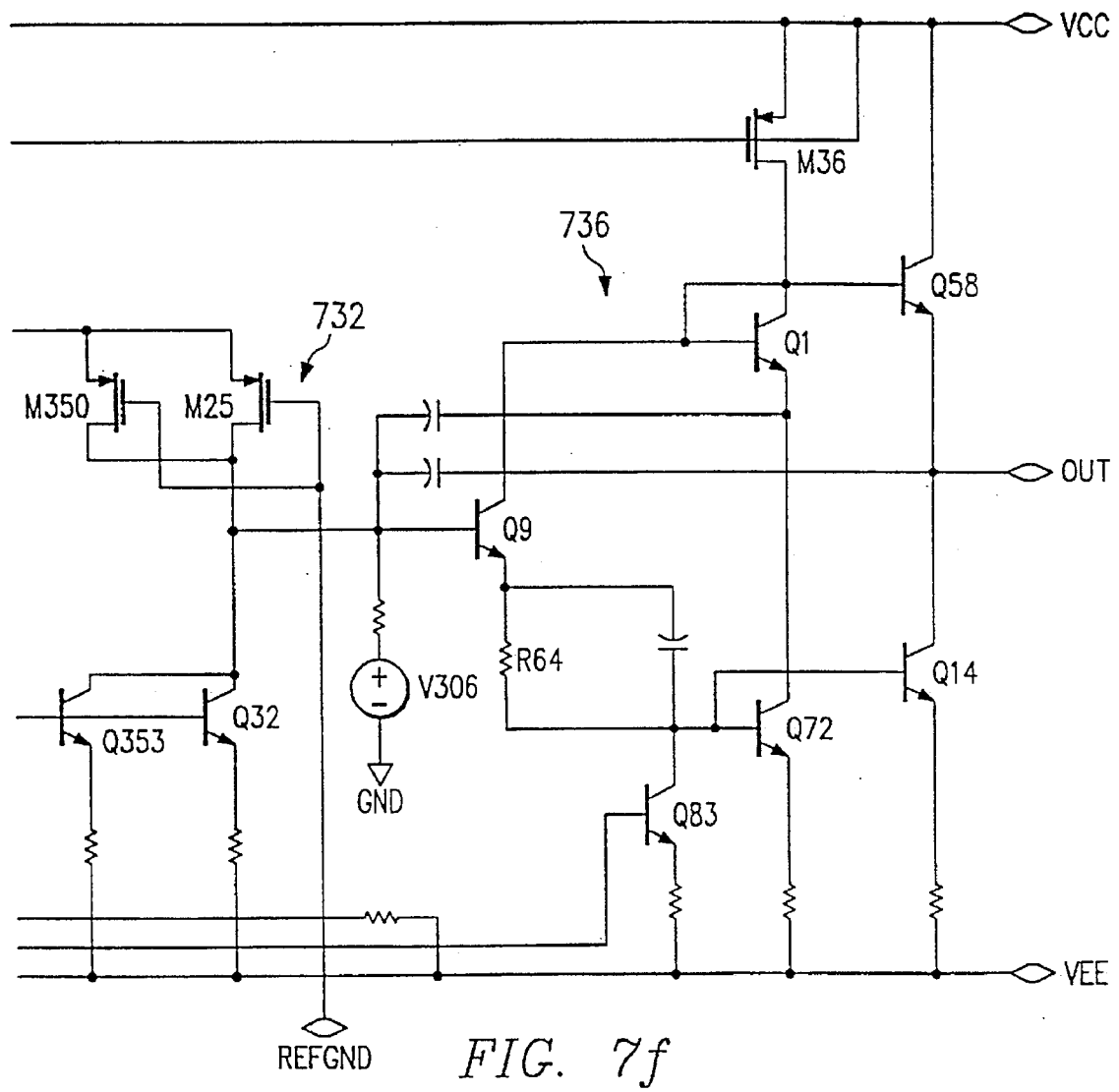
Figure 7G:
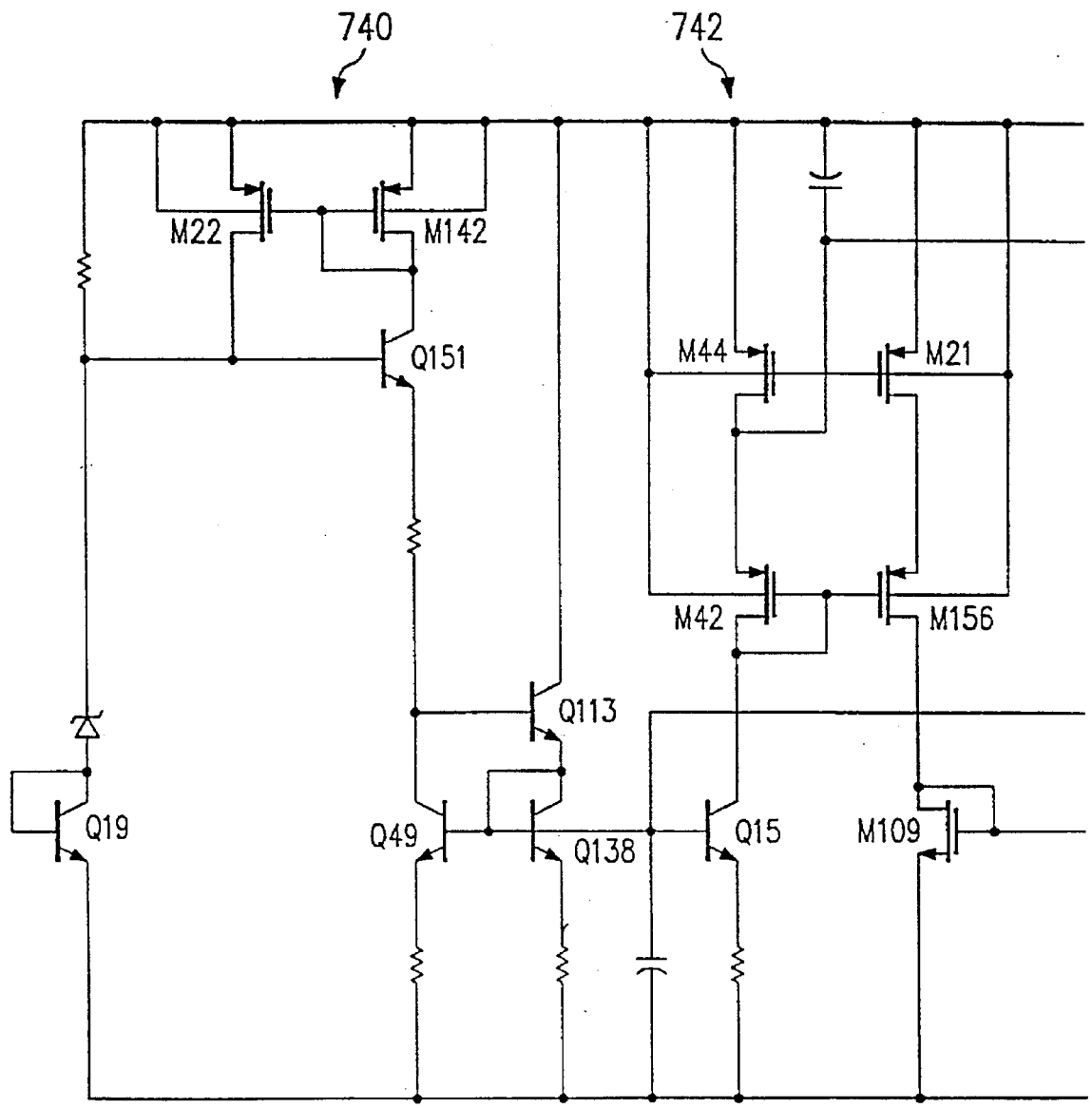
Figure 7H:
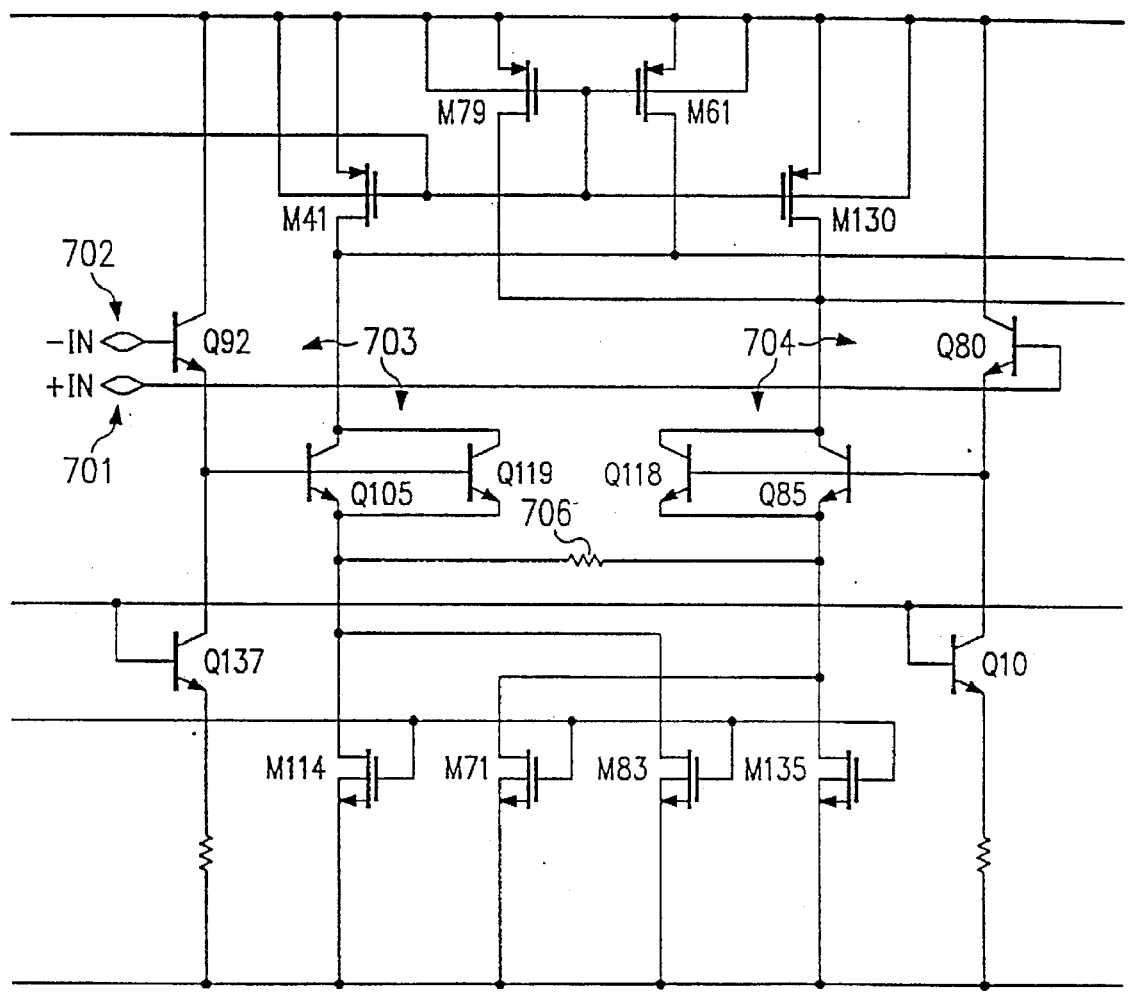
Figure 7I:
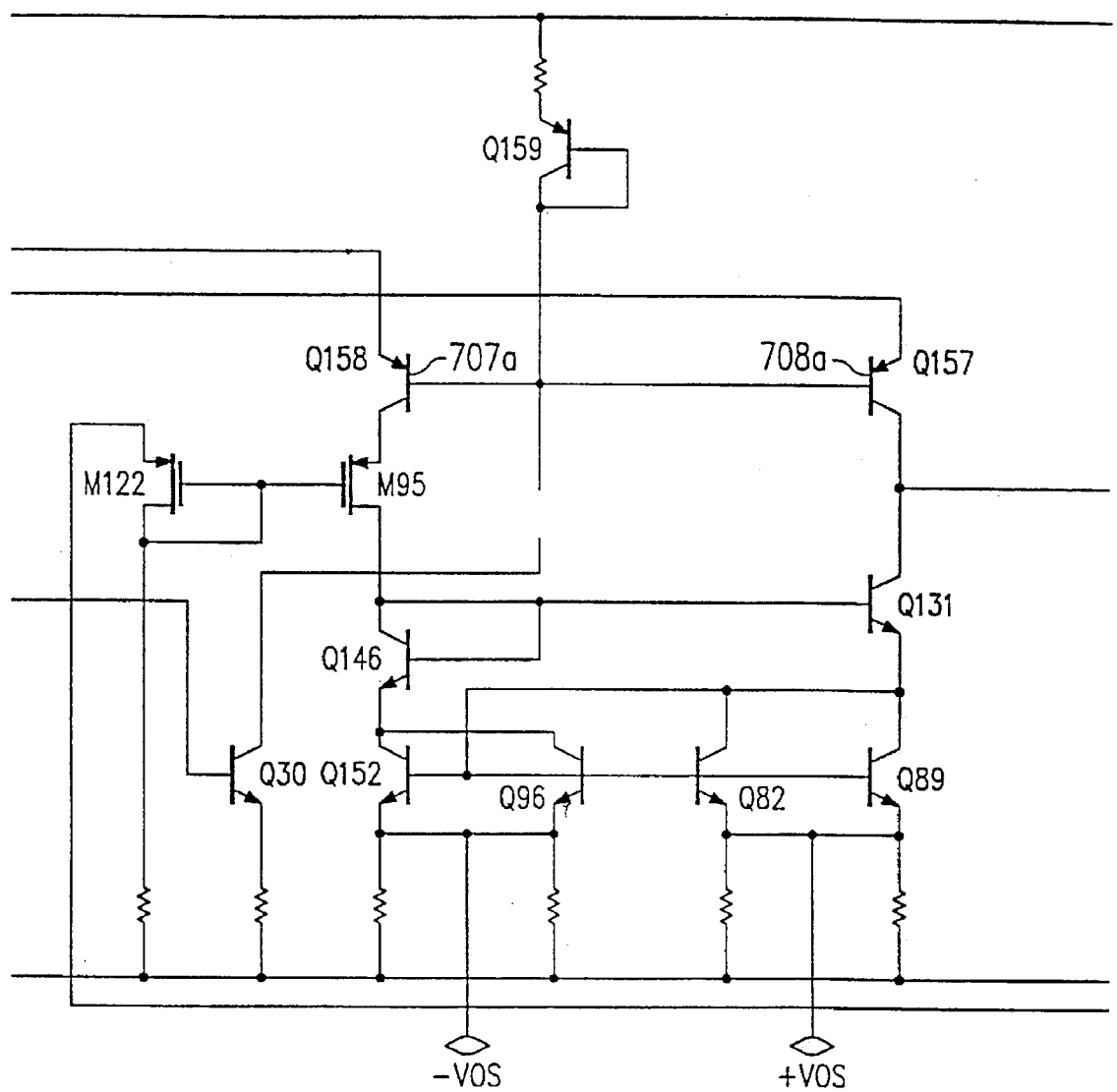
Figure 7J:
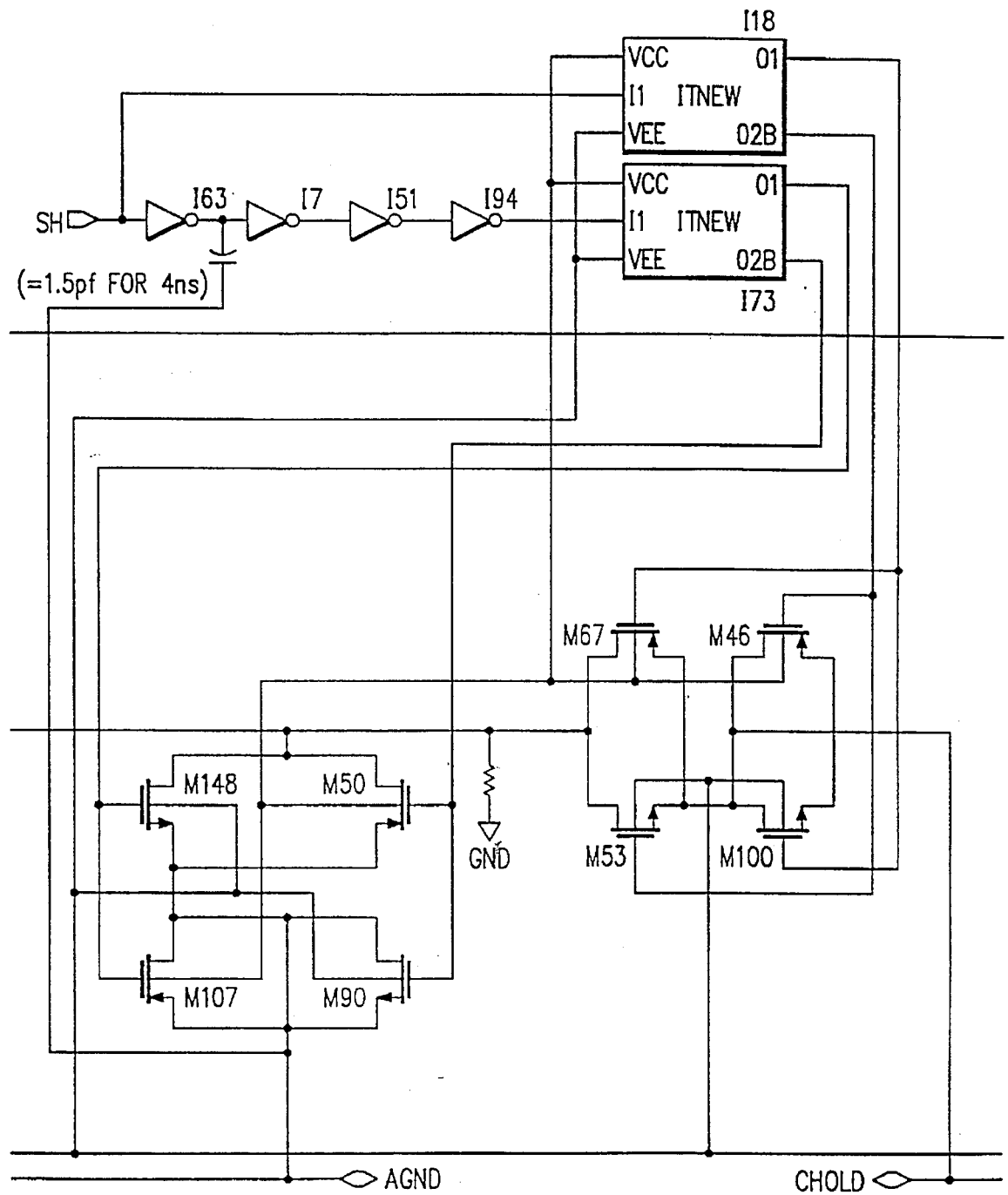
Figure 7K:
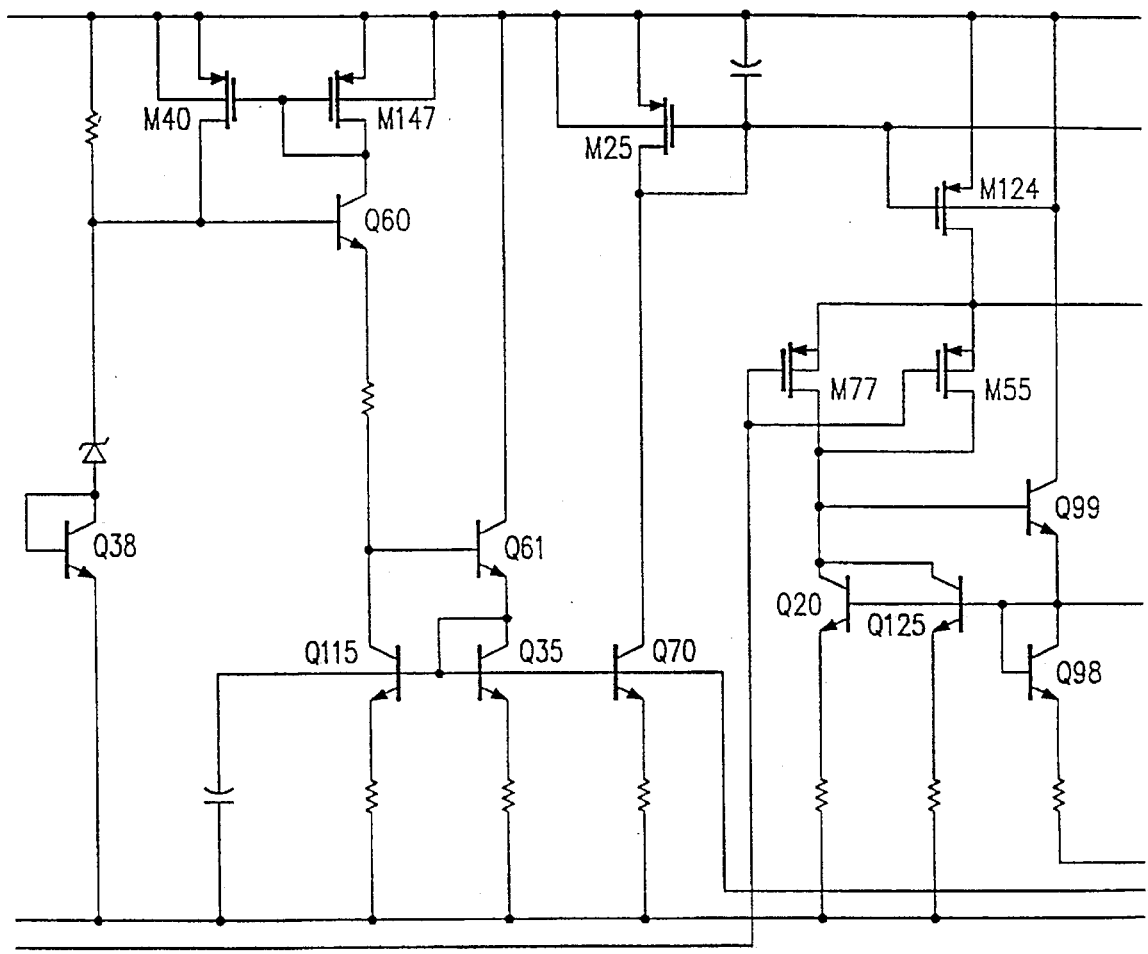
Figure 7L:
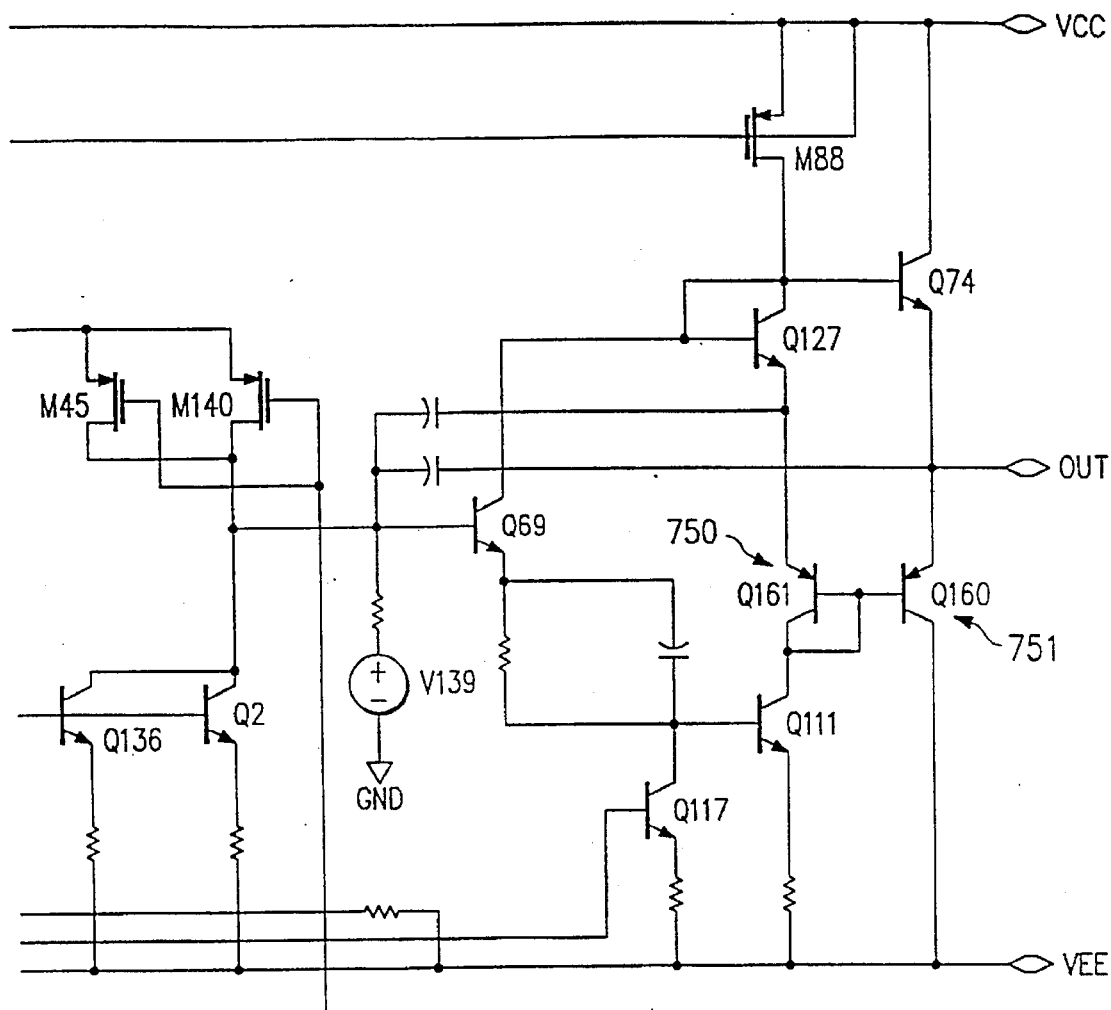
Figure 8:
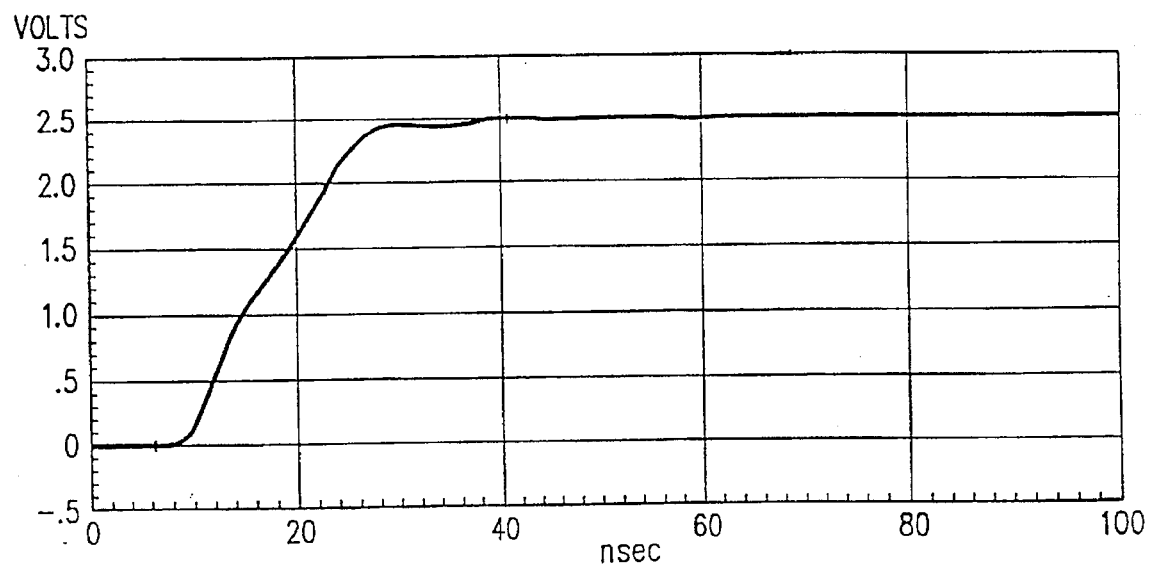

FIGS. 6-7f schematically show circuitry of sample and hold block 304 with FIG. 6 providing a functional block diagram and FIGS. 7a-f a schematic circuit diagram. FIG. 8 shows settling from a 2.5 volt input step function. As seen in FIG. 6, sample and hold 304 includes differential amplifier 602, differential amplifier 604, and capacitor 606 arranged as a closed-loop integrating type sample and hold circuit. Timing controller block 330 controls switch 608 through buffer 610.

In the sample mode, switch 608 connects the output of amplifier 602 to the inverting input of amplifier 604 which charges or discharges capacitor 606 so that the output Vout tracks the input $V_{in}$ at terminal 302. During hold mode switch 608 connects the output of amplifier 602 to ground to prevent saturation, and amplifier 604 holds the charge on capacitor 606 and also drives the bipolar input of error amplifier 312 and, when analog switch 334 is thrown, the bipolar input of flash converter 306.

NPN devices are used in the input amplifier where device matching, high speed, and large transconductance are needed. MOS transistors are used in the sample and hold switch where their low off-state leakage, fast switching speed, and charge injection compensation ensure low pedestal error and fast hold mode settling. The high input impedance of MOS transistors is utilized in the input stage of the output amplifier. The high input impedance provides a very low droop rate. The high speed characteristics of the bipolar transistors are utilized in the rest of the output amplifier (gain and output stages) to achieve a large bandwidth which translates into low acquisition times.

FIGS. 7a-f show amplifier 602 as a high output impedance transconductance amplifier. The inputs 701-702 connect to a modified Darlington differential pair 703-704 with emitter degeneration resistor 706 for improved slew rate; the inputs (which are $V_{in}$ and Vout) are to be in the range of -2.5 to +2.5 volts and the rails are at +5 volts and -5 volts. The outputs of the differential pair 703-704 connect to the sources of PMOS cascode devices 707-708 which replace PNP devices and provide a high frequency level shift function and drive the Wilson current mirror made of NPNs 710-715. The single-ended output of amplifier 602 at node 718 connects to sample and hold switch 608 which consists of a pair of CMOS transmission gates 720-721, gate 720 connects output node 718 to ground and gate 721 connects output node 718 to inverting input 731 of amplifier 604 and capacitor 606. The CMOS transmission gate switch includes charge cancelling devices to reduce charge injection error and leakage current. The switch control signal (called IRQ below) from block 330 enters node 730 and directly drives level translator 725 to switch gate 721 but is delayed by inverter chain 727 for driving level translator 724 to switch gate 720. Hence, switching from sample mode to hold mode has a few nsec gap between the disconnection of the output of amplifier 602 from the inverting input of amplifier 604 to the connection of the output to ground. This gap avoids injecting charge from the switching to ground into holding capacitor 606 and thus lessens pedestal error.

Amplifier 604 is a two gain stage amplifier with a large PMOS source-coupled pair used as an input differential pair 731-732 to provide high input impedance, low noise, and no dc gate current and using a NPN current mirror load 734. The single-ended output of the PMOS pair 731-732 drives an all-NPN output stage 736. FIGS. 7a,e also show start up circuit 740, bias circuit 742 for amplifier 602, and bias circuit 744 for amplifier 604; the use of separate bias circuits limits noise and talkback.

Capacitor 606 has 15 pF capacitance and is made of two layers of polysilicon separated by a grown oxide of 900 Å thickness for low leakage. Both amplifier 602 and amplifier 604 are made of a combination of CMOS and NPN devices, which permits the fast, high gain of amplifier 602 (input impedance of about 20 Mohms) and the low leakage input of amplifier 604 during the hold mode. The high gain plus the grounding of amplifier 602 during hold mode to prevent saturation (the input at $V_{in}$ keeps changing whereas Vout holds, so the differential input can become large) permits an acquisition time of less than 100 nsec for 0.01% error; that is, after switching to sample mode Vout tracks within 0.5 mV of $V_{in}$ within 100 nsec. See FIG. 8, which illustrates the extreme case of $V_{out}$ initially at 0 volts and $V_{in}$ at +2.5 volts. The droop rate is less than 1 mV/μsec.

FIGS. 7g-l illustrate an alternate embodiment of the sample and hold 304 using PNP transistors. The PMOS cascode devices 707 and 708 are replaced with PNP bipolar transistors 707A and 708A to exploit their superior frequency response. The greater transconductance of the PNP transistor presents a lower impedance to the collectors of the input transistors 703 and 704, which reduces the parasitic time constant and improves acquisition time. A push-pull type output stage is made possible by the addition of the complementary PNP transistors 750 and 751. This type of output stage is capable of driving lower impedance loads. For a given load, the addition of the PNP will reduce phase shift in the output stage and allow a greater overall bandwidth.

The following table compares the improved specifications of the preferred embodiment sample and hold amplifiers to that presently available.

| Parameter | Prior Art | FIGS. 7a-f | FIGS. 7g-l |
| --- | --- | --- | --- |
| Input Range | ±10 V | ±2.5 V | ±2.5 V |
| Input Resistance | 15 Meg | 100K Ohms | 500K Ohms |
| Input Capacitance | <5 Pf | <5 Pf | <5 Pf |
| Input Offset | <1 mV | <1 mV | <1 mV |
| Input Bias Current | 500 na | 15 μa | <5 μa |
| Open Loop Gain | >160 dB | 150 dB | 180 dB |
| Unity Gain Bandwidth | 4 MHz | 30 MHz | 45 MHz |
| Acquisition Time | 500 nsec | 100 nsec | 50 nsec |
| Droop Rate | .1 mV/μsec | 1 mV/μsec | 1 mV/μsec |
| Slew Rate | 90 V/μsec | 130 V/μsec | 180 V/μsec |
| Pedestal Error | 2 mV | 1 mV | 1 mV |
| Hold Mode Settling, .8% | 100 nsec | 30 nsec | 20 nsec |
| Hold Mode Settling, .015% | 200 nsec | 60 nsec | 35 nsec |

Analog Switch

Timing controller block 330 controls analog switch 334 which is a set of analog CMOS transmission gates. Analog switch 334 must be able to pass analog signals in the −2.5 to +2.5 volt range. With the power rails at −5 volts and +5 volts the analog CMOS transmission gates easily handle this range. Alternative switch implementations such as controlled CMOS inverters could also be used.

Flash Converter

Figure 9:
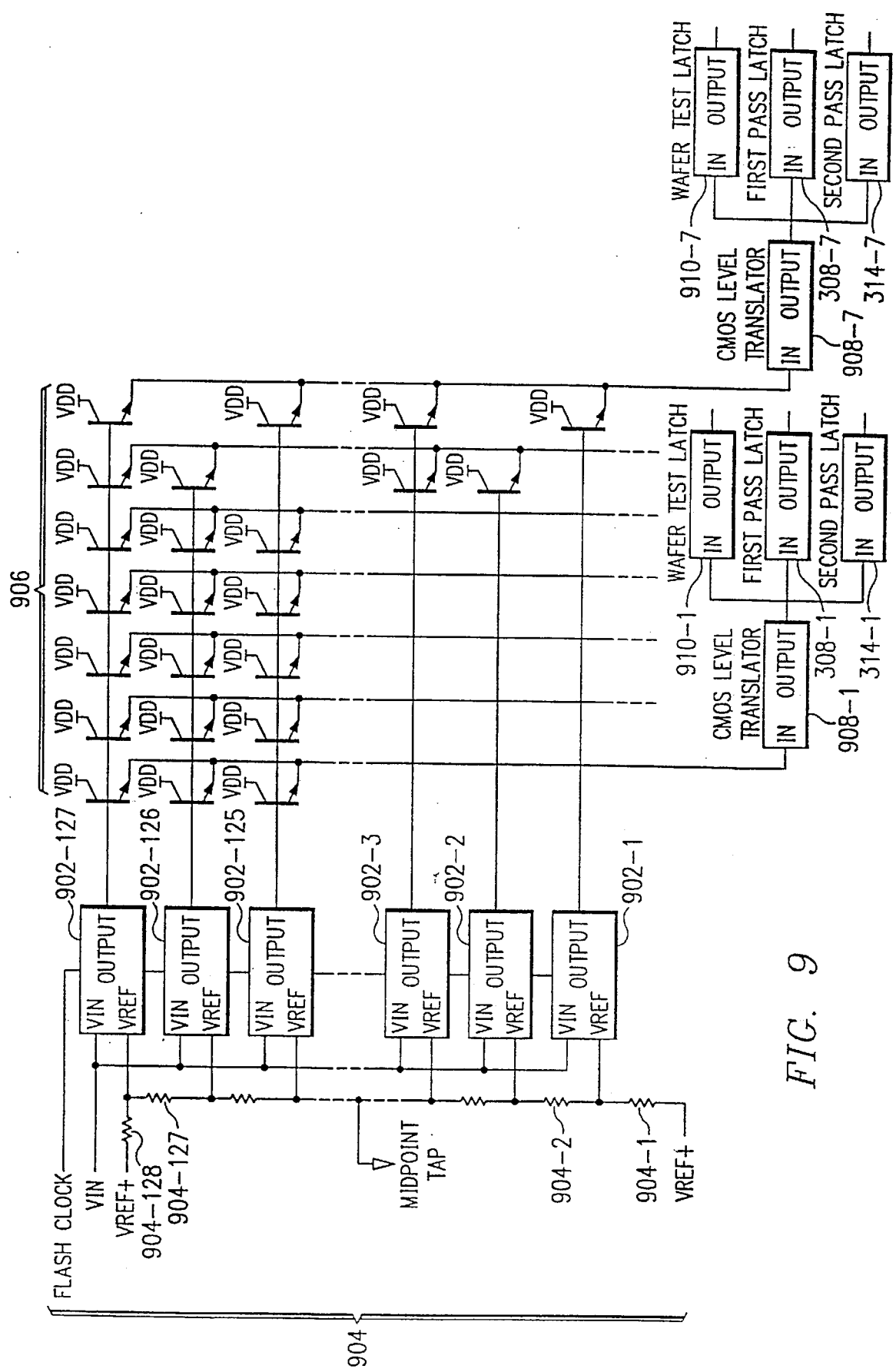
FIGS. 9–22 show aspects of the flash converter of the preferred embodiment.

FIGS. 9-22 schematically show the 7-bit flash converter block 306. In particular, FIG. 9 illustrates the overall flash architecture which includes an array of 127 comparator cells (labelled 902-1 through 902-127), each with a voltage reference input (Vref) connected to a tap on resistor ladder 904 and a signal input $V_{in}$ connected to the signal to be converted (either the output of sample and hold 304 or the output of error amplifier 312). Adjacent comparator cells 902 are functionally interconnected so that only the cell which senses a Vref closest to the input signal $V_{in}$ will output a logic high to array 906. Encoder 906 generates a 7-bit binary output (at ECL type levels) which corresponds to the Vref closest to $V_{in}$. Level translators 908-1 through 908-7 translate this to CMOS levels and feed MSB Latch cells 308-1 to 308-7 and LSB Latch cells 314-1 to 314-7. Latches 910-1 through 910-7 are for testing.

The 128 resistors (labelled 904-1 through 904-128) of ladder 904 each have a nominal resistance of 3.8 ohms. The total resistance of ladder 904 is 486 ohms. With a 5-volt drop the ladder will draw about 10 mA and dissipate 50 mW. The resistors 904 are fabricated from polysilicon with a width of at least 40 um in order to avoid electromigration problems at the contacts. Voltage references (Vref=+2.5 V and Vref= −2.5 V) drive ladder 904 so that the drop across each resistor equals 39.0625 mV, corresponding to a least significant bit (LSB) output. To insure that 1000 000 will be the outcome of an input within 19.5 mV (½ LSB) of 0 volts, resistor 904-65 is center tapped to analog ground (e.g., by replacing resistor 904-65 with two pairs of parallel connected 3.8 ohm resistors connected in series and tapping the series connection). To compensate for this center tap of resistor 904-65, resistor 904-1 is replaced by a 1.9 ohm resistor (two 3.8 ohm resistors in parallel) and resistor 904-128 is replaced by a 5.7 ohm resistor (3.8 ohm and 1.9 ohm resistors in series). Thus, disregarding any comparator cell input bias current, the Vref input to comparator cell 902-1 is −2.480 volts (−2.5+½ LSB); the Vref input to comparator cell 902-2 is 1 LSB higher than to cell 902-1; and so forth up to a Vref input to comparator cell 902-64 of −½ LSB, a Vref input to cell 902-65 of +½ LSB, and continuing up to a Vref of 2.441 volts (2.5−3/2 LSB) for cell 902-127.

The output of comparator cells 902 is encoded by encoder 906 which feeds seven level translators and latches 908-1 through 908-7. Only a single one of comparator cells 902 has a high output due to a segment detecting output NOR gate with inputs also from the two adjacent comparator cells; and encoder 906 is just a simple array of NPN transistors with bases tied to the comparator cell outputs and emitters tied to the seven bitlines feeding the level translators/latches 908. Thus when comparator cell 904-j has the high output, all of the NPN transistors in the jth row turn on and pull the connected bitlines up about 0.54 volts (from 4.46 volts to 5.0 volts) and thereby encode the output. Level translators 908 and latches 308 on the bitlines amplify and translate the 0.54 volt swings on the bitlines into full CMOS levels and latch them. The encoding expresses positive numbers with a leading bit equal to 1 and negative numbers in two's complement form with a leading bit equal to 0.

FIGS. 10a-b are a schematic circuit diagram for a comparator cell 902 which has first gain stage 1010, second gain stage 1020, latch 1030, and output NOR gate 1050. First gain stage 1010 includes NPN emitter-followers 1001 and 1002 for buffering the Vref and Vin input signals, respectively, to NPN differential pair 1003–1004, which have NMOS 1017 as their current source. NMOS 1011 and 1012 provide current sources, load resistors 1013 and 1014 are made of NiCr, and NPN 1019 is diode connected. The devices operate with +5 volt (Vcc) and −5 volt (Vee) power supplies.

The outputs of first gain stage 1010 are limited to a swing of about 2.0 volts. These feed the inputs of second gain stage 1020 which includes input NPN differential pair 1021–1022, NiCr load resistors 1023 and 1024, NPN switch 1027, resistor 1028, and NMOS current source 1029. Second stage 1020 operates with +5 volts and ground power supplies. The outputs of second stage 1020 drive latch 1030, formed with cross-coupled NPNs 1033–1034. NPN 1031 provides the coupling from the collector of NPN 1033 to the base of NPN 1034. NPN 1032 couples the collector of NPN 1034 to the base of NPN 1033. NMOS 1035 and 1036 are current sources for NPN 1031 and 1032, respectively. NPNs 1037 and 1038 provide diodes, NPN 1041 is a switch, and resistor 1043 connects NPN 1041 to current source 1029. The latch devices also operate with +5 volts and ground power supplies.

Second stage 1020 and latch 1030 operate as follows. The flash clock (the flash clock is the sum of FLASH1 and FLASH2) is translated to Vbe levels (see FIGS. 14a–b and CLK in FIG. 10b) and drives the base of switch NPN 1041. The complement of the flash clock drives the base of switch NPN 1027. Thus, prior to a conversion, switch NPN 1027 is on and differential pair 1021–1022 is active but switch 1041 is off and cross-coupled pair 1033–1034 are inactive. However, NPNs 1031 and 1032 are both active and the result of the comparison of Vref with Vin (which may be varying) passes to NOR gate 1050 (to the base of NPN 1051) and to the NOR gates of the adjacent comparator cells. Once flash clock goes high, switch 1027 cuts off the current to differential pair 1021–1022 and turns on switch 1041. This activates cross coupled NPN 1033–1034 to latch in the most current result of the comparison. Note that the switching and latching involves only current switching in NPN devices, so the voltage swings stay down in the range of 0.5 volt and do not create as much noise as comparable CMOS logic switching.

Latch 1030 has three outputs: inverting nodes 1045 and 1046 and noninverting node 1047. Node 1045 is one of the three inputs for NOR gate 1050; inverting node 1046 is an input to the NOR gate of the adjacent comparator cell receiving a higher Vref; and noninverting node 1047 is an input to the NOR gate of the adjacent comparator cell receiving a lower Vref. NOR gate 1050 includes parallel pulldown NPNs 1051, 1052, and 1053, plus NMOS current source 1055, logic reference voltage input NPN 1057, and pullup resistor 1058. The output of NOR 1050 connects to a row of encoder 906. The input (base) of NPN 1051 connects to an inverting output (node 1045) of latch 1030, the input of NPN 1052 connects to an inverting output of the latch of the adjacent comparator cell with a lower Vref, and the input of NPN 1053 connects to the noninverting output of the adjacent comparator cell with a higher Vref. Hence, the output of NOR gate 1050 is logic low unless all three of NPNs 1051–1053 are turned off, and this provides a logical segment detection in comparators 902 as follows.

NOR gate 1050 in comparator cell 902-j is high precisely when its node 1045 is low and node 1045 from cell 902-(j−1) is also low and node 1045 from cell 902-(j+1) is high.

This corresponds to $V_{in}$ being greater than Vref for cell 902-j (and Vref for cell 902-(j−1) which is lower) and being less than Vref for cell 902-(j+1). And in this case NOR gate 1050 of cell 902-j being high pulls the jth row of encoder 906 high which in turn pulls the appropriate coding columns high. The NOR gates in all other cells 902-k have at least one of NPNs 1051–1053 turned on to pull the kth row of encoder 906 low and thereby not affect any of the coding columns. The NOR gates 1050 also provide some error correction. The NOR gate outputs will only be high if Vin is greater than Vref for cells 902-(i−1) and 902-i and if Vin is less than Vref for cell 902-(i+1). This requirement on the states of three adjacent cells avoids having two adjacent cells output a logic high signal at the same time. Otherwise, if two adjacent cells have high outputs the resulting binary code could have a value of up to twice the correct value; the three input NOR gate prevents this from happening.

Figure 11:
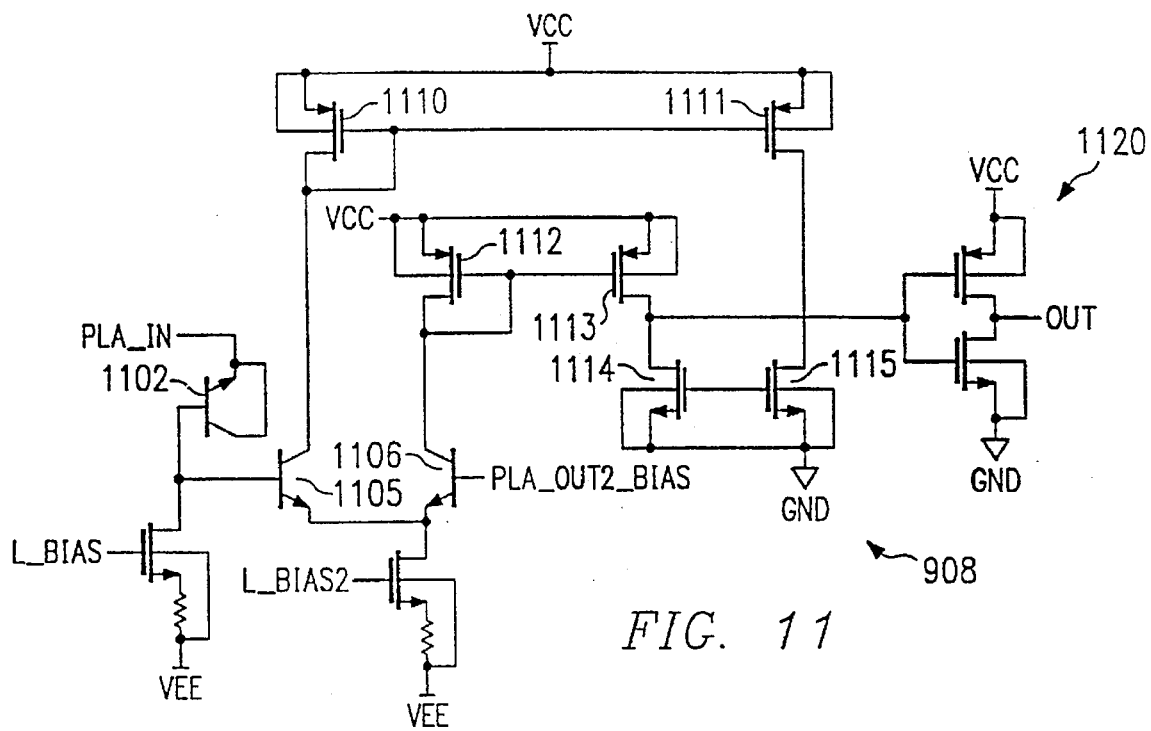
Figure 12:
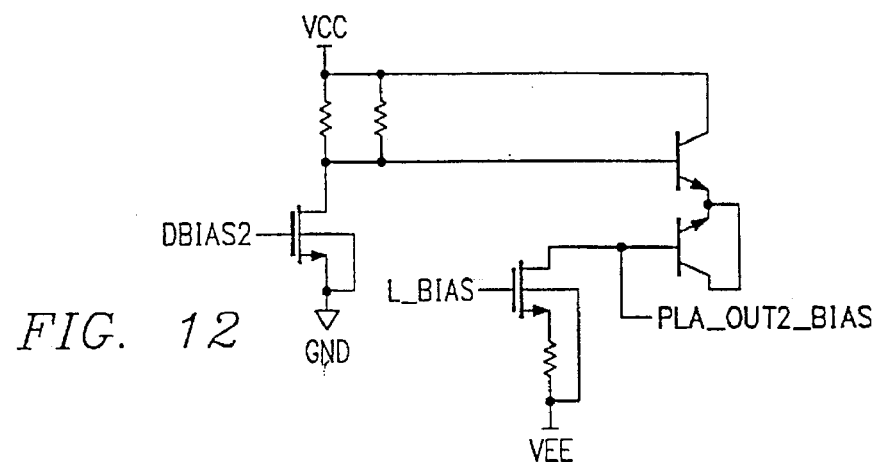

FIG. 11 shows the circuitry for level translators 908-1 through 908-7. The corresponding column of encoding array 906 connects to diode 1102 into the base of NPN 1105 of differential pair 1105–1106. The base of NPN 1106 connects to a bias with level midway between the extremes of the swing at the base of NPN 1105. The currents through NPNs 1105–1106 are mirrored by PMOS mirrors 1110–1111 and 1112–1113 and then NMOS mirror 1114–1115 to drive a CMOS output inverter 1120. FIG. 12 illustrates the bias circuit for NPN 1106.

Figure 13:
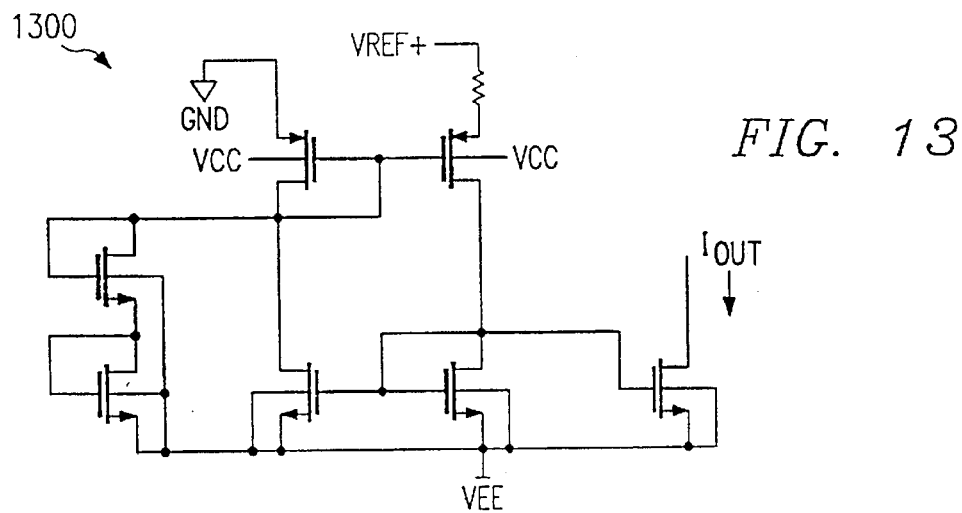
Figure 14:
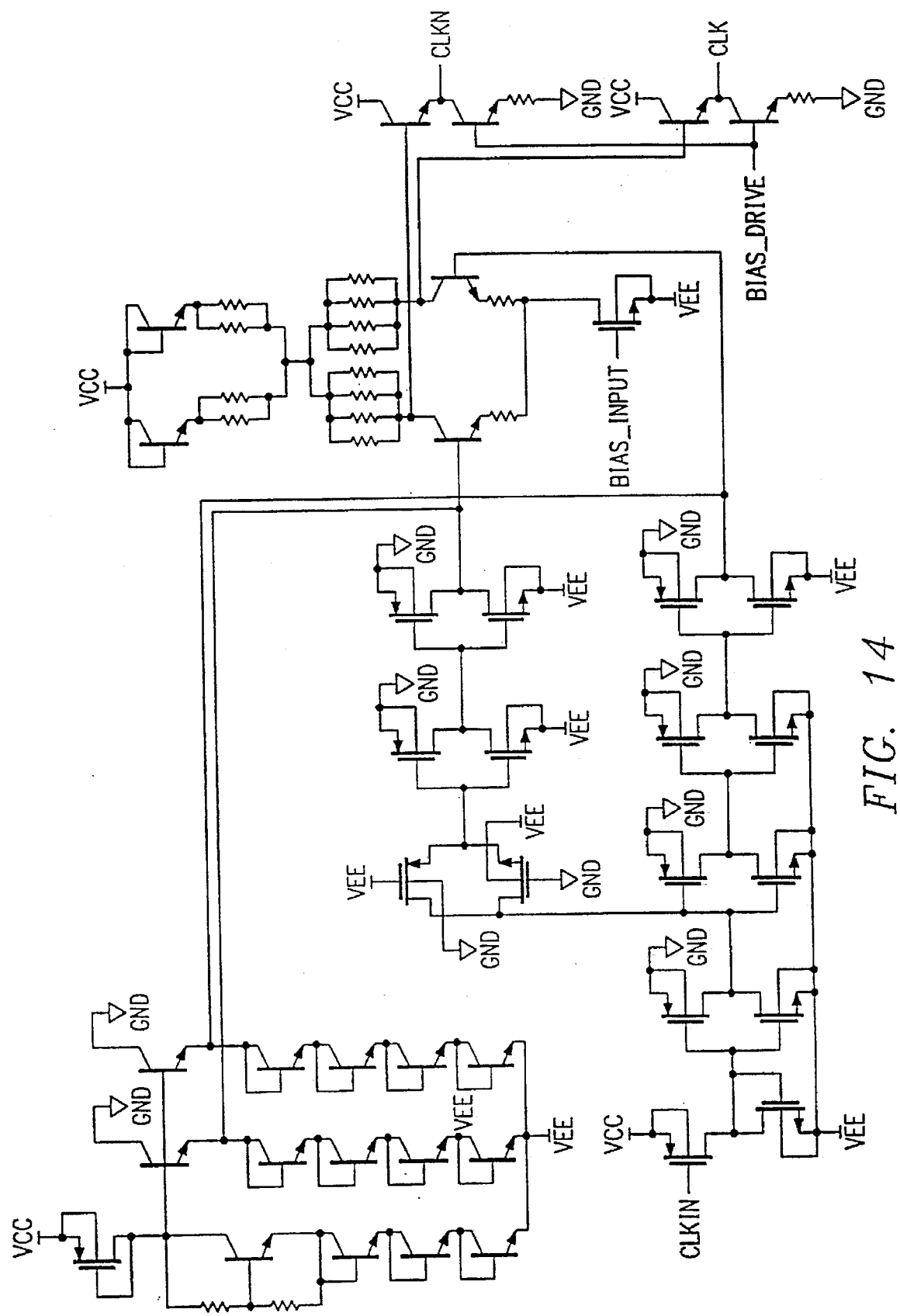

FIG. 13 shows bias generator 1300 for setting gate voltages in the comparator cells 902. FIGS. 14a–b show the clock generator for translating the CMOS level flash clock signal to +½ Vbe and −½ Vbe level signals for driving switch NPNs 1027 and 1041 in comparator cells 902.

Figure 10:
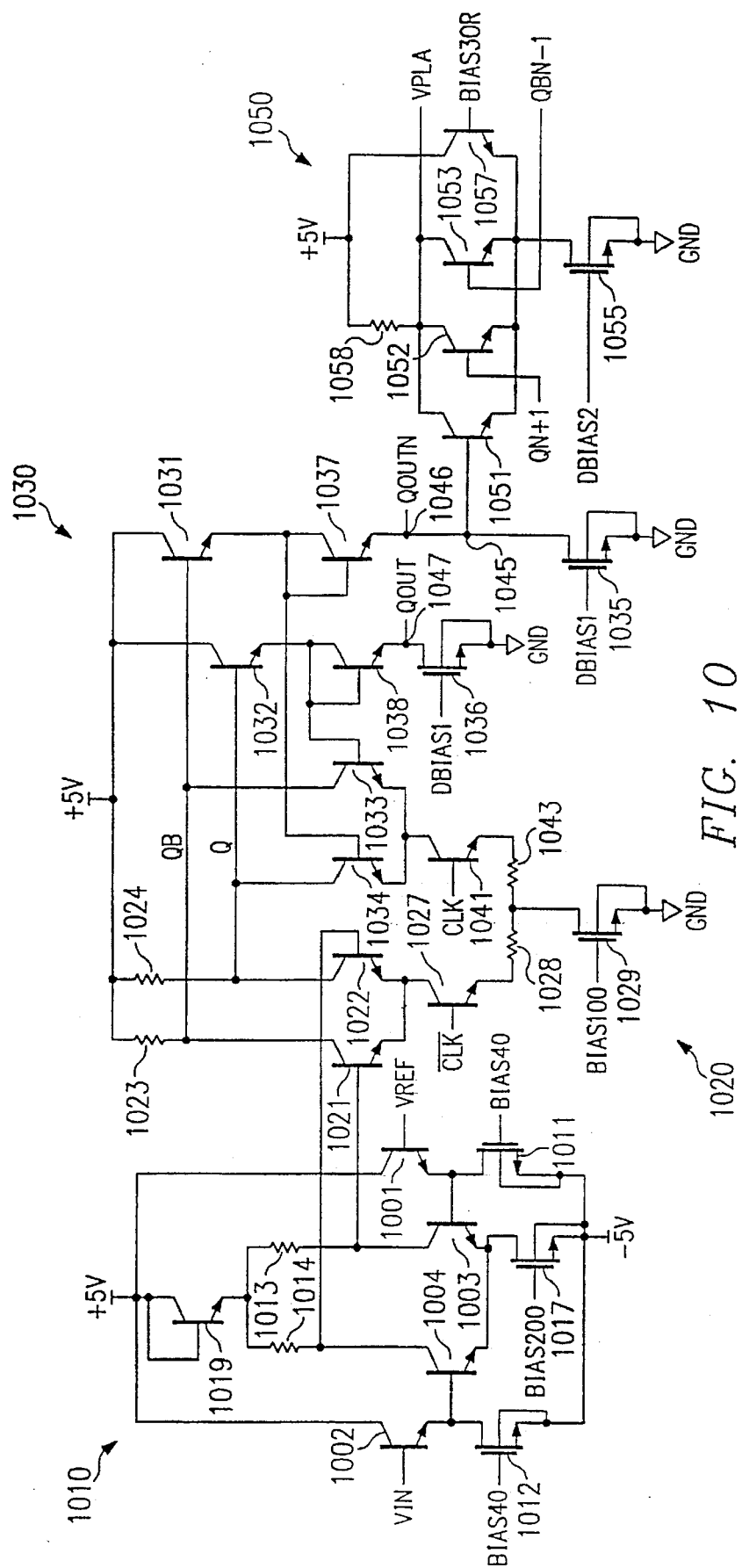
Figure 15:
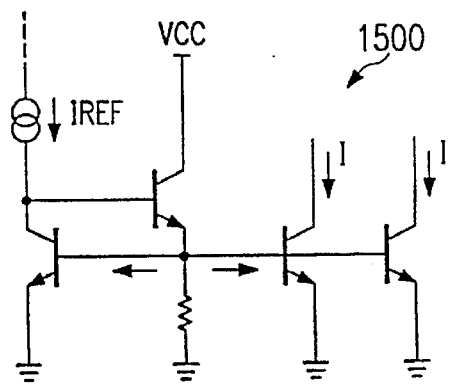
Figure 16:
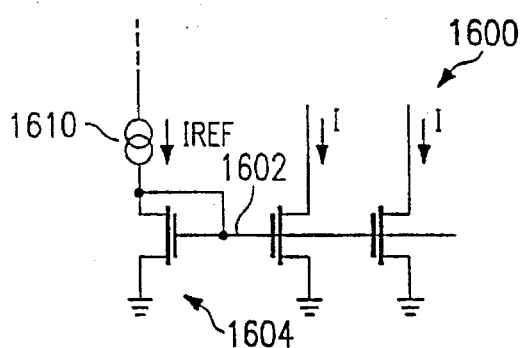

Each of the 127 comparator cells 902 has seven current source NMOS devices (1012, 1017, 1011, 1029, 1035, 1036, and 1055 in FIG. 10). Thus a large number of equal parallel current sources must be provided to insure uniform behavior of the comparator cells. FIG. 15 shows a standard base current compensated NPN current mirror 1500 with two outputs; the resistor current typically is an order of magnitude larger than the base currents. This current mirror overcomes base current error sensitivity of a basic NPN current mirror, but has the drawback of having to provide a base current for every output NPN, which becomes intolerable for the 128×7 outputs required by the comparators 902. FIG. 16 illustrates a basic NMOS current mirror 1600 which has the advantages of high packing density and zero bias current, and low drain to source operating voltages when a large number of outputs are required. However, the NMOS current mirror is sensitive to kickback noise. That is, a transient voltage spike at one of the outputs capacitively couples (i.e., a gate-to-drain parasitic capacitor) to gate bias line 1602. This causes a gate bias fluctuation and a current fluctuation in all of the other outputs. The magnitude of the gate bias fluctuation depends upon $Z/(Z+Z_{cap})$ where $Z_{cap}$ is the impedance of the gate-to-drain capacitor and Z is the impedance to ac ground of gate bias line 1602. In effect, a high pass filter exists between each output and gate bias line 1602 because $Z_{cap}$ varies as the reciprocal of frequency. The impedance Z is the reciprocal of the transconductance of NMOS 1604 if the impedance of reference current source 1610 and the output impedance of NMOS 1604 are large and neglected. Hence, the small transconductance of NMOS 1604 generally leads to the kickback noise sensitivity of the basic NMOS current mirror 1600.

Figure 17:
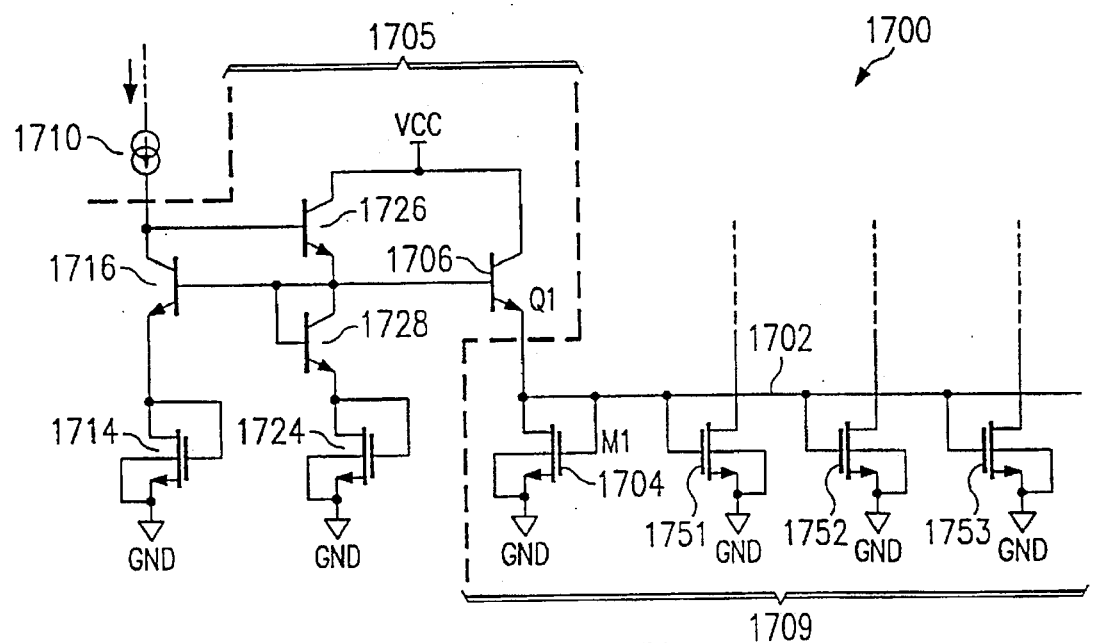

The preferred embodiment current mirror 1700, shown schematically in FIG. 17, inserts an NPN current mirror 1705 between reference current source 1710 and NMOS 1704 of an NMOS current mirror 1709. This lowers the impedance to ac ground of gate bias line 1702 because the high transconductance of NPN 1706 provides a path to ac ground paralleling NMOS 1704. An order of magnitude drop in the impedance may be easily achieved without a large increase in substrate area occupied by the devices. Thus current mirror 1700 can provide 20 dB further kickback noise rejection plus maintain the advantages of NMOS current mirrors.

The current mirror 1700 operates as follows. NMOS 1714 is matched with NMOS 1704 to provide the same voltage drop for equal currents. NPN 1716 and NPN 1726 match NPN 1706, so they form a base current compensated current mirror with matching NPN 1728 the shunt resistor. NMOS 1724 matches NMOS 1704 and 1714 to provide the same voltage drop. Thus the emitter current from NPN 1706 mirrors the reference current from source 1710 within a factor that can be taken as 1 presuming a large gain by NPN 1726. Output NMOS transistors 1751, 1752, 1753, etc. match NMOS 1704 and have the same gate bias, so the outputs mirror the reference current. Of course, the load devices 1724 and 1728 could be replaced by resistors, but this typically occupies more substrate area.

Figure 18:
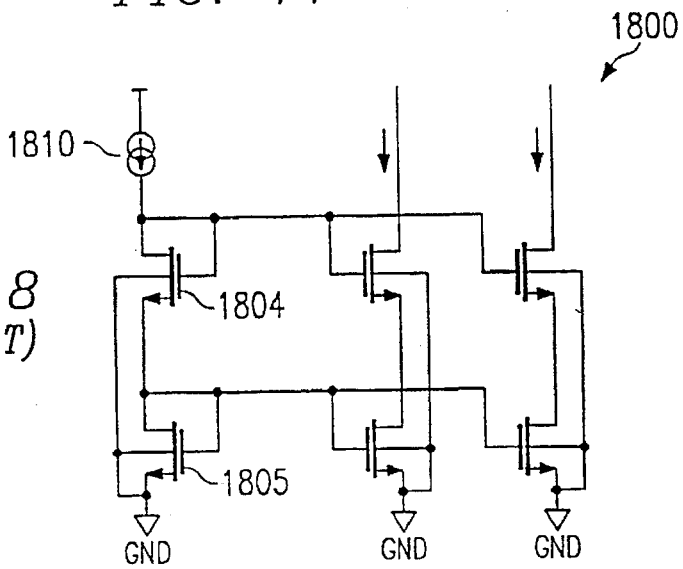
Figure 19:
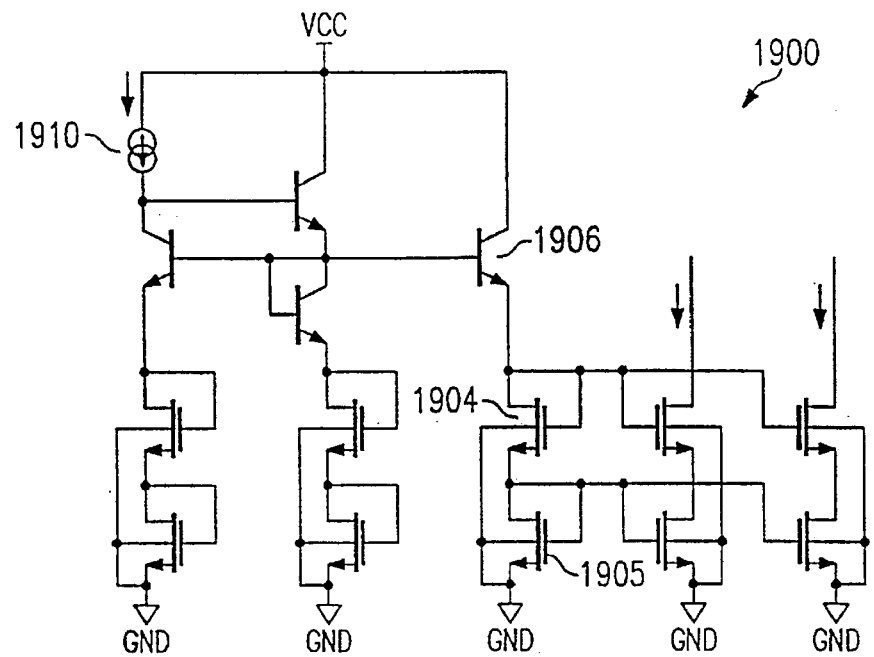

Current mirror 1700 can be modified in various ways to adapt these principles of kickback noise rejection to other MOS current mirror circuits. For example, FIG. 18 shows a basic stacked NMOS current mirror as would be used for high output impedance applications with reference current source 1810 through NMOS 1804–1805 being mirrored by the output NMOS stacks. FIG. 19 shows a preferred embodiment version 1900 of a stacked NMOS current mirror where NPN 1906 provides high transconductance to lessen kickback coupling. Indeed, simulations on the current mirrors 1800 and 1900 confirm that mirror 1900 provides 31 dB of additional kickback rejection.

Figure 20:
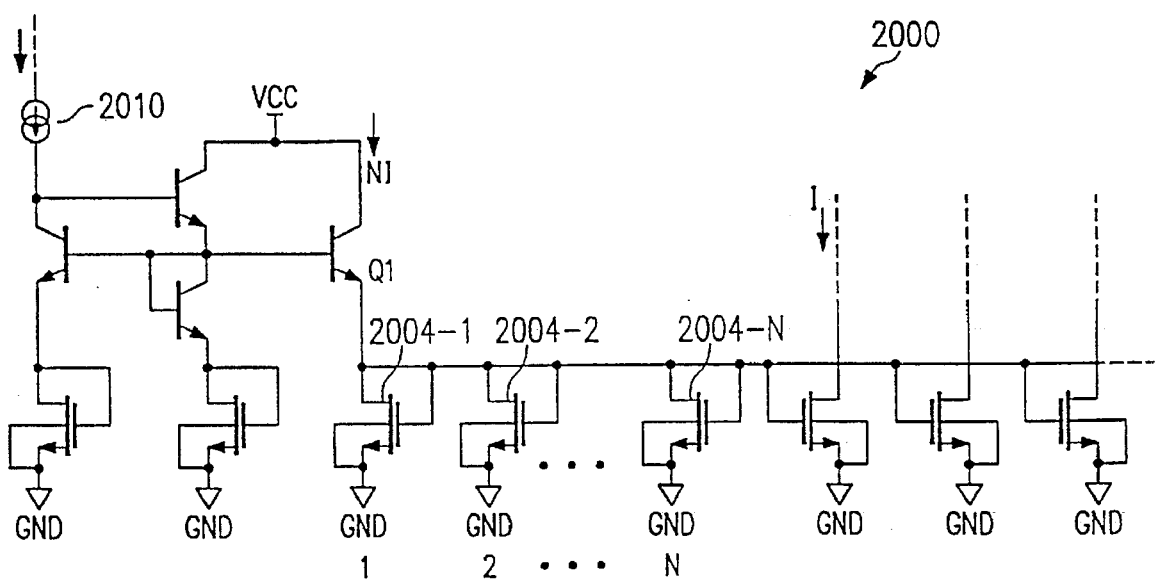

FIG. 20 illustrates a low current version of current mirror 1700. The reference current from source 2010 is divided among NMOS devices 2004-1, 2004-2, ... 2004-N so each device 2004-j outputs only 1/N of the reference current.

Figure 21:
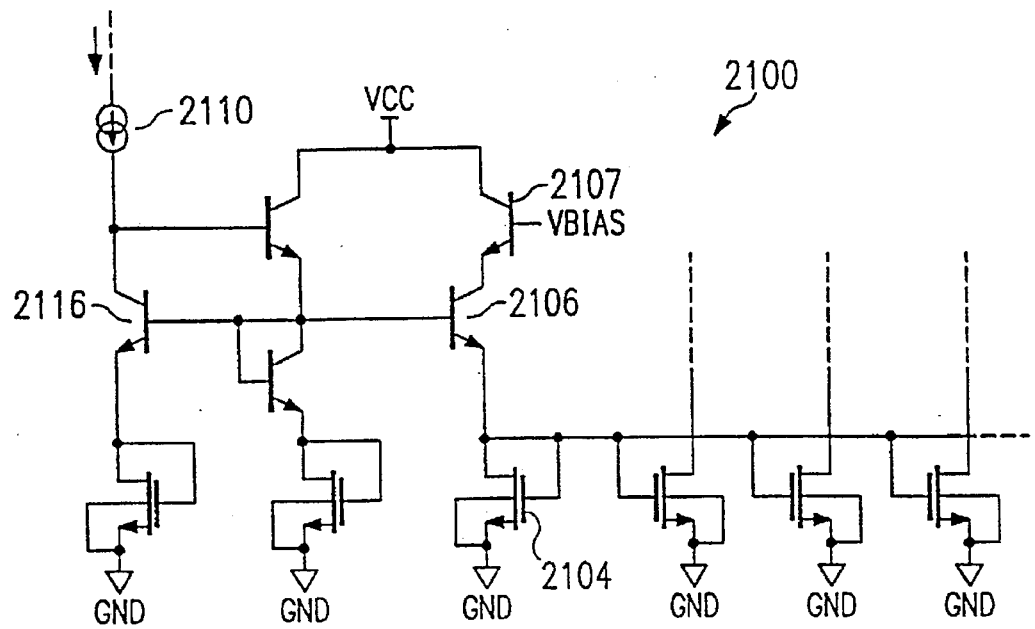

FIG. 21 shows current mirror 2100 which modifies current mirror 1700 to compensate for the Early voltage induced errors of NPN 1706. Current mirror 2100 includes NPN 2107 with a fixed bias set to match the Vce of NPN 2106 to the Vce of NPN 2116.

Figure 22:
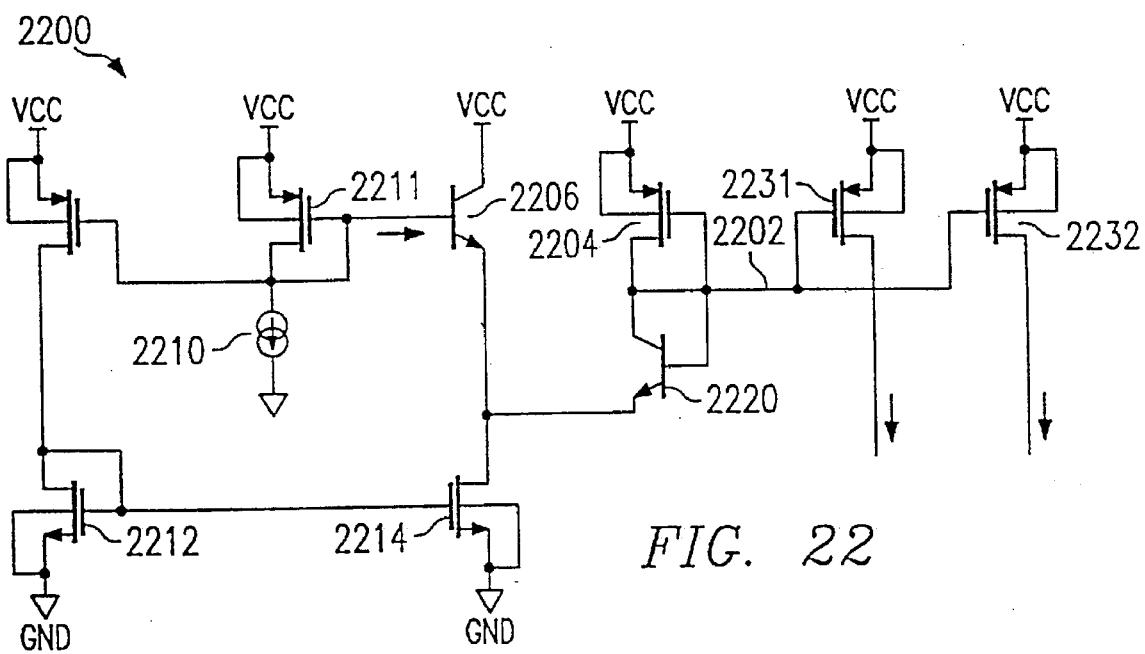
Figure 23A:
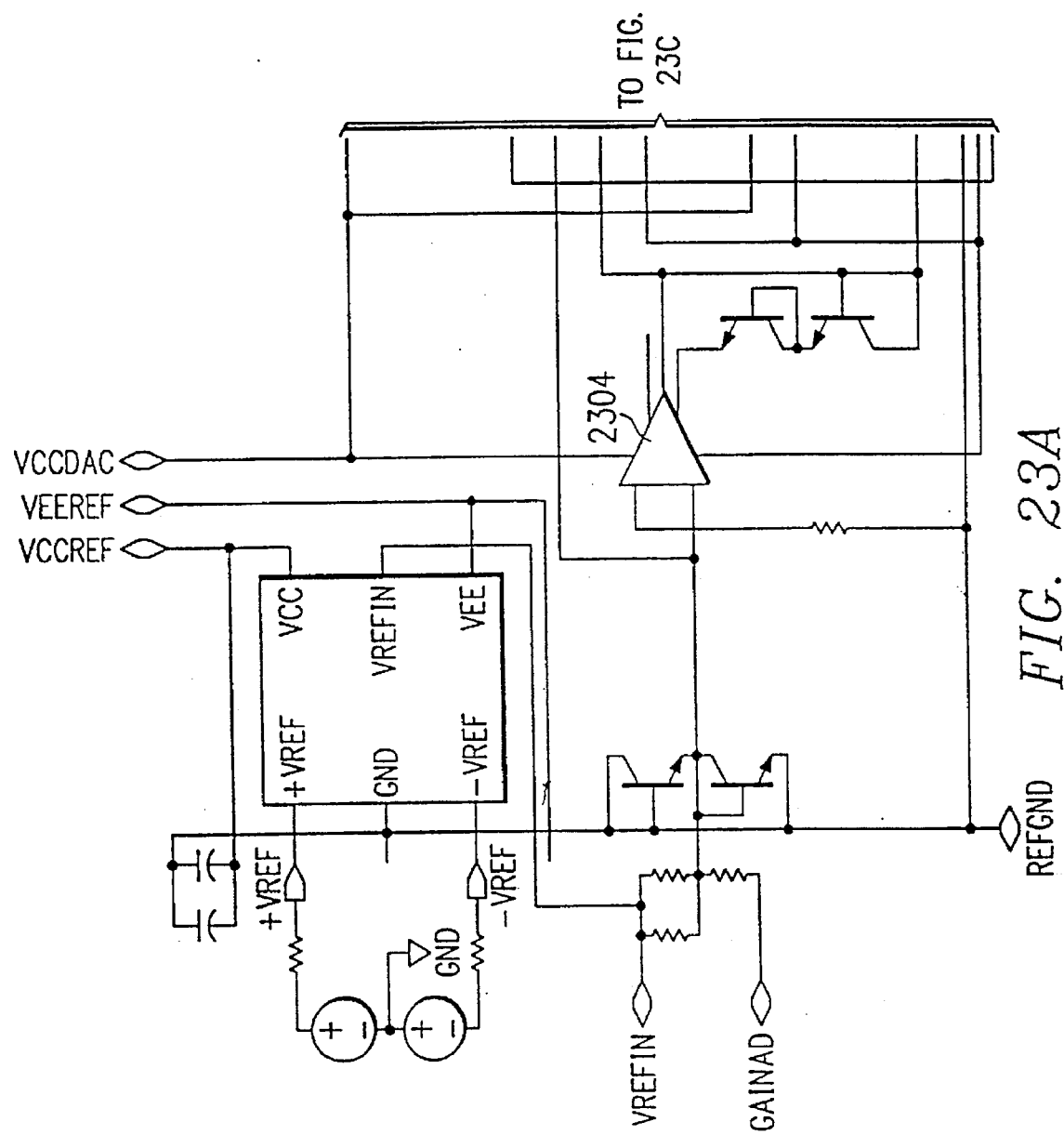
Figure 23B:
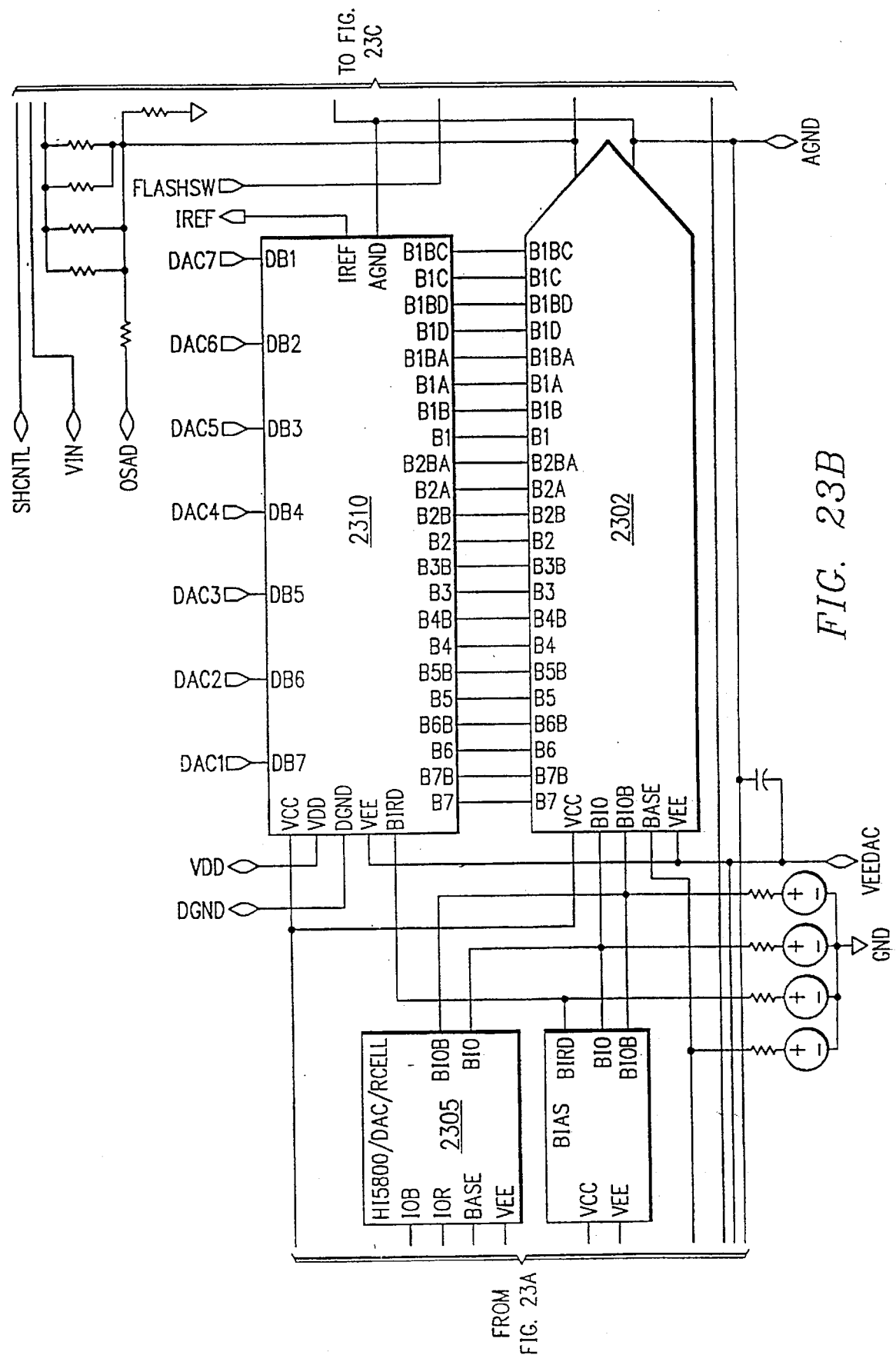
Figure 23D:
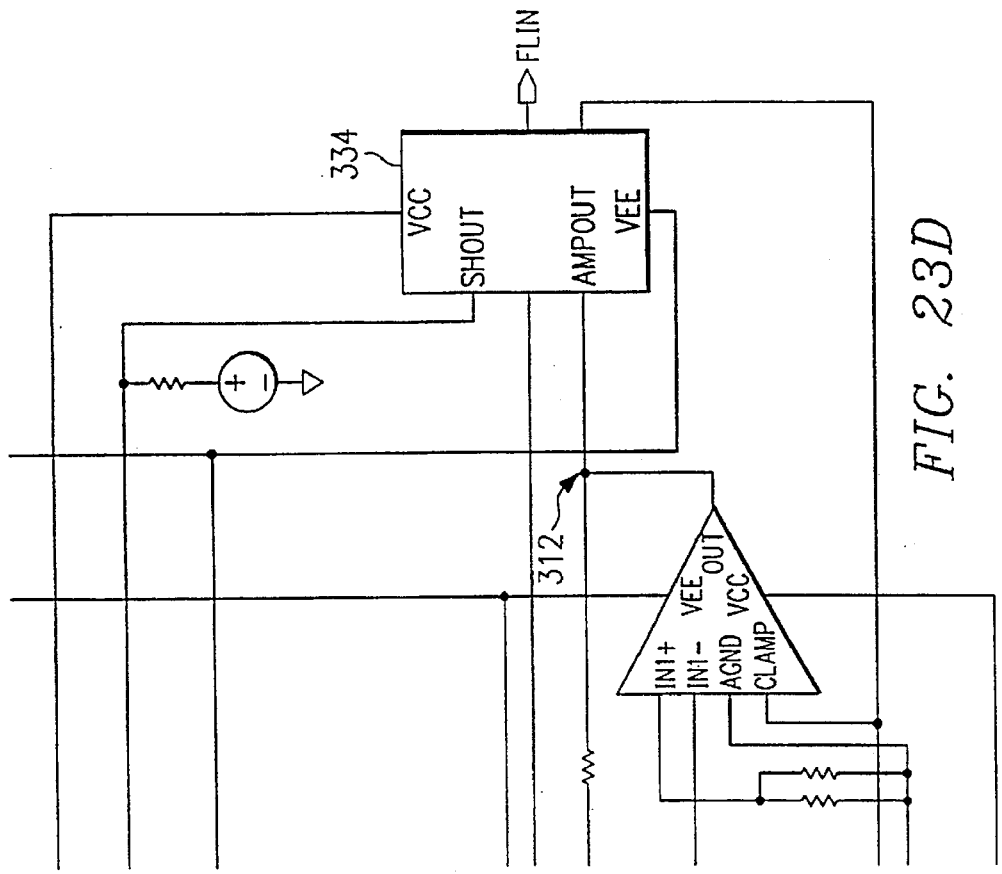
Figure 23C:
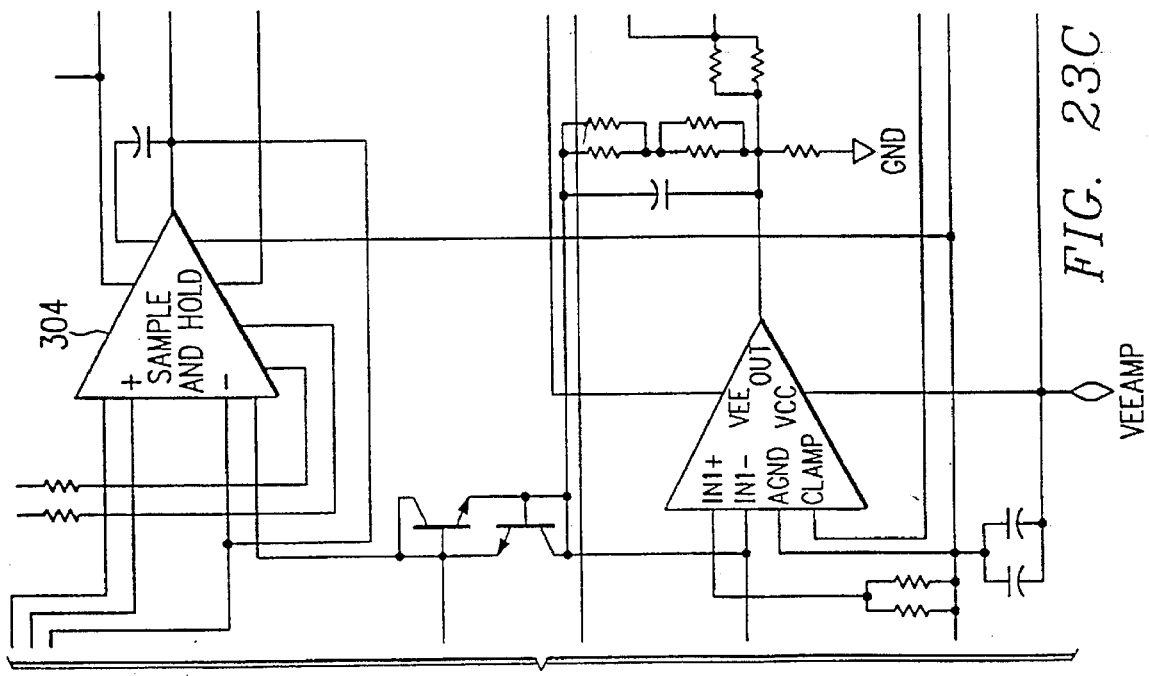
Figure 24A:
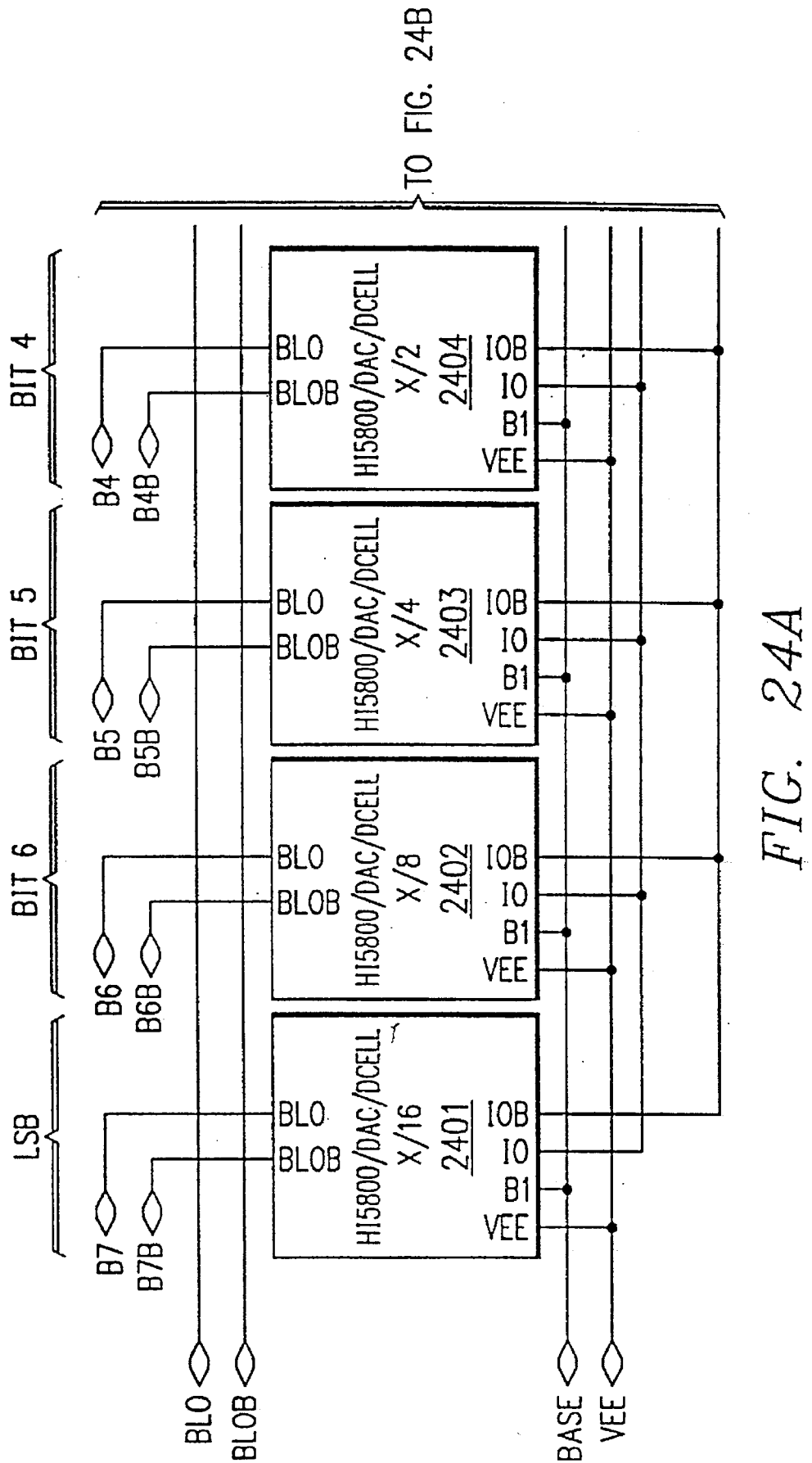
Figure 24B:
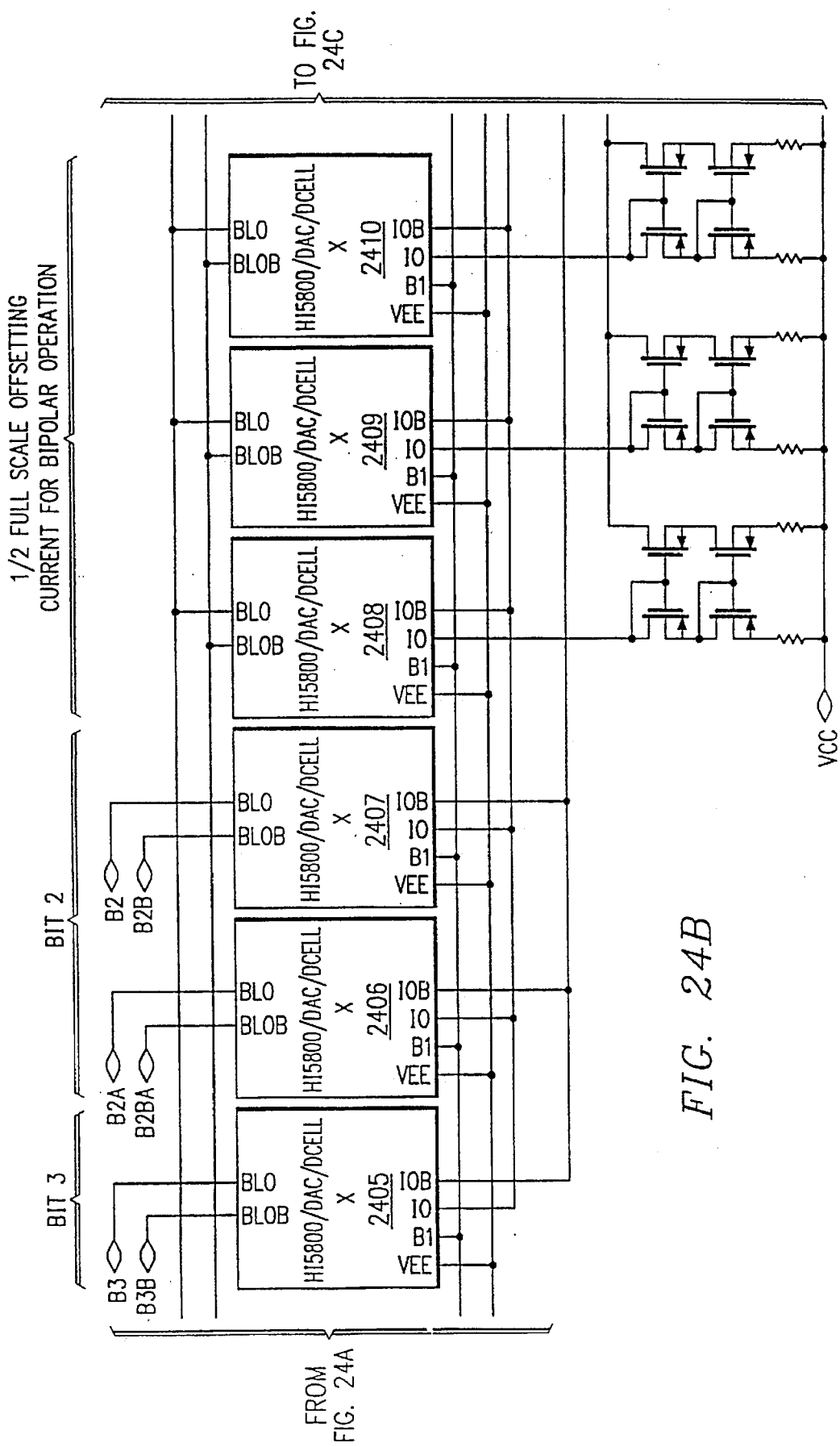
Figure 24C:
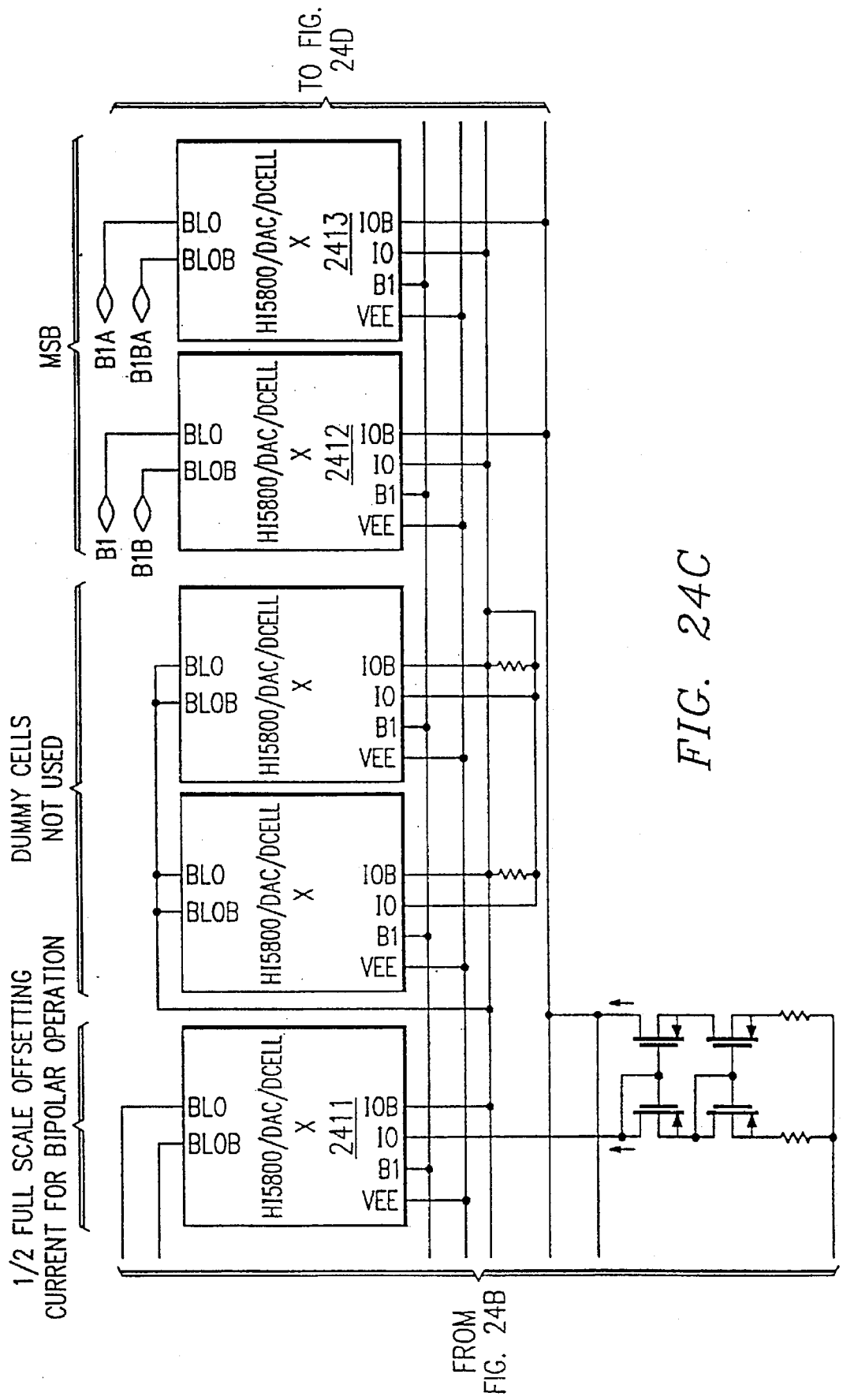

FIG. 22 illustrates a PMOS current mirror 2200 which includes the kickback suppression using NPNs. Current mirror 2200 provides the high transconductance of NPN 2206 in series with NPN 2220 to create the low impedance from gate bias line 2202 to ac ground. The reference current from source 2210 is mirrored into NMOS 2212 and then into NMOS 2214, which has twice the gate width of NMOS 2212. Thus twice the reference current passes through NMOS 2214. And NPN 2206 is biased by PMOS 2211 to pass the reference current. Consequently, PMOS 2204 and NPN 2220 also pass the reference current, and this is mirrored by output PMOS 2231 and 2232 through gate bias line 2202. NPN 2220 provides a Vbe voltage drop to match that of NPN 2206, and PMOS 2204 matches PMOS 2211.

Current mirror 1700 could be converted to a PMOS current mirror by replacing NPN with PNP and NMOS with PMOS. Similarly, the other current mirrors 1900, 2000, 2100, and 2200 could be transformed by P and N type device switches.

MSB Latch

MSB latch 308 is a set of seven standard latches 308-1 through 308-7 indicated in FIG. 9, which are clocked to lead the outputs of translators 908-1 through 908-7 at the falling edge of FLASH1. The falling edge also cuts off the current to latches 1030 and reapplies current to the differential pairs 1021–1022 in the comparator cells 902. This prepares flash converter 308 for another conversion. The outputs of MSB latch 308 are labelled A1, A2, ... A7.

DAC

FIGS. 23–30 illustrate various components of DAC 310. As shown in FIGS. 23a–d, the DAC includes core 2302, control amplifier 2304, reference cell 2305, and interface 2310. Sample and hold 304, analog switch 334, and error amplifier 312 are also shown in FIGS. 23c–d. DAC 310 uses current scaling with the CMOS bits from MSB Latch 308 translated to ECL levels within interface 2310 which then drive current switches in core 2302. The DAC output current feeds error amplifier 312, as shown in FIG. 31. FIGS. 24a–d show core 2302 with cells 2401–2415 controlled by the bits from MSB latch 308. FIG. 26 shows the current switch structure 2600 for the cells 2401–2404, and FIG. 25 shows the current switch structure 2500 for the cells 2405–2415. Each cell 2500 or 2600 has an input NPN differential pair 2501–2502 or 2601–2602 tied to a current source made of biased NPN 2510 and NiCr resistor 2512 or biased NPN 2610 and NiCr resistor 2612. Resistor 2512 is shown as two resistors in series, and resistor 2612 is shown as four resistors in series. When input 2520 receives a logic high signal (−0.7 volt), and complementary input 2521 receives a logic low signal (−2.1 volts), NPN 2501 turns on and NPN 2502 turns off. This steers the current from output 2530 to current source 2510–2512 and leaves output 2531 in a high impedance state. Reversed inputs similarly steer the current from output 2531 and leave output 2530 in a high impedance state. Cell 2600 is analogous. Thus the switching in the core cells only steers a constant current and involves voltage swings of 1.4 volts. This provides higher speed and lower noise than is attainable with CMOS switching.

Cells 2405–2415 all have equal current sources (see FIG. 25 with resistor 2512 at 1 Kohms) and correspond to the higher order bits from MSB Latch 308. A7 (the highest order bit) drives four cells: 2412–2415; A6 drives two cells: 2406–2407; and A5 drives cell 2405. In each case if the bit is a 1, then the cell steers the current from DAC output 2430, and if the bit is a 0, the cell steers the current from DAC output 2431. The four cells 2408–2411 provide a constant current, through current minors 2420, to DAC output 2430. This constant output current just offsets the current absorbed by cells 2412–2415 when bit equals 1 and corresponds to the fact that a 0 volt input $V_{in}$ leads to a 1000000 from flash converter 306.

Cells 2401–2404 (cells as in FIG. 26) have proportionally smaller current sources than those of cells 2405–2415 by the use of proportionally larger resistors 2612: A4 switches half the current switched by A5 because resistor 2612 of cell 2404 is about twice the value of the resistor 2512 of cell 2405. Similarly, A3 switches half the current switched by A4, A2 switches half the current switched by A3, and A1 switches half the current switched by A2.

Figure 27A:
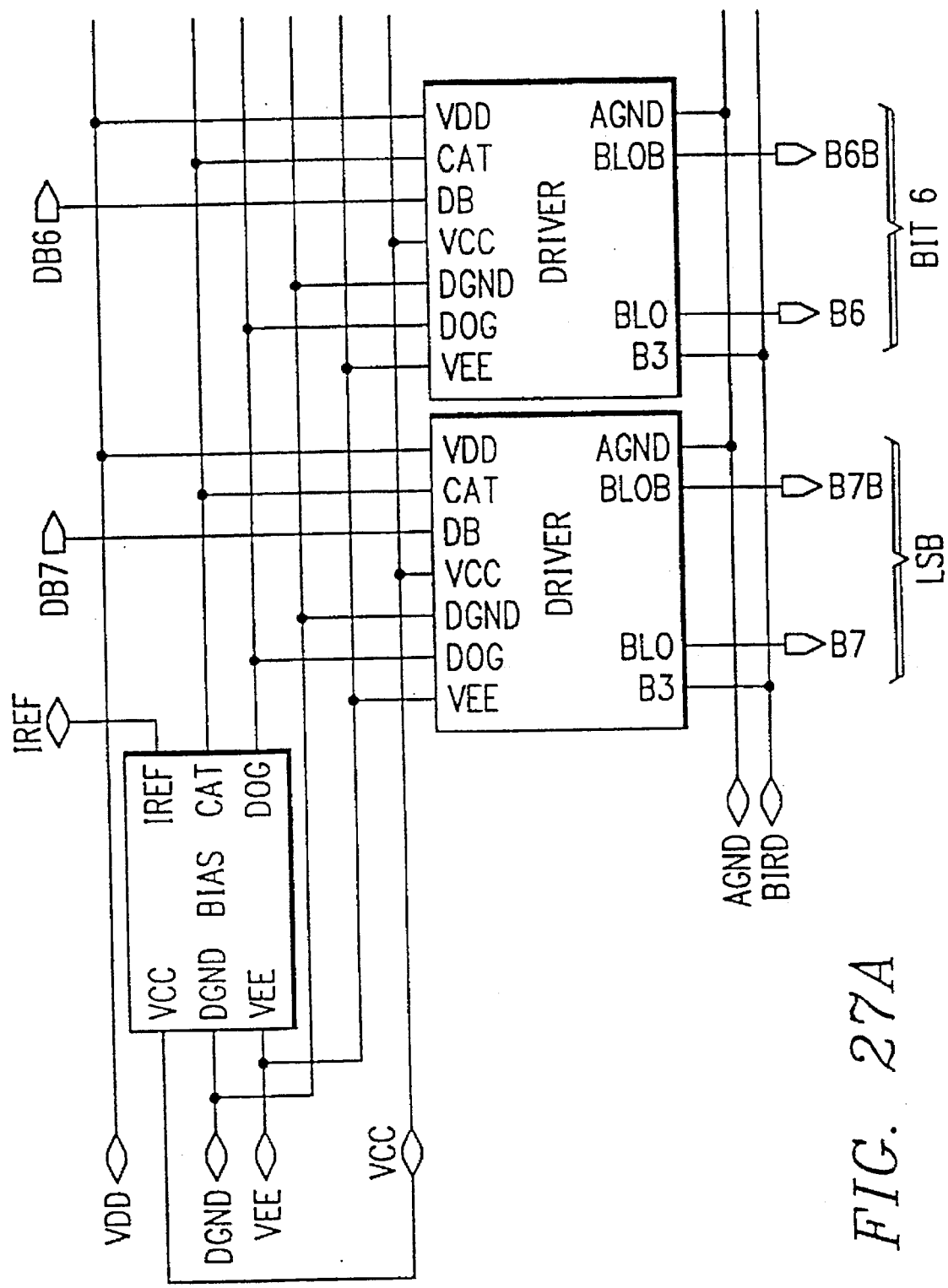
Figure 27B:
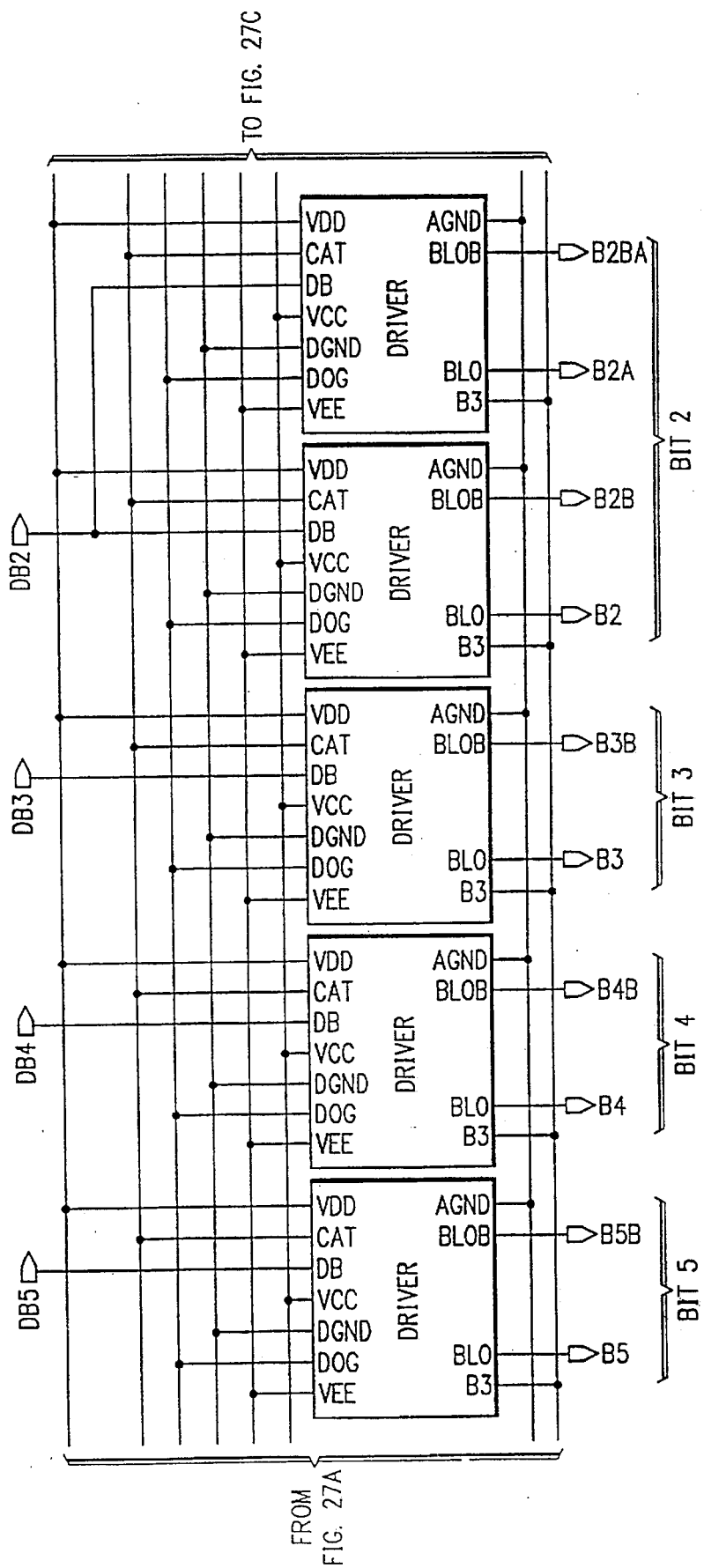
Figure 27C:
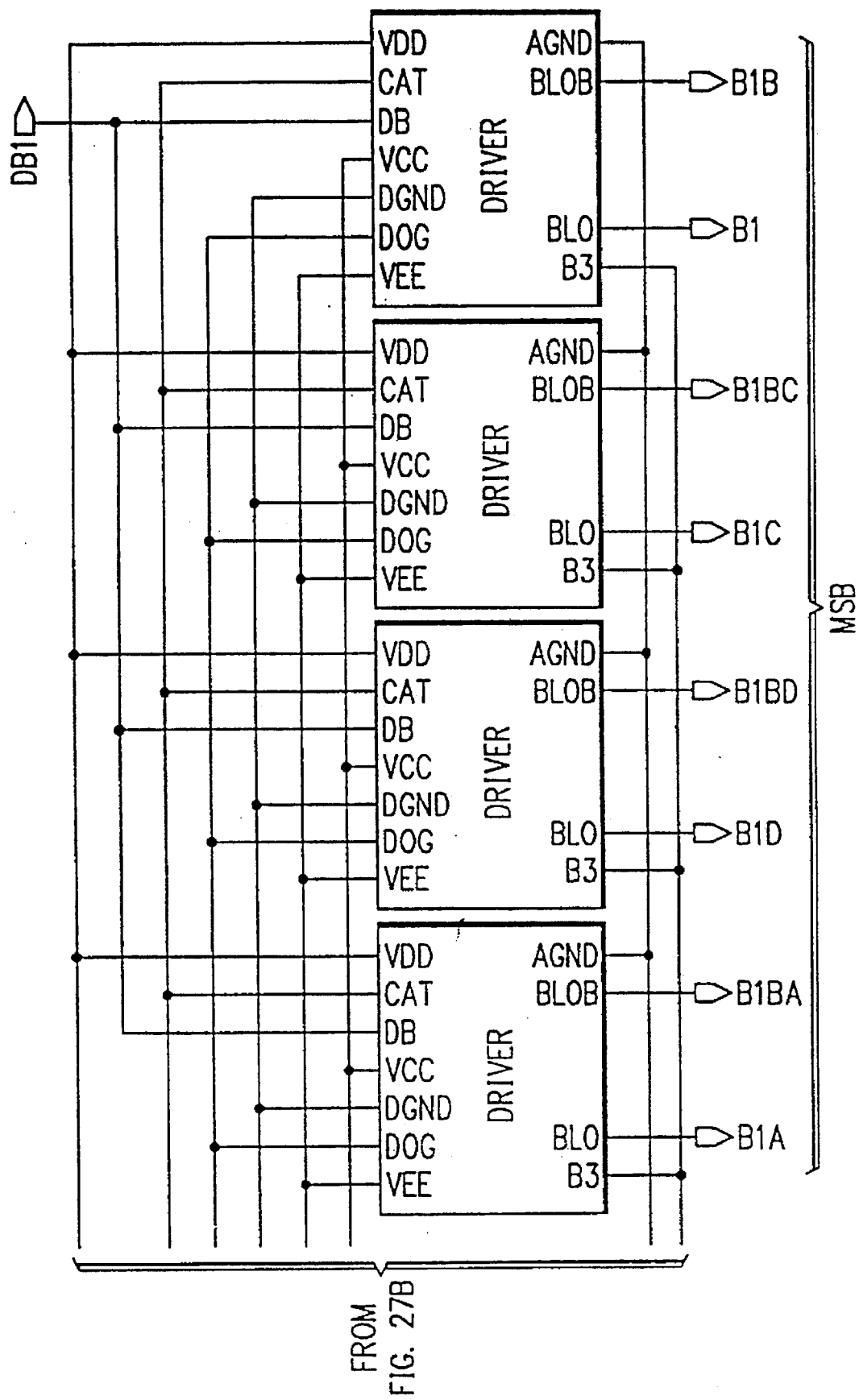
Figure 28:
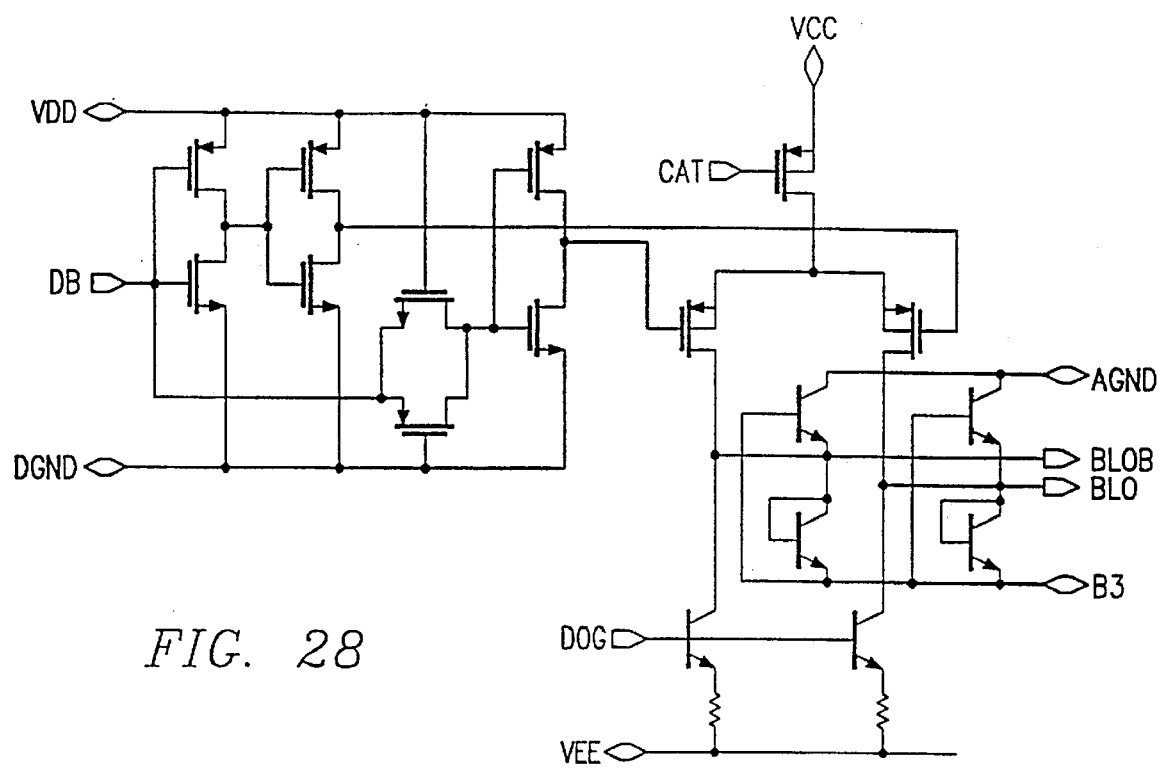

FIGS. 27a–c show interface 2310 which translates the CMOS levels of bits A1 A2 ... A7 to bipolar levels with a translation cell for each current cell in core 2302; and FIG. 28 illustrates the translation cell. Interface 2310 also isolates the analog currents in core 2302 from the CMOS switching noise.

Figure 29:
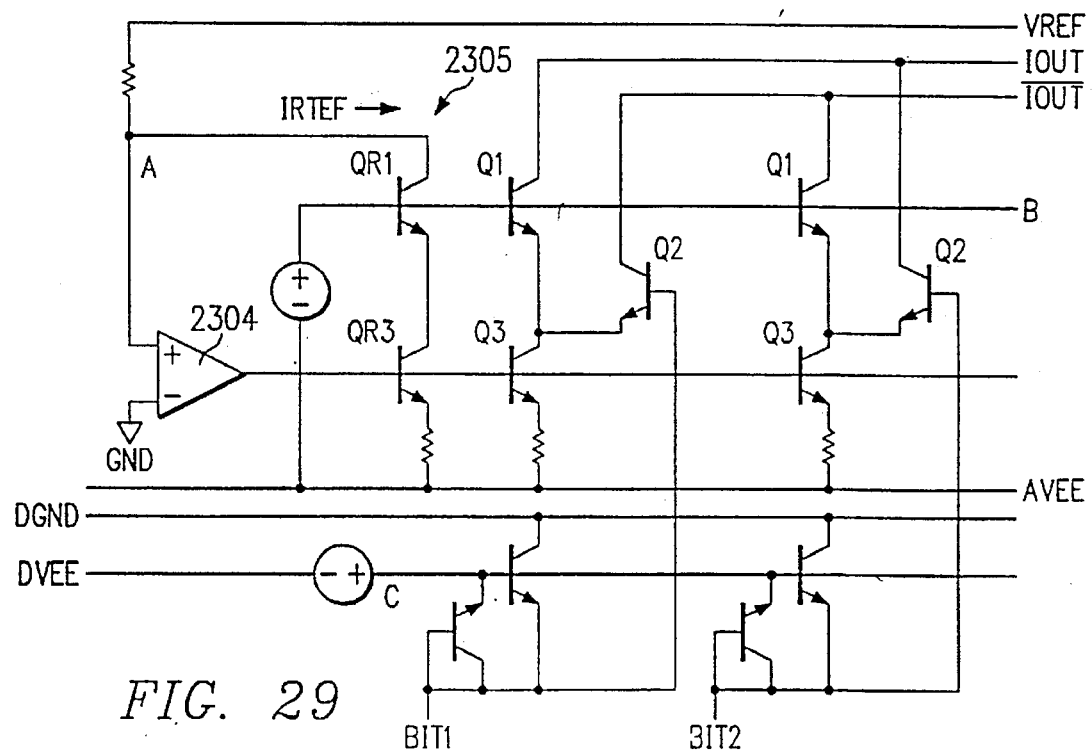

FIG. 29 shows the connection of control amplifier 2304 and reference cell 2305 to the core cells.

FIG. 30 shows override register 2320 which simply applies 1000000 to interface 2310 when the SWITCH signal is low and passes A1 A2 ... A7 from MSB Latch 308 to interface 2310 when the SWITCH signal is high. This control by the SWITCH signal has the advantages of (1) applying all bits A1 A2 ... A7 simultaneously to the current switches so that DAC 310 settles directly toward its final output current rather than hunting as when currents are switched sequentially; and (2) the 1000000 input holds the output of DAC 310 to its midrange 0 current, which minimizes the maximum output current change when switched to pass A1 A2 ... A7. The falling edge of FLASH1 drives the SWITCH signal high, so A1 A2 ... A7 pass to drive the DAC core current switches and begin the settling of the DAC output current to $V_{rq}/R$. The SWITCH signal returns low on the rising edge of the ACQUIRE signal which follows the FLASH2 signal by about 30 nsec. SWITCH going low throws analog switch 334 to disconnect the output of error amplifier 312 from the input of flash converter 306 and reconnect sample and hold 304. Thus the output of DAC 310 settling back to 0 does not create any noise for the second step conversion. The settling precedes a first flash conversion in a second sample of $V_{in}(t)$ by enough time to ready DAC 310 for another conversion. DAC 310 takes about 35 nsec to settle to 14-bit accuracy. The linearity of DAC 310 depends primarily upon (1) the Early voltage magnitude and matching among the NPNs used in the current switching cells, (2) the current gain and matching among the same NPNs, and (3) the quality of the NiCr film used for the resistors in the cells.

Error Amplifier

Error amplifier 312 includes two serially-connected gain amplifiers with the first amplifier providing a gain of 4 and the second a gain of 8 for an overall gain of 32. FIG. 31 illustrates the connections of the two gain amplifiers 3100 and 3101 with feedback resistor ratios setting the gains. DAC 310 absorbs current Io to subtract $V_{rq}$, the reconstructed quantized version of $V_{in}$, from $V_{in}$ supplied by sample and hold 304. That is, sample and hold 304 supplies a current of $V_{in}/R$ to the virtual ground at the inverting input of amplifier 3100; and DAC 310 absorbs the current to equal to $V_{rq}/R$. Thus the voltage at node 3110 is $-4(V_{in}-V_{rq})$. R is about 400Ω.

Gain amplifier 3100 (and gain amplifier 3101) has a two gain-stage folded cascode design. The output stage includes level shifting and a modest gain. The input stage develops most of the gain in order to maintain a high bandwidth while minimizing error sources. The input stage is a precision stage with low input bias currents and quad cross-coupled input NPN devices. Parallel clamping input stage protects amplifier 3100 during overdrive conditions; such as when $V_{in}$ appears at the inverting input without any offsetting current from DAC 310.

FIG. 32 shows gain amplifier 3100 in block form, and FIGS. 33a–d show it in schematic circuit form. Amplifier 3100 includes: bipolar differential input stage 3210; CMOS differential input/clamp stage 3220; differential to single ended stage 3230 which combines bipolar and CMOS devices; output stage 3240; and overdrive protection switches 3250. In a more general configuration CMOS differential stage 3220 could have its inputs connected to the inputs of the bipolar differential input stage to create a two channel amplifier with differing input gain stages selectable by switches 3250.

Normal operation of amplifier 3100 has switch 3252 closed and bipolar stage 3210 fully biased and in complete control over the output; switch 3251 is open to completely debias CMOS stage 3220 which then lacks any control over the output. In contrast, clamp operation of amplifier 3100 has switch 3252 open to force bipolar stage 3210 to operate at very low bias current supplied by source 3253 and exert limited control over the output. Operation of bipolar stage 3210 at very low current rather than turning it totally off permits rapid energization when switching from clamp operation to normal operation. Also clamp operation has switch 3251 closed to energize CMOS stage 3220 which takes control of the output. Feedback resistors 3261–3262 and the potential applied to resistor 3262 (ground in FIG. 32) determine the clamp operation output voltage (0 volts).

CMOS devices are utilized both to provide matched biasing currents and to sense voltages; this avoids base current errors of bipolar bias and sense circuits and avoids corruption of the matched currents. Exploiting CMOS produces excellent input characteristics like low offset voltage temperature coefficient and low input current and boosts open loop gain. Speed is the most critical requirement of amplifier 3100; and the NPN devices have a cutoff frequency of at least 3 GHz. High beta NPNs are used to meet the input bias current conditions. Stacked PMOS devices are used to produce high impedances to achieve large open loop gain in the first stage.

Figure 33A:
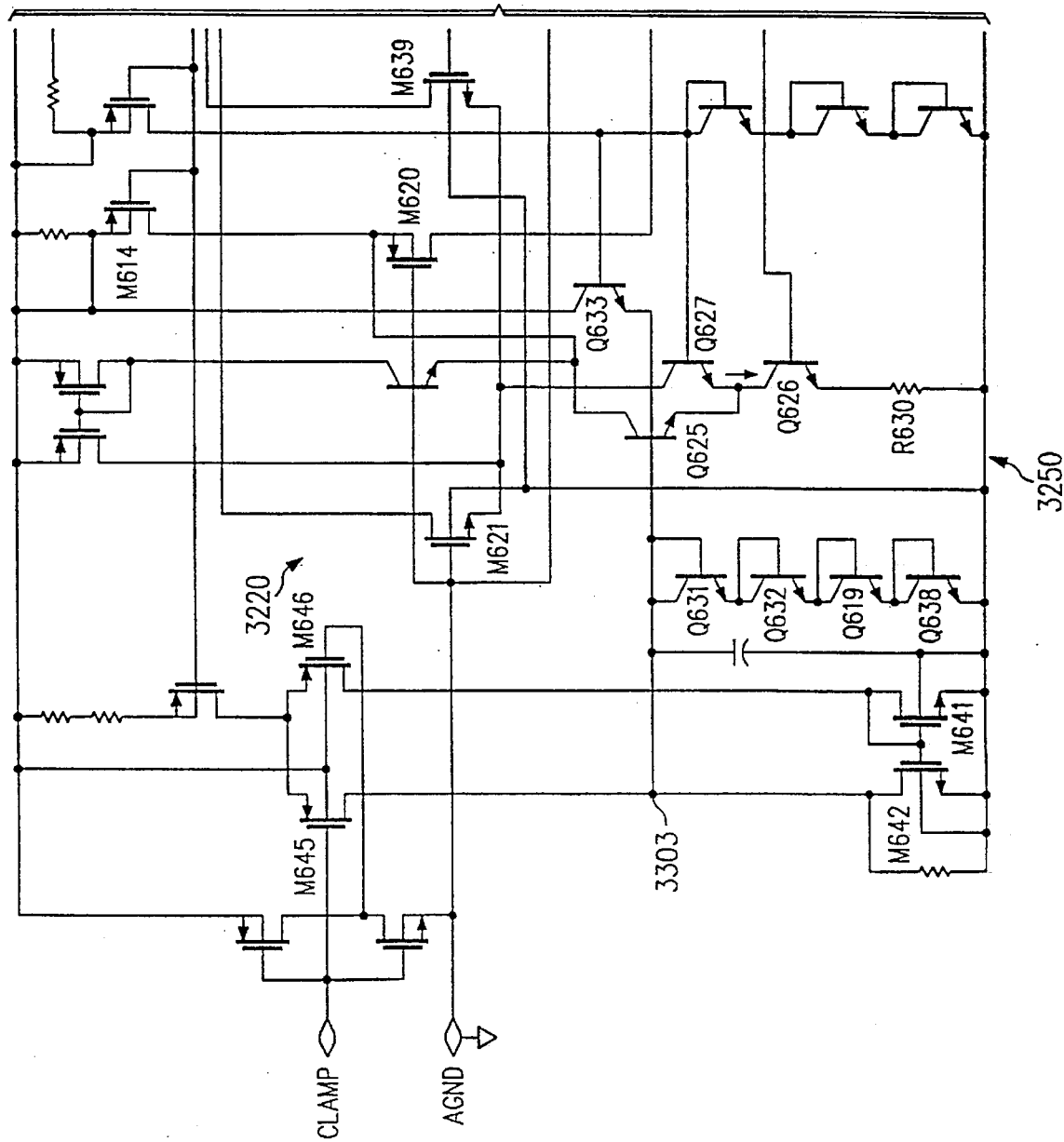
Figure 33B:
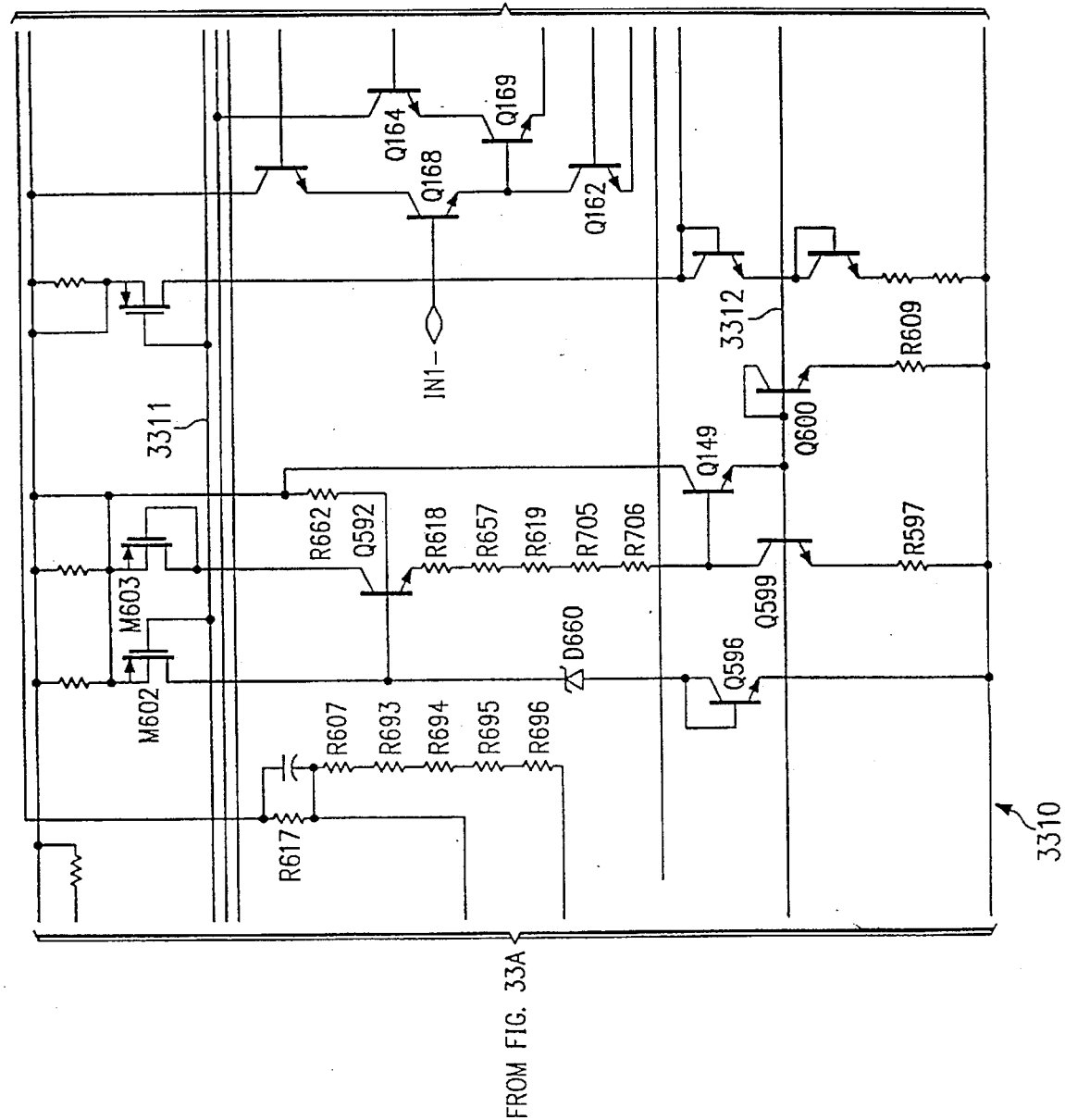
Figure 33C:
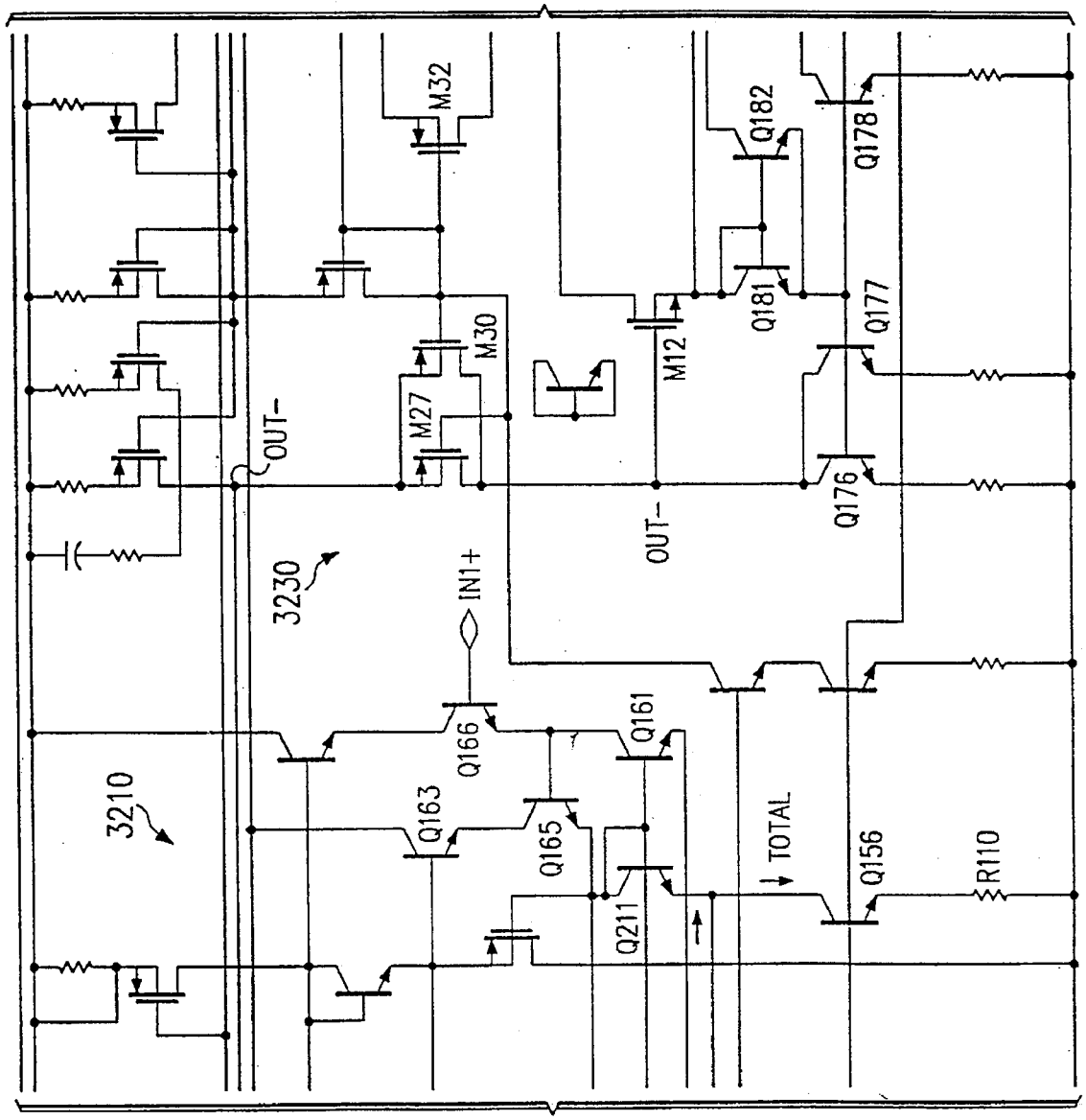

FIGS. 33a–d schematically show amplifier 3100 with CMOS stage 3220 and switches 3250 in FIG. 33a. Zener based bias circuit 3310 in FIG. 33b, bipolar input stage 3210 in FIGS. 33b–c, differential to single ended stage 3230 in FIGS. 33c–d, and output stage 3240 in FIG. 33d. Bias circuit 3310 uses Zener diode D660 and forward biased NPN diode Q596 and diffused resistor R662 to achieve a temperature stable bias for NPN Q592. NPN Q592 provides a reference current through resistors R618, R657, R619, R705, R706 to a current mirror made of NPNs Q149, Q599, and Q600 plus resistors R597 and R609 and an NPN base bias on line 3312 for other current sources in amplifier 3100. PMOS M602–M603 also mirror the current to provide a PMOS bias on line 3311 for other current sources in amplifier 3100.

The bipolar input stage 3210 includes differential input NPN emitter followers Q166 and Q168 driving NPN emitter coupled pair Q165–Q169 with NPNs Q211, Q162 and Q161 connecting them to NPN current source Q156 plus resistor R110. Note that the noninverting input (base of NPN Q166) connects to ground through RX (see FIG. 31) and that the inverting input (base of NPN Q168) connects to the output of DAC 310. Each of the inputs can vary between −2.5 volts and +2.5 volts, but during amplification of the quantization error the magnitude of the input difference should be less than 40 mV. However, when DAC 310 is held at a 0 current output, the magnitude of the input difference could be up to 2.5 volts, and CMOS differential input stage 3220 provides protection during such overdrive, as described below. The power rails Vee and Vcc for input stage 3210 are at −5 volts and +5 volts.

The differential output signals from stage 3210 pass through NPN shielding devices Q163 and Q164 to differential-to-singled-ended stage 3230. Stage 3230 has cascoded PMOS M27 and M30–M32 and a pair of voltage followers and a current mirror for conversion to a single-ended output to drive output stage 3240. One voltage follower is for the load current mirror and the other is to drive output stage 3240. The voltage followers are basically made of NMOS M12, NPN Q181, and NPN Q182 for the current mirror and of NMOS M11, NPN Q184, and NPN Q183 to drive output stage 3240. Output stage 3240 includes NPNs Q191, Q192, and Q193. Any current and voltage mismatches between these two voltage followers will generate error currents causing degradation of open loop voltage gain, offset voltage, and offset voltage temperature coefficient. Ideal voltage followers have 0 input current and maintain equivalent collector-to-base voltage drops for current mirror devices Q176, Q177, Q178, and Q179 while contributing minimal phase shift.

Figure 34:
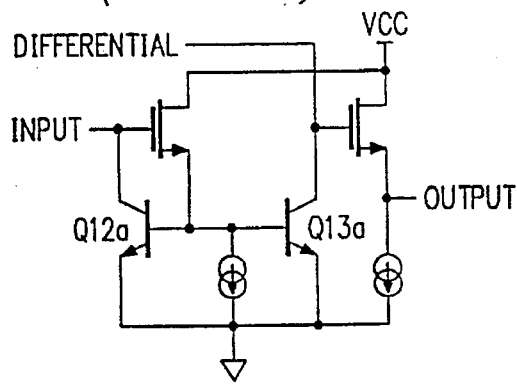
Figure 35:
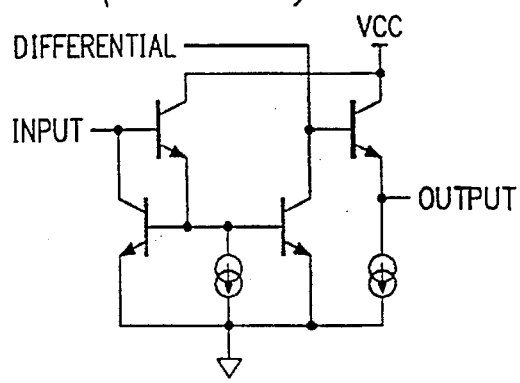

FIG. 34 shows a standard voltage follower based upon MOS devices for very high input impedance. Such followers have poor Vgs matches which cause Vcb mismatch between the NPN mirror devices Q12a and Q13a. This generates error currents and degrades performance. FIG. 35 shows a standard voltage follower formed with bipolar devices to provide a good voltage match. Such followers have relatively low input impedance. The mismatch of the base currents produces an error current that degrades performance. The two separate current sources for each of the followers in FIGS. 34 and 35 also leads to a source of mismatch and performance degradation.

Figure 36:
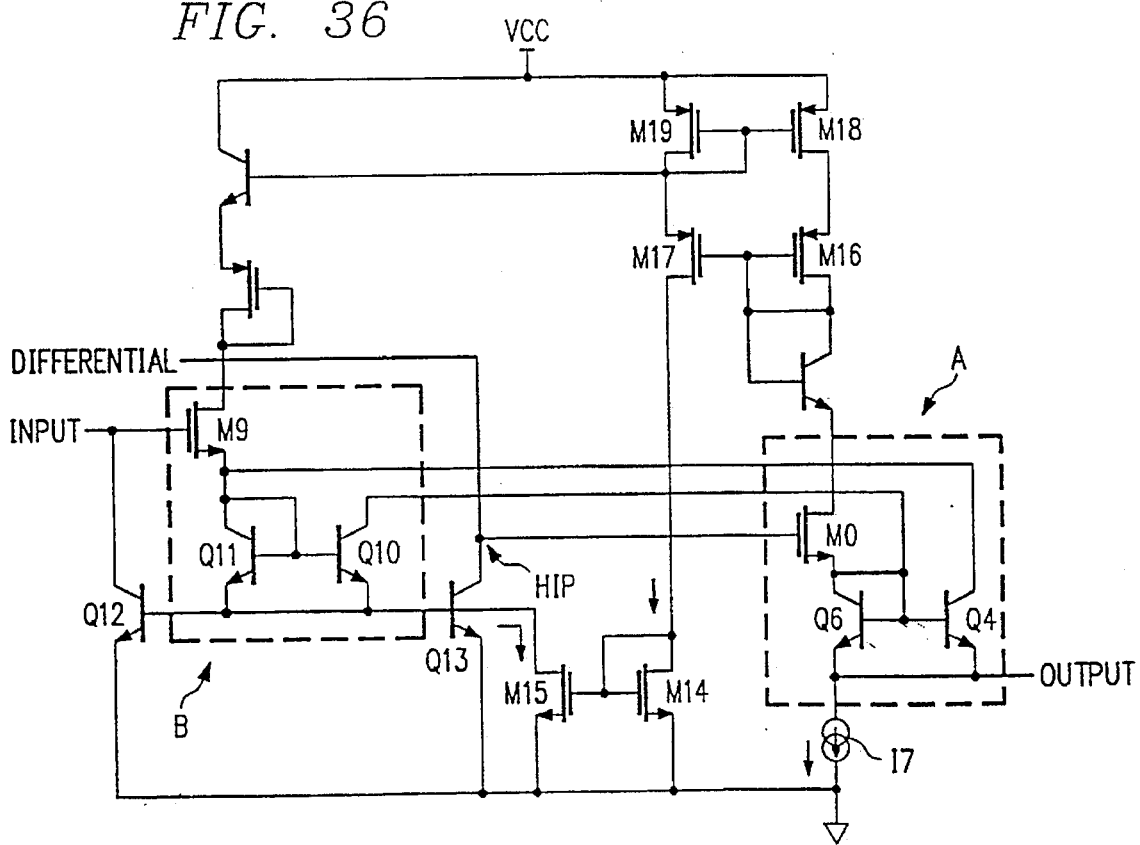

The voltage followers of amplifier 3100 (FIGS. 33c–d), shown in a simplified form in FIG. 36, are called composite voltage followers (CVF) due to the combination of both MOS and bipolar devices. This arrangement benefits from the high input impedance of the MOS devices (M0 and M9) while the cross-coupled bipolars (Q4, Q6, Q10, and Q11) improve the match of the followers beyond that obtainable with MOS devices alone. This improvement works for both DC and transient signal conditions. Improvement in match between the MOS M0 and M9 devices is partially accomplished by providing matched currents to the MOS devices. These currents match under both DC and transient signal conditions. Because the MOS devices have ~0 input current, no error currents are generated at the differential to single-ended conversion point, labelled HIP in FIG. 36. This results in improvements in open loop gain, offset voltage, and offset voltage temperature coefficient over that obtainable using only bipolar transistors. Match of the followers is improved by the use of one current source to bias both transistors, with further improvement due to the cross-coupled bipolars biasing the NMOS followers. One of the followers (A) feeds the signal from the High Impedance Point (HIP) to the output stage, the second follower (B) is required as a voltage clamp in the current mirror (Q12 and Q13). DC bias current for both followers is provided by current source I7. No special restrictions are placed on the actual implementation of I7. An NPN or NMOS device is sufficient. The implementation in FIGS. 33c–d uses an NPN as the negative bias current rail for amplifier 3100 NPN current sources.

The CVF of FIG. 36 operates as follows. The current from I7 is divided by NPN devices Q4 and Q6. Although this application has the current equally split between these two devices, other applications may find advantages in another ratio. Device Q4 provides half of the NMOS M9 operating current, while Q6 provides half of the NMOS M0 operating current. The other half of the M9 current comes from NPN Q11, and the other half of the M0 current comes from NPN Q10. This cross-coupling of bias for the NMOS followers provides an improved operating point match for the NMOS followers M0 and M9 and the current mirror devices Q12 and Q13. This leads to better open loop voltage gain, offset voltage, and offset voltage temperature coefficient performance of amplifier 3100. The bias current division function of the cross-coupled bipolar devices (that results in an improved amplifier) also divides the load current of both followers. Half of the OUTPUT load current comes from M9 through Q4, with the other half from M0 through Q6. The base current of the current mirror devices Q12 and Q13 load both followers in a similar way. Half of this load current comes from M0 through Q10 and half from M9 through Q11. This sharing of load currents between the followers insures that the Composite Voltage Followers maintain identical operating points leading to better match and an improved amplifier. The PMOS current mirror (M16–M19) and NMOS current mirror (M14–M15) close the loop around the Composite Voltage Followers. The drain current of M0 is exactly duplicated as the drain current of M15 (applies to DC and Transient current). The drain current of M0 (M15) is composed of:

$$I7/2 + Iout/2 + (IbQ12 + IbQ13)/2 + IdM15/2 = IdM0$$

The drain current IdM9 of M9 is composed of:

$$I7/2 + Iout/2 + (IbQ12 + IbQ13)/2 + IdM15/2 = IdM9$$

The end result is (as desired): IdM0=IdM9

The operating currents of the NMOS followers match perfectly due to the cross-coupling of the NPNs (Q4,Q6, Q10,Q11) and the mirroring of M0's drain current to M15's drain. The dividing action of the cross-coupled devices along with the mirroring of M0's drain current insure that M0 and M9 see the same load. This applies to both DC and transient conditions.

Both NMOS followers see the same transients. This improves the settling time because the CVF presents a symmetric load to the mirror devices Q12 and Q13. Any asymmetry would cause undesirable ringing in the settling waveform. Any transient voltage or current at the HIP would be mirrored over to the other input device, but symmetry will lead to less ringing.

Figure 37A:
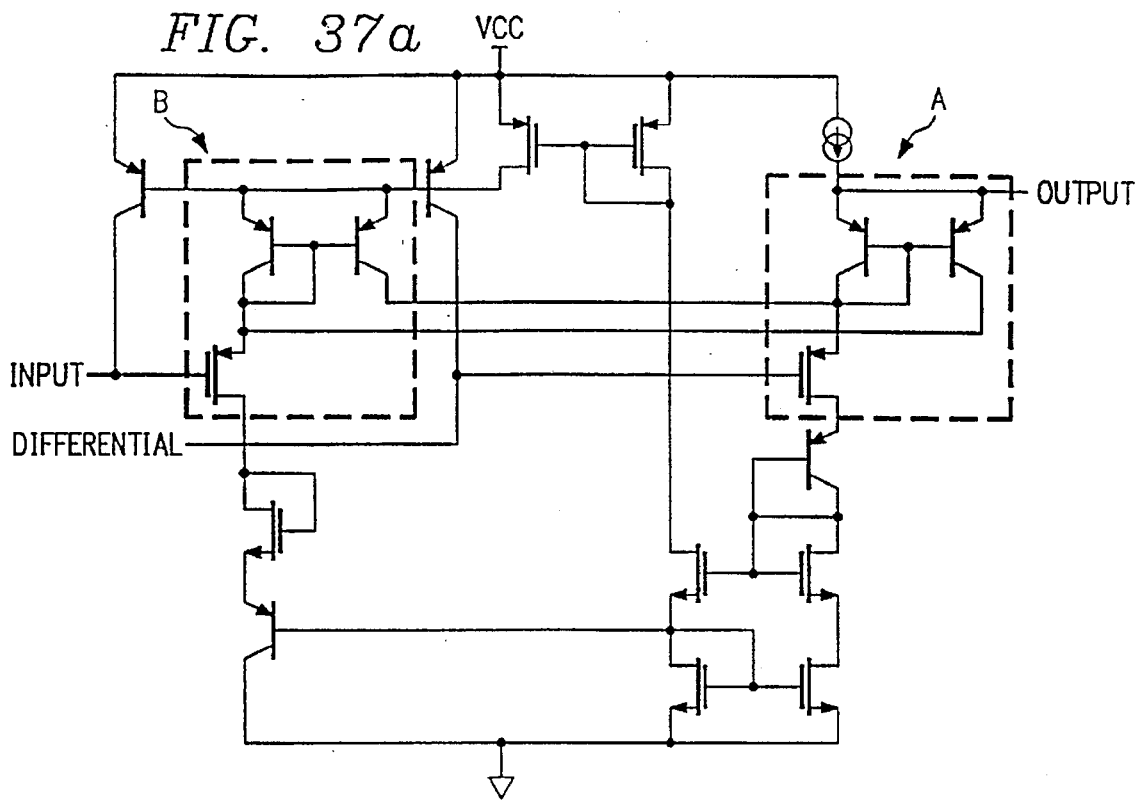
Figure 37B:
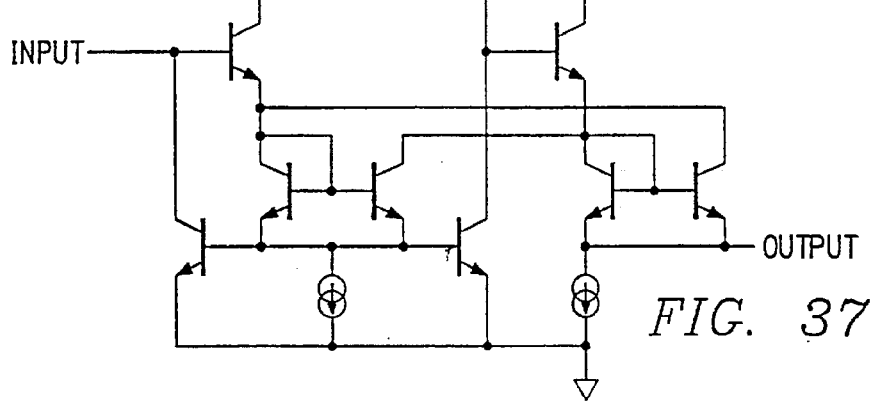
Figure 37C:
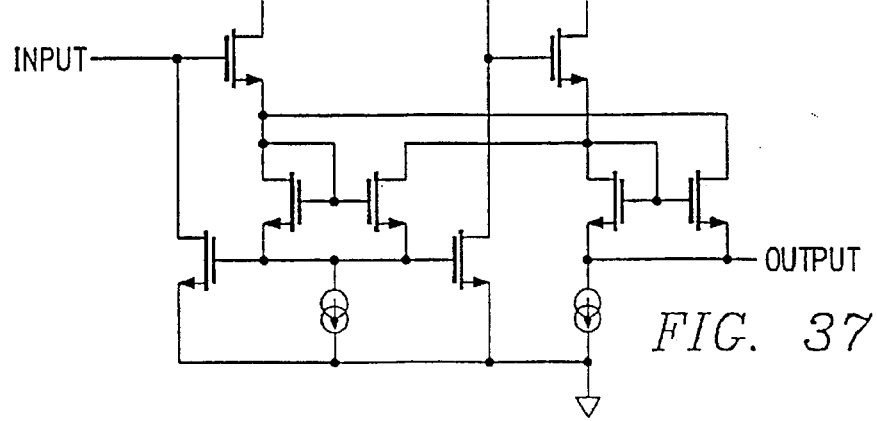

FIG. 37a shows a PNP version of the Composite Voltage Follower and FIGS. 37b–c show all NPN and all NMOS versions. In particular, the all NPN version of FIG. 37b has the same cross coupling and consequent symmetry but will not have the high input impedance of the CVF of FIGS. 36 and 37a. The all NMOS version of FIG. 37c will not have the high speed of the CVF of FIGS. 36 and 37a. Also, in all of the CVFs the ratio of current division by the cross coupling could be changed by ratioing the emitter areas or gate widths of the cross-coupling devices.

Figure 33D:
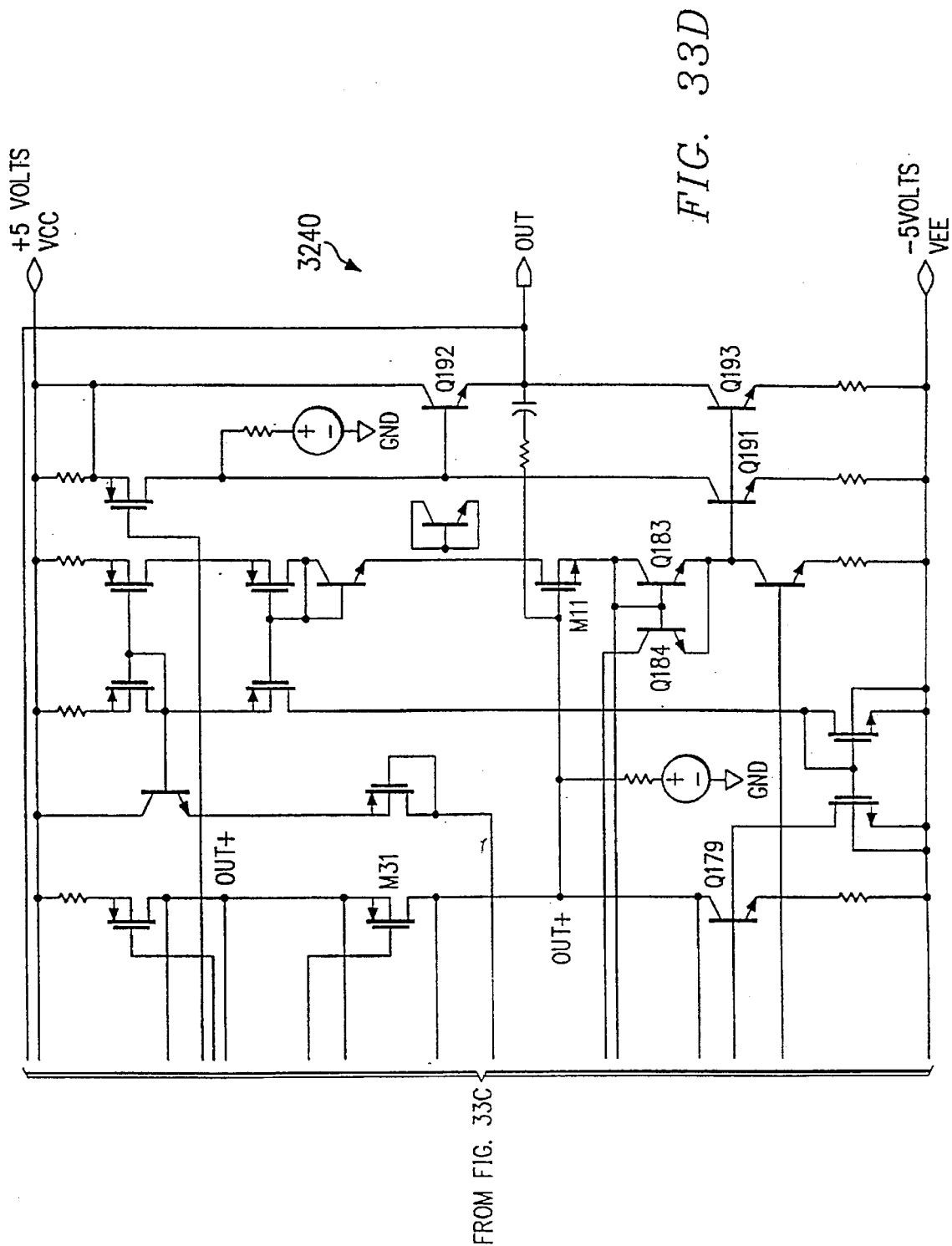

As shown in FIGS. 33, the output of the Composite Voltage Follower drives the bases of NPNs Q191 and Q193 in output stage 3240 in the lower righthand portion of FIG. 33d. The output terminal Out of output stage 3240 feeds back to CMOS stage 3220. Resistor 3261 of FIG. 32 corresponds to R167 in FIG. 33b, and resistor 3262 of FIG. 32 corresponds to the series resistors R607, R693, R694, R695, and R696. CMOS stage 3220 has as inputs differential NMOS pair M621 and M639 tied to NPN current source Q627 and Q626 plus resistor R630 of FIG. 33a. The differential outputs of the NMOS pair connect to the differential outputs of bipolar stage 3210 at cascode PMOS M27, M30, M31, and M32.

The clamp terminal in FIG. 32 corresponds to the Clamp terminal at the lefthand edge of FIG. 33a. Switches 3251 and 3252 of FIG. 32 are implemented primarily by NPN Q625 driven by differential PMOS pair M645–M646 with current mirror load of NMOS M641–M642 in FIG. 33a. In particular, a low (ground) signal at terminal Clamp turns on M645, turns off M646, and pulls node 3303 up to about –2.2 volts (at room temperature) because the diode stack NPNs Q631, Q632, Q619, and Q638 limits anything higher. This turns on NPN Q625 and thus steers the current supplied by PMOS current source M614 away from PMOS M620 and into NPN current source Q626. With no current supplied by M620, all of the current for NPN source Q156 (FIG. 33c) comes from the bipolar differential pairs and puts bipolar stage 3210 into maximum gain condition. Also, Q625 supplying the current to source Q626 implies Q627 turns off and inactivates CMOS differential pair M621-M639, so CMOS stage 3250 presents high impedance outputs.

Conversely, a high (+5 volts) signal at terminal Clamp turns on M646, turns off M645, and pulls node 3303 down to about −3.6 volts (because the base of NPN Q633 is at about −2.9 volts) which turns off NPN Q625 and thus steers the current supplied by PMOS M614 into PMOS M620 and then into NPN current source Q156. Supplying this current to Q156 leaves only a small trickle current to be drawn from the bipolar differential pairs, and bipolar stage 3210 remains active but with very small gain. With Q625 turned off, NPN Q627 supplies the current from source Q626 to NMOS pair M621, M639. The output of the NMOS pair will overpower that of the reduced gain bipolar stage 3210, and the resistor feedback from Out to the NMOS pair will hold amplifier 3100 at a 0 volt output. CMOS stage 3220 has lower transconductance than bipolar stage 3210, so the amplifier is more stable in the clamp mode.

In summary, DAC 310 and amplifier 3100 operate together as follows. Initially, a low SWITCH signal holds the input to DAC 310 at 1000 000 to thus its output at 0 current, and a low Clamp signal puts amplifier 3100 in clamp mode with CMOS stage 3220 holding the output at 0 volts despite any nonzero $V_{in}$ input from sample and hold 304. When the SWITCH signal goes high the encoded quantized version of $V_{in}$ (A7 A6 ... A1) enters DAC 310 and the output current of DAC 310 begins settling to $V_{rq}/R$ where $V_{rq}$ equals the reconstructed quantized version of $V_{in}$. At this time the inputs to bipolar stage 3210 of amplifier 3100 are ground at the noninverting input and DAC 310 output current plus $V_{in}/R$ current from sample and hold 304 at the inverting input. Amplifier 3100 remains in clamp mode for a delay period of about 10 nsec. This permits other switching noise to attenuate and the DAC 310 output current to get close to $-V_{rq}/R$ to avoid overdrive saturation of bipolar stage 3210. Then the Clamp signal goes high to disable CMOS stage 3220 and jump the gain of bipolar stage 3210. Bipolar stage 3210 then settles to its amplification of the settling quantization error. DAC 310 settles to 14-bit accuracy (0.3 mV) within about 50 nsec. The bipolar stage 3210 has a high cutoff frequency and amplifier 3100 tracks the settling quantization error. Similarly, amplifier 3101 tracks the output of amplifier 3100 so that the overall output of error amplifier 312 settles to within 4 mV of final output within 80 nsec.

Amplifier 3100 could be configured for general purpose use. The inputs to the bipolar and NMOS differential pairs could be tied together as the differential inputs, and the digital signal at terminal Clamp just a selection between the bipolar and NMOS inputs. Thus amplifier 3100 is a channel selectable amplifier with the two channels providing different performance. The bipolar channel provides high speed and low noise operation, while the CMOS channel provides high input impedance.

LSB Latch

LSB latch 314 is a set of seven standard latches, 314-1 through 314-7 indicated in FIG. 9, which are clocked to load the outputs of translators 908-1 through 908-7 at the falling edge of the FLASH2 clock. The falling edge also cuts off the current to latches 1030 and reapplies current to the differential pairs 1021-1022 in comparator cells 902, and so prepares flash converter 308 for another conversion. The outputs are called C1, C2, ... C7.

Subtractor

Subtractor 316 is simply a binary adder that subtracts 0000 010 from A7 A6 ... A1 by adding the two's complement of 0000 010, namely 1111 110, to A7 A6 ... A1 and calling the result B12 B11 ... B6. The carry bit is called CR1:

```
    A7  A6  A5  A4  A3  A2  A1
+    1   1   1   1   1   1   0
CR1 B12 B11 B10 B9  B8  B7  B6
```

Subtracting 0000 010 compensates for the 1000 000 output of flash converter 306 with a 0 volt input during the second flash conversion to create the least significant bits. A more detailed explanation appears in the discription of error correction block 318. Subtractor 316 performs the substraction within about 6 nsec, and during this time DAC 310 has begun to settle to its $V_{rq}/R$ output current, but error amplifier 312 remains clamped.

Error Correction

Figure 38:
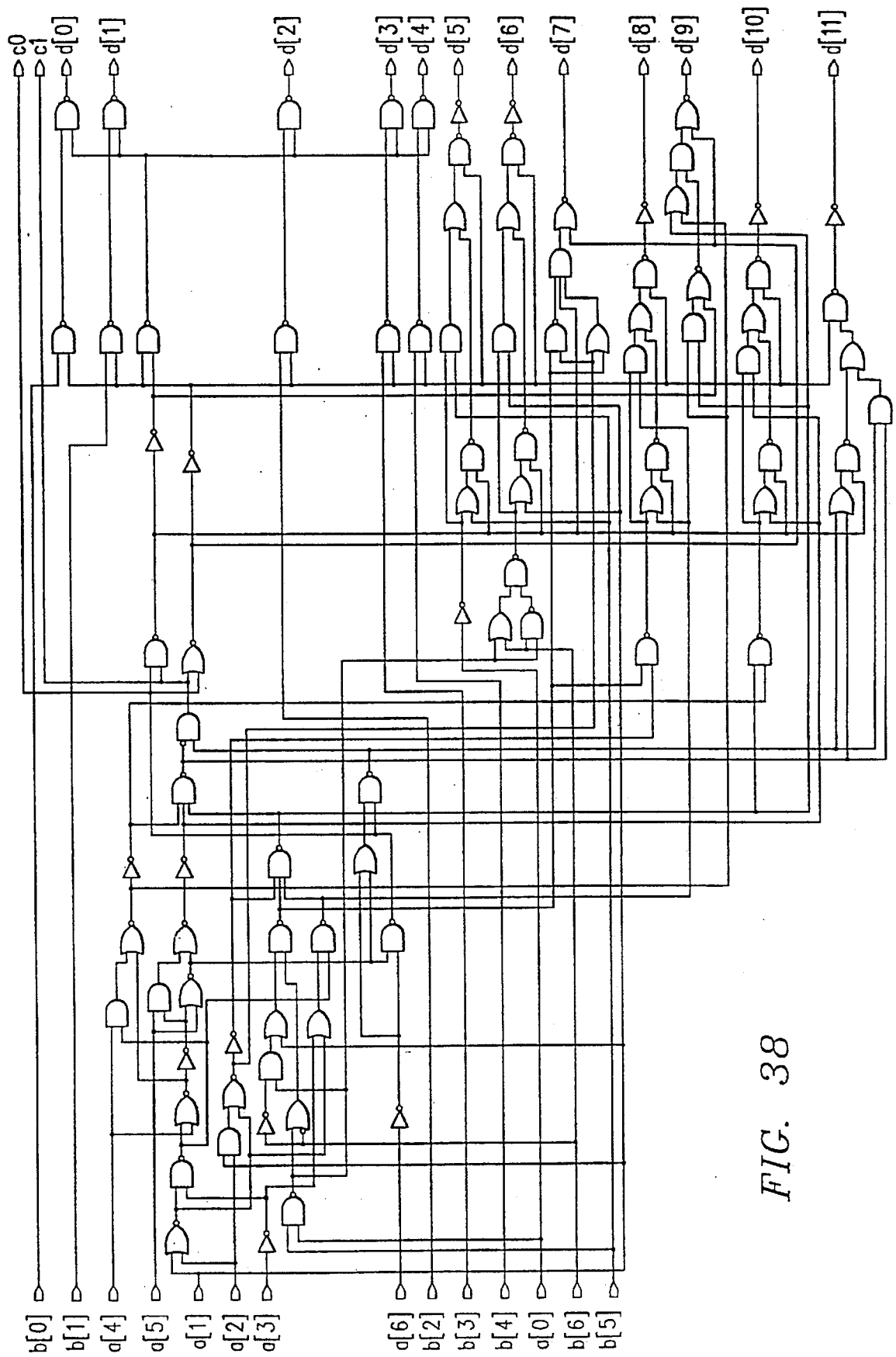
FIGS. 38–39 show aspects of the error correction of the preferred embodiment.
Figure 39:
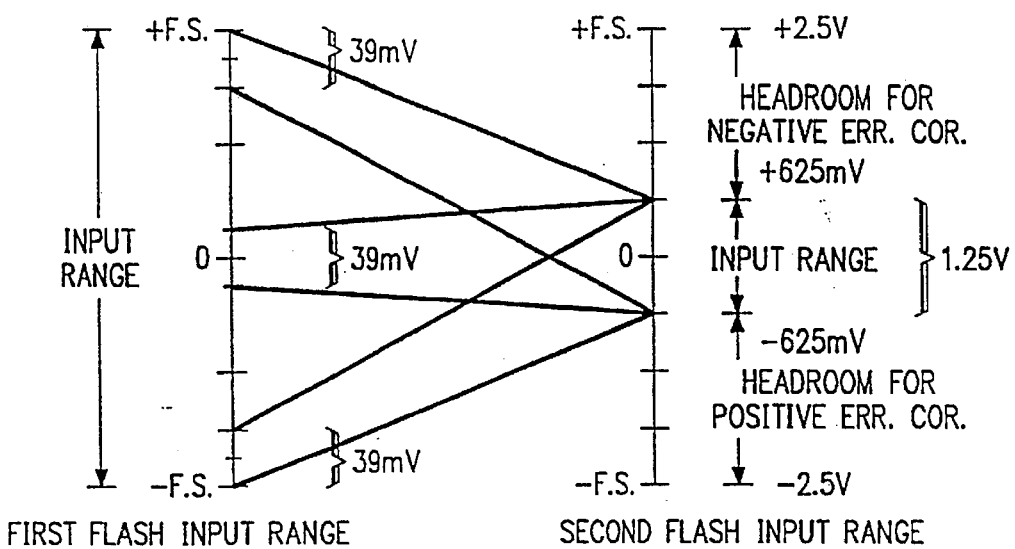

FIG. 38 schematically shows the circuitry of error correction block 318. This logic implements part of the following procedure and many other implementations also exist and can be automatically generated by logic design programs. A7 A6 A5 ... A1 denotes the output of flash converter 306 on the first conversion of input $V_{in}$ and held in MSB latch 308; that is, A7 A6 ... A1 is the binary coding of the quantized version $V_q$ of $V_{in}$ with quantization levels spaced 39.0625 mV and with $V_{in}$ equal to 0 volts ideally yielding A7 A6 ... A1 equal to 1000 000 due to the bipolar input range. DAC 310 reconstructs the quantized version $V_q$ of $V_{in}$ from the binary code; call this $V_{rq}$. Thus, ideally, $V_{in}$ and $V_{rq}$ only differ by at most 19.53125 mV (one half of a 39.0625 mV quantization level). Error amplifier 312 outputs $32(V_{in}-V_{rq})$ and this ideally falls in the range of −0.625 V to +0.625 V and leaves room for error as will be described below. FIG. 39 heuristically illustrates how $V_{in}$ within a quantization level will lead to $32(V_{in}-V_{rq})$ within the −0.625 to +0.625 volt range for the second conversion. Flash converter 306 converts $32(V_{in}-V_{rq})$ to C7 C6 ... C1 which LSB latch 314 stores. Due to the amplification by 32, the quantization level separation of 39.0625 mV on the second conversion corresponds to a 1.22 mV level in $V_{in}-V_{rq}$. Again, if $V_{in}-V_{rq}$ is 0, then C7 C6 ... C1 equals 100 0000.

Subtractor 216 subtracts 0000 010 from A7 A6 ... A1 and the result is termed B12 B11 ... B6 with the carry termed CR1; the carry term results from the subtraction being performed by addition of the two's complement of 0000 010, namely 1111 110. Thus $V_{in}$ equal to 0 would ideally have B12 B11 ... B6 equal to 0111 110 and CR1 equal to 1. This subtraction of 0000 010 compensates for C7 C6 being 10 when the quantization error $V_{in}-V_{rq}$ equals 0. Error correction block 318 (FIG. 38) adds C7 C6 to B12 B11 ... B7 B6 to yield D12 D11 ... D7 D6 and with carry called CR2:

```
    B12 B11 B10 B9  B8  B7  B6
+                       C7  C6
CR2 D12 D11 D10 D9  D8  D7  D6
```

Lastly, the final output by output buffer 320 will be D12 D11 ... D1 wherein D5=C5, D4=C4, D3=C3, D2=C2, and D1=C1. Also, the exclusive OR of CR1 and CR2 outputs as OR (overrange).

To clarify the foregoing, consider an example in the ideal case of errorless devices. Let $V_{in}$ be +1.1000 volts. First, 1.074 volts is the highest quantization level which does not exceed +1.1000 volts; thus flash converter 306 will output 1011 100 because 11 100 is binary for 28 and 28 times 39.0625 mV equals 1.09375 volts which is the midpoint between the quantization levels for codes 28 and 29. The leading 1 in the 1011 100 output just represents the fact that $V_{in}$ is positive; recall that a 0 input generates a 1000 000 output and negative inputs generate leading 0 outputs. So A7 A6 . . . A1 equals 1011 100. If this were expressed in terms of a quantization with quantization levels separated by 1.22 mV (as in the final output of converter 300), then the code would simply be 1011 1000 0000 because 11 1000 0000 is binary for 28 times 32 and 28 times 32 times 1.22 mV equals 1.09375 volts.

Subtractor 316 adds 1111 110 and 1011 100 to give B12 B11 . . . B6 equal to 1011 010 with a carry to make CR1 equal to 1. Note that CR1 is always 1 unless A7 A6 . . . A1 were 0000 000 or 0000 001 which corresponds to $V_{in}$ being about −2.5 volts or out of range and below −2.5 volts.

Next, DAC 310 takes the 1011 100 input and reconstructs +1.09375 volts, the first quantized version of $V_{in}$ and previously called $V_{rq}$. Then error amplifier 312 amplifies the quantization error ($V_{in}-V_{rq}$) of +0.00625 volt by 32 to yield +0.2000 volt. Now +0.176 volt is the highest quantized level below +0.2000 volt, so flash converter 306 will convert 0.2000 to an output of 100 0101 because 101 is binary for 5 and 5 times 39.0625 mV equals 0.1953 volt which is the midpoint between the quantization levels for codes 5 and 6. Again, the leading 1 represents the fact that the input was positive. C7 C6 . . . C1 equals 100 0101. Because +0.2000 volt is 32 times +0.00625 volt and 39.0625 mV is 32 times 1.22 mV, the first quantization error ($V_{in}-V_{rq}$) itself quantizes as 00 0101 in terms of 1.22 mV separated quantization levels. Thus the 00 0101 directly added to the 1011 1000 0000 from the 1.22 mV level version of the first quantization gives the final output of 1011 1000 0101. Thus the leading 1 for a second flash conversion output must be compensated if C7 C6 . . . C1 is to be added to yield the final output. The subtraction of 01 from A7 A6 . . . A1 to form B12 B11 . . . B6 is just this compensation; furthermore the increment of the index by 5 expresses the first quantization in terms of 1.22 mV levels. Note that the maximum input to flash converter 306 on the second flash conversion is 625 mV, so the maximum output is 101 0000 with the leading 1 again indicating a positive input. This means that the most significant two bits C7 and C6 do not (with errorless devices) contain any information beyond the already-compensated sign of the first quantization error and can overlap B7 and B6. Hence, D12 D11 . . . D1 as the sum of B12 B11 . . . B6 and C7 C6 . . . C1 will be the correct result previously noted:

```
   1011 010
+   100 0101
  1011 1000 0101
``` and the carry CR2 equals 0. CR2 will always be 0 unless B12 B11 . . . B6 is 1111 111 or 1111 110 which means A7 A6 . . . A1 must have been 0000 000 or 0000 001, again $V_{in}$ was about −2.5 volts. As previously noted, CR1 is always 1, so the exclusive OR of CR1 and CR2 is 0.

The CR1 and CR2 bits provide out of range detection of $V_{in}$ as follows. If $V_{in}$ exceeds +2.5 volts, then the first flash conversion yields A7 A6 . . . A1 equal to 1111 111 and the quantization error is greater than +39.0625 mV because DAC 310 reconstructs 1111 111 as 2.4609375 volts, the highest quantization version. Hence, error amplifier 312 outputs a voltage exceeding +1.25 volts, and the second flash conversion output C7 C6 . . . C1 is at least 110 0000. Subtractor 316 computes B12 B11 . . . B6 as:

```
    1111 111
+   1111 110
  1 1111 101
```

So CR1 equals 1. Adding B12 B11 . . . B6 and C7 C6 to generate D12 D11 . . . D6:

```
    1111 101
+         11
  1 0000 000
```

And CR2 also equals 1. Thus the exclusive OR of CR1 and CR2 is 1 which indicates overflow/underflow, and D12 D11 . . . are 0's so it is an overflow.

Similarly for $V_{in}$ less than −2.5 volts: A7 A6 . . . A1 is 0000 000 and error amplifier 312 outputs a voltage less than −1.25 volts. The second flash conversion outputs at most 011 1111. Subtractor 316 computes B12 B11 . . . B6 as:

```
   0000 000
+  1111 110
   1111 110
``` and CR1 is 0. The computation of D12 D11 . . . D6:

```
   1111 110
+        01
   1111 111
``` and CR2 also is 0. Hence, the exclusive OR of CR1 and CR2 again is 1 and indicates the overflow/underflow, and D12 D11 . . . are 1's so it is an underflow.

Nonideal devices in converter 300 may lead to errors in the output, but the foregoing procedure can correct for the most common ones. In particular, the most common source of error lies in the accuracy of flash converter 306, and the headroom (see FIG. 39) available in flash converter 306 on the second flash conversion permits the correction as follows. If flash converter 306 outputs a code that is 1 LSB higher than it should be, then DAC 310 will reconstruct $V_{rq}$ that is 39.0625 mV higher than the true first quantization of $V_{in}$, and error amplifier 312 will output an amplified quantization error that is 1.25 volts lower than it should be. Thus the second quantization by flash converter 306 is one lower in C6 than it should be, and this precisely cancels the original code error of 1 LSB too high. An example will clarify:

Let $V_{in}$ be +1.1000 volts as in the previous example, then the true first quantization level is 1.074 volts and flash converter 306 should output 1011 100. But presume flash converter 306 fails to be truly linear and outputs 1011 101 for this input. Then DAC 310 will reconstruct $V_{rq}$ using the erroneous code 1011 101 and output 1.13281 volts as $V_{rq}$. Now the quantization error $V_{in}-V_{rq}$ equals −0.03281 volts rather than the +0.00625 volts that would follow from a correct code. Error amplifier then amplifies this quantization error to −1.05 volts rather than the +0.200 volts following from a correct code. Note that this falls out of the expected errorless range of −0.625 to +0.625 volt. Now flash converter 306 quantizes −1.05 volts as −1.0547 volts which is −27 times 39.0625 mV and outputs 0100101 because 100101 is the two's complement of 011011 which is binary for 27 and the leading 0 indicates a negative number. (Of course, the nonlinearity of flash converter 306 may again affect the least significant bit.) Then the computations are as follows. Substractor 316 finds B12 B11 . . . B6:

```
  1011 101
+ 1111 110
1 1011 011
```

This compares to B12 B11 . . . B6 equal to 1011 010 for the correct code case. Next, error correction 318 adds C7 C6 to find D12 D11 . . . D6:

```
  1011 011
+       01
  1011 100
``` and filling in the C5 . . . C1 yields the final output as 1011 1000 0101 which is the correct final output.

A similar correction takes place if flash converter 306 outputs a code 1 LSB too small. Again using the example of $V_{in}$ equal to +1.1000 volts: The first flash converter 306 output would incorrectly be 1011 011 and DAC 310 would reconstruct $V_{rq}$ as 1.0547 volts. Then the first quantization error ($V_{in}-V_{rq}$) would be +0.0453, and error amplifier 312 would output +1.45 volts for the second flash conversion. The second flash converter 306 output would be 110 0101 because 100101 is binary for 37 and the leading 1 indicates a positive. The computation of B12 B11 . . . B6 is:

```
  1011 011
+ 1111 110
1 1011 001
``` and the addition of C7 C6 (11) to yield D12 D11 . . . D6:

```
  1011 001
+       11
  1011 100
```

Filling in C5 . . . C1 gives a final output of 1011 1000 0101 which matches the correct output; of come, the least significant bit could be different due to the nonlinearity of flash converter 306 on the second flash conversion.

The maximum correctible error from incorrect code on the first flash conversion is 1.5 LSB because the headroom on the second flash conversion (see FIG. 39) is 1.875 volts, both for positive and negative, and this equals 32 times 1.5 times 39.0625 mV.

Overflow/Underflow

Figure 40:
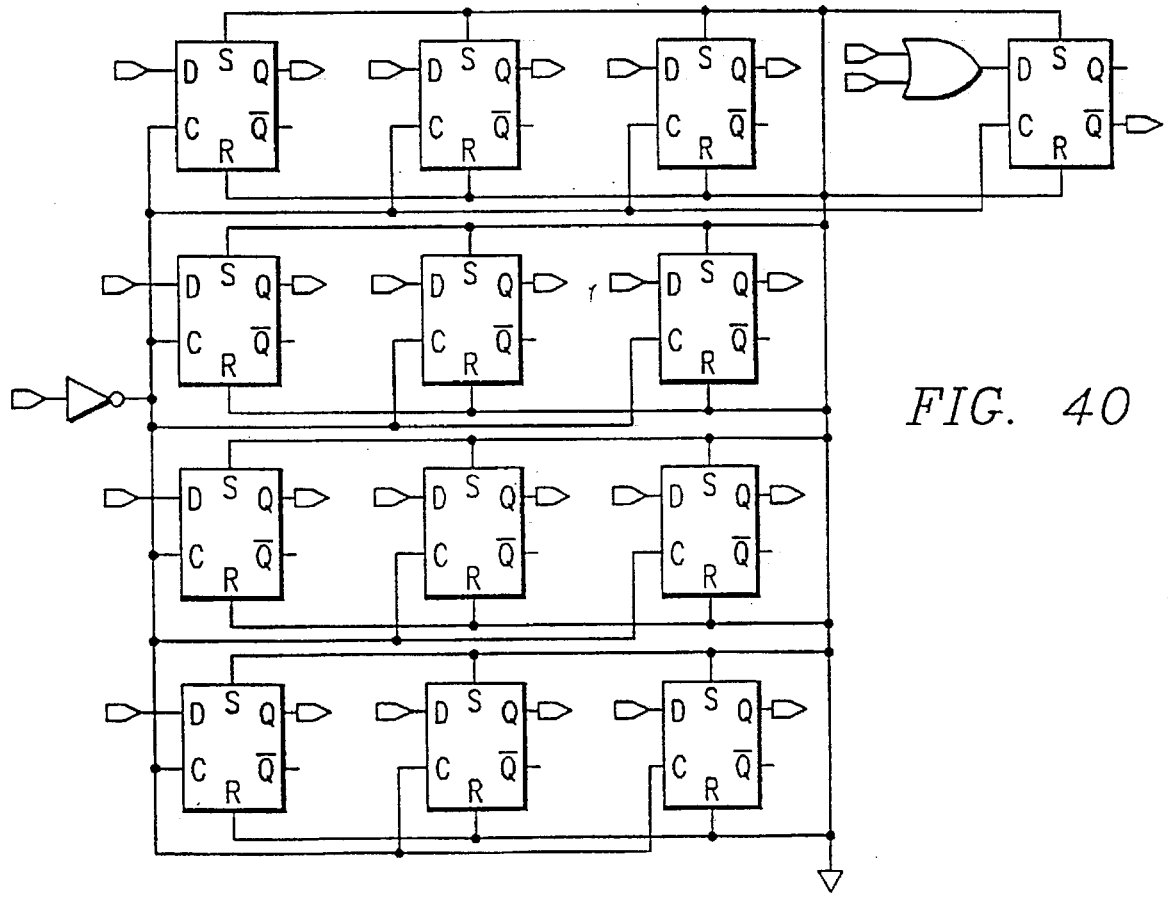

Overflow/underflow block 324 is just an exclusive OR of CR1 and CR2 as explained in the description of error correction block 318. FIG. 40 shows thirteen flip-flops for storing the seven bits D12 D11 . . . D6 from error correction block 318, the five least significant bit C5 C4 . . . C1 (D5 D4 . . . D1) from LSB latch 314, and the exclusive OR of the two carries CR1 and CR2 (upper righthand corner). The LOADOP signal clocks the flip-flops.

Output Buffer

Figure 41:
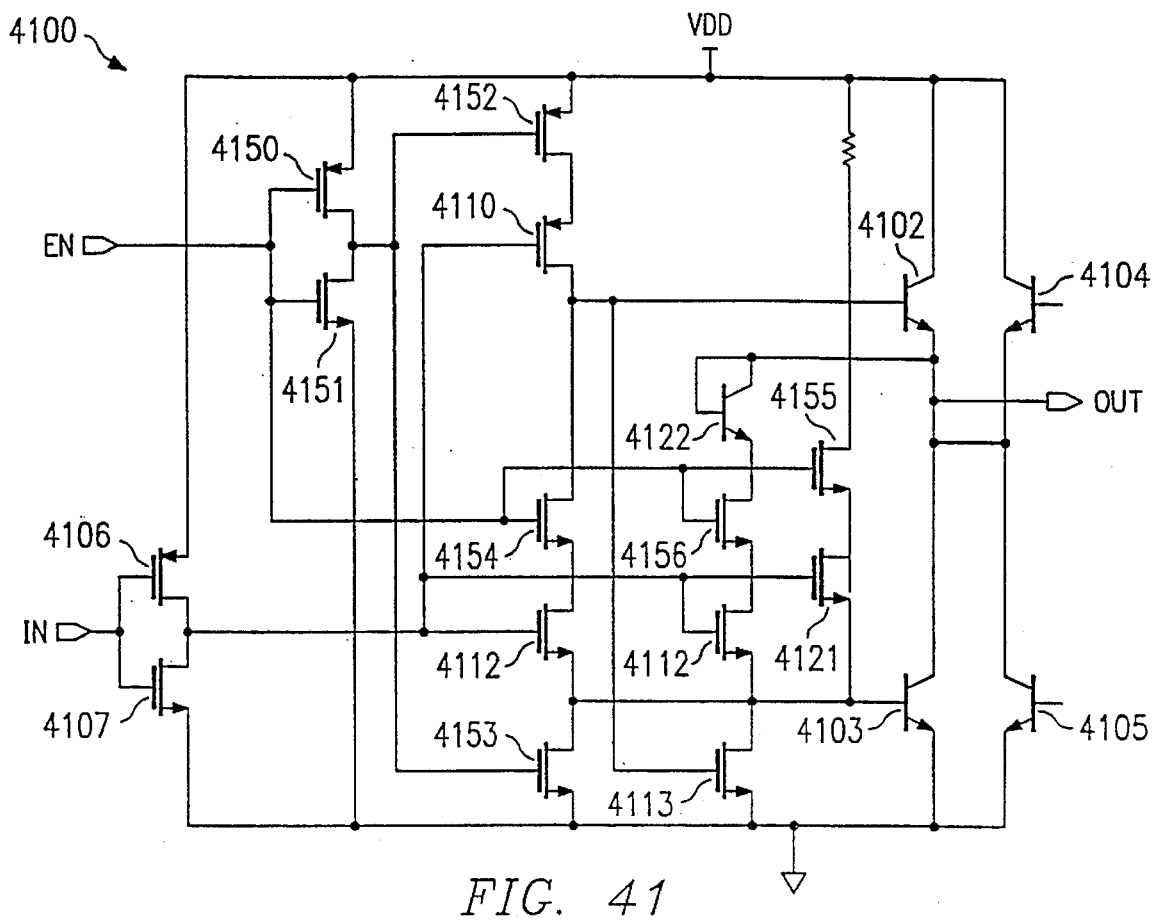
Figure 42:
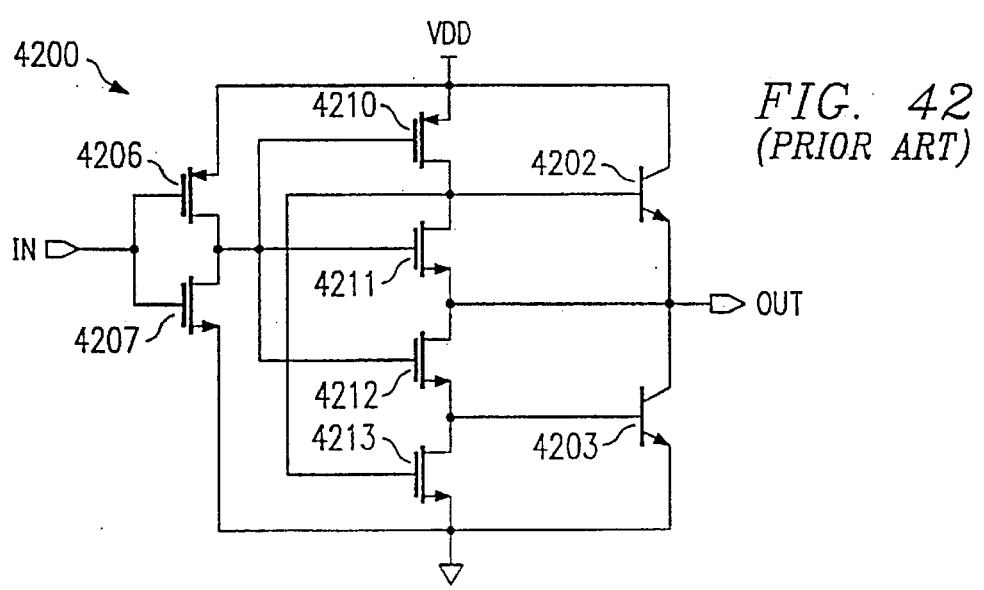
Figure 43:
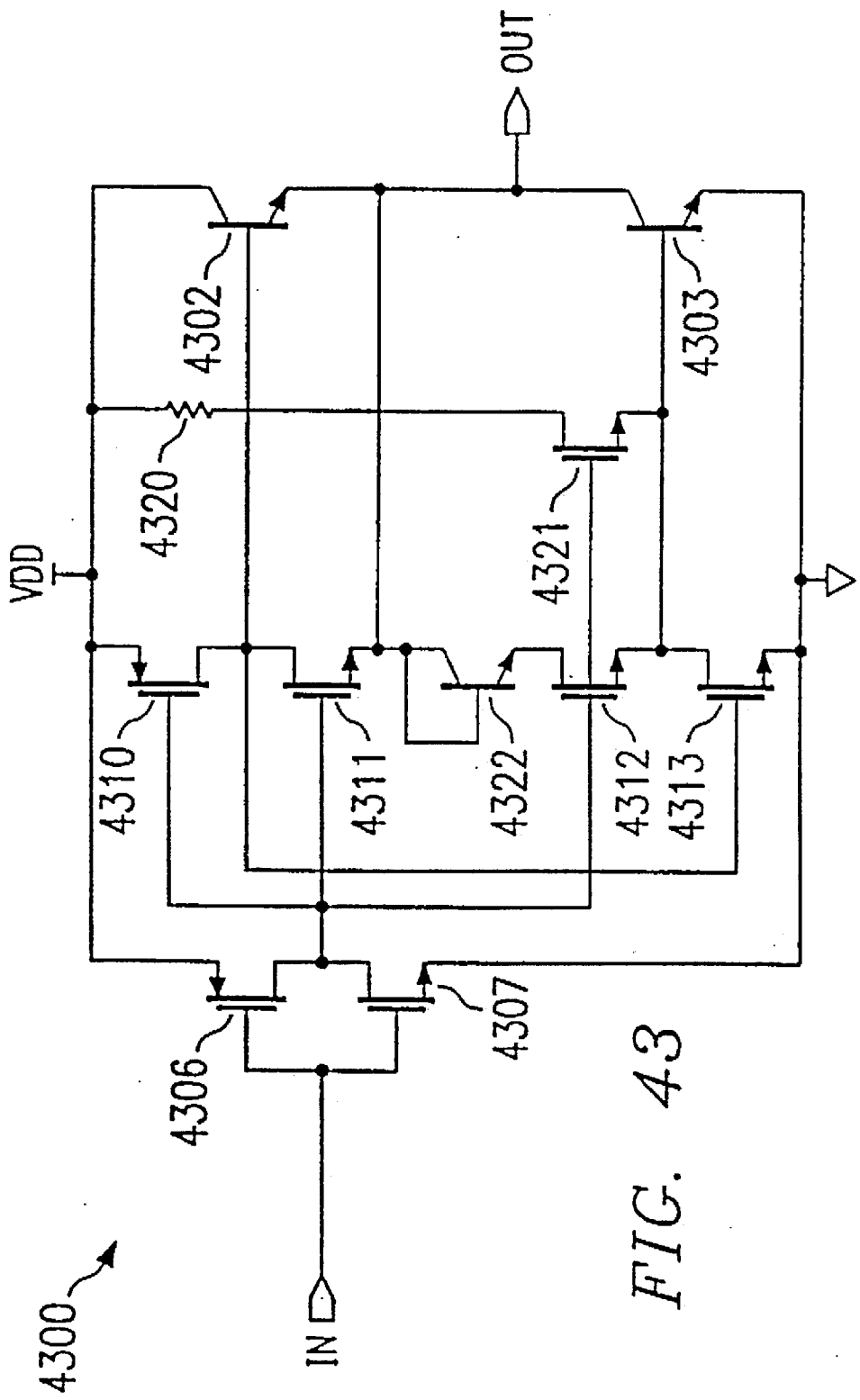

Output buffer 320 includes fourteen drivers each the same as driver 4100 shown in FIG. 41. One driver for each of outputs D12 D11 . . . D1, one for the exclusive OR output of overflow/underflow block 324, and one for the IRQ (interrupt request) signal. Driver 4100 operates with CMOS digital power levels: between +5 volts and ground. The data bits D12 D11 . . . D1 and exclusive OR output enter driver 4100 at the IN terminal and an enable signal at the EN terminal controls driver 4100. Driver 4100 provides NPN output transistors 4102–4103 to drive capacitive loads beyond the capabilities of simple CMOS drivers plus also provides a lower output voltage $V_{OL}$ than prior art BiCMOS driver 4200 shown in FIG. 42. In particular, the simple driver of 4200 cannot achieve low $V_{OL}$ levels, such as less than 0.4 volts, especially at low temperatures, due to the base emitter drop of NPN 4203 when it is on and pulling the output low. FIG. 43 shows driver 4300 which is a version of driver 4100 simplified by the removal of the enable circuitry (NMOS 4150–4156) and the ESD protection NPNs 4104–4105.

Prior an driver 4200 operates as follows: a high input at IN inverts through CMOS inverter 4206–4207 to a low and thus turns on PMOS 4210 and turns off the NMOS 4211–4212. PMOS 4210 on drives the base of NPN 4202 high to turn on NPN 4202 and pull up output terminal OUT. The PMOS 4210 on also pulls up the gate of NMOS 4213 which turns on NMOS 4213 to pull the base of NPN 4203 to ground and keep NPN 4203 off. NMOS 4211–4212 off isolate output terminal OUT from the bases of NPNs 4202–4203; and OUT is high. Conversely, a low at input IN inverts through CMOS inverter 4206–4207 to a high that turns off PMOS 4210 and turns on NMOS 4211–4212. NMOS 4212 on connects the base and collector of NPN 4203 together to form a diode and pull OUT down to about 0.7 volts but no lower: this is the $V_{OL}$ problem. During switching, the base charge must be rapidly removed to avoid delays, and NMOS 4211–4213 accomplish this.

Drivers 4100 and 4300 include the same devices as driver 4200 but have additional circuitry to generate a low output $V_{OL}$ lower than 0.7 volts by enhanced driving of the base of output NPN 4303. In particular, NMOS 4321 and resistor 4320, in addition to the diode connection through NMOS 4312 (plus diode 4322), drive the base of NPN 4303. Driven 4100 and 4300 operate as follows. A high input at IN will invert and turn on PMOS 4310 to drive the base of NPN 4302 and will turn off NMOS 4311–4312 and also NMOS 4321; this operates in the same manner as driver 4200 for a high input. Conversely, a low input at IN inverts to turn on NMOS 4312 which makes the connection of base and collector of NPN 4303 (through diode 4322) to form a diode and pull OUT down to about 1.4 volts, analogous to the operation of driver 4200. But the low at IN also inverts to turn on NMOS 4321 which supplies drive from Vdd through resistor 4320 to put NPN 4303 into saturation and thereby drop the collector-to-emitter voltage to about 0.1 volt. This saturation pulls down OUT to about 0.1 volt. Diode 4322 prevents the drive by NMOS 4321 from shunting directly to OUT and lessening its effect. Lastly, small resistors may be inserted between OUT and each of the NPNs 4102–4103 and 4302–4303 in order to reduce inductive (from bond wires) kickback under capacitive loads.

Driver 4100 operates in the same manner as driver 4300 when the EN input is high due to NMOS 4154–4156 and PMOS 4152 all being turned on and NMOS 4153 being turned off. Conversely, EN low turns off PMOS 4152 to isolate PMOS 4110 and keep NPN 4102 off, turns on NMOS 4153 to keep NPN 4103 off, and turns off NMOS 4154–4156 to isolate OUT and stop base driver NMOS 4121. That is, driver 4100 presents a high impedance at OUT.

The fourteen drivers 4100 within output buffer 320 are arranged along the outer edge of the silicon die containing the circuitry of converter 300. The enable signal for the drivers propagates along the die edge so that the drivers turn on sequentially with a small (<1 nsec) delay between turn ons to lessen ground bounce and other noise hat accompanies the power switching. FIG. 44 shows a layout of converter 300 with fourteen drivers market 4401–1412 for D1 through D12, 4413 for the exclusive OR, and 4414 for IRQ. Signals originate in area 4450 and propagate in the direction of the arrows.

Lastly, the output format follows from the state of external signal A0: A0 low has buffer 320 output a 12-bit word as described, and A0 high splits the 12-bit word into two 8-bit words with the second word having four trailing 0s. Buffer 320 multiplexes the two 8-bit words. Other components and circuits in the converter 300 and a method of fabricating converter 300 are shown and described in U.S. Pat. No. 5,382,916, the entire disclosure of which is incorporated by reference in this Specification.

What is claimed is:

1. A driver, comprising:
   (a) an input node for receiving an input signal;
   (b) an output node for providing an output signal representative of the input signal;
   (c) first and second reference nodes for connection respectively to first and second reference voltages;
   (d) first and second output bipolar transistors, the first output transistor coupled between the output and the first reference node and the second output transistor coupled between the output and the second reference node;
   (e) base drive circuitry connected to the base of said second bipolar output transistor for driving said second bipolar output transistor into saturation.

2. The driver of claim 1, wherein:
   (a) said base drive circuitry includes a resistor and NMOS transistor connected in series with each other for selectively coupling said base of said second bipolar output transistor to the first reference node.

3. The driver of claim 2, further comprising:
   a diode between said base of said second output bipolar transistor and said output node and oriented for current flow from said output node to said base of said first output bipolar transistor.

4. The driver of claim 1, further comprising:
   (a) an enable node for receiving an enabling signal; and
   (b) enable circuitry coupled to said enable node for isolating said output node from all potentials at said input node in response to a signal at said enabling node.

5. The driver of claim 1, wherein:
   said first reference node is a 5 volt power supply; and
   said second reference node is ground.

6. The driver of claim 1, wherein:
   said second reference node is ground; and
   said second bipolar transistor is an NPN transistor with emitter connected to ground and collector connected to said output node through a resistor.

7. An integrated circuit output driver, comprising:
   a first and second power rails;
   an output node;
   a first bipolar transistor with collector coupled to said first power rail and emitter coupled to said output node;
   a second bipolar transistor with collector coupled to said output node and emitter coupled to said second power rail;
   an input node; and
   a current source controlled by signals at said input node and connected to the base of said second bipolar transistor, wherein said current source forward biases the collector base junction of said second bipolar transistor when said input turns on said second bipolar transistor and thereby drives said second transistor into saturation and provides for a voltage difference between said output node and said second power rail of magnitude at most about 0.2 volt.

8. The driver of claim 7, wherein:
   said current source includes a resistor and NMOS transistor in series coupling said base of said second bipolar transistor to said first power rail.

9. A method of driving output bipolar transistors, comprising the steps of:
   providing first and second bipolar transistors, the first bipolar transistor with its collector coupled to a first power rail and its emitter coupled to an output node and the second bipolar transistor with its collector coupled to the output node, its emitter coupled to a reference potential, and its base coupled to an input node;
   providing a switchable current source connected to said base of the second bipolar transistor;
   switching said current source on to saturate said second bipolar transistor when said output node is to be driven to said reference potential.

* * * * *